(12) United States Patent
Hirokawa et al.

(10) Patent No.: US 7,214,122 B2
(45) Date of Patent: May 8, 2007

(54) SUBSTRATE POLISHING APPARATUS

(75) Inventors: Kazuto Hirokawa, Tokyo (JP); Shunsuke Nakai, Tokyo (JP); Shinrou Ohta, Tokyo (JP); Yutaka Wada, Tokyo (JP); Yoichi Kobayashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 11/274,112

(22) Filed: Nov. 16, 2005

(65) Prior Publication Data

US 2006/0105679 A1     May 18, 2006

Related U.S. Application Data

(63) Continuation-in-part of application No. PCT/JP04/06768, filed on May 13, 2004, and a continuation-in-part of application No. 10/617,794, filed on Jul. 14, 2003.

(30) Foreign Application Priority Data

| May 16, 2003 | (JP) | .............................. | 2003-138479 |
| May 16, 2003 | (JP) | .............................. | 2003-138496 |
| May 16, 2003 | (JP) | .............................. | 2003-138782 |

(51) Int. Cl.
*B24B 49/00* (2006.01)

(52) U.S. Cl. .............................. 451/6; 451/10; 451/11; 451/41; 451/287

(58) Field of Classification Search .................... 457/6, 457/10, 11, 41, 285, 287
See application file for complete search history.

(56) References Cited

U.S. PATENT DOCUMENTS 5,949,927 A     9/1999     Tang

| 6,142,855 A | 11/2000 | Nyui et al. |
| 6,361,646 B1 | 3/2002 | Bibby et al. |
| 6,599,765 B1 | 7/2003 | Boyd et al. |
| 6,609,947 B1 | 8/2003 | Moore |
| 6,670,200 B2 | 12/2003 | Ushio et al. |
| 6,671,051 B1 | 12/2003 | Nikoonahad et al. |
| 6,707,540 B1 | 3/2004 | Lehman et al. |
| 6,878,038 B2 | 4/2005 | Johansson et al. |

FOREIGN PATENT DOCUMENTS

| JP | 10-229061 | 8/1998 |
| JP | 2001-235311 | 8/2001 |
| WO | 01/20304 | 3/2001 |

*Primary Examiner*—Elleen P. Morgan
(74) *Attorney, Agent, or Firm*—Wenderoth, Lind & Ponack, L.L.P.

(57) ABSTRACT

A substrate polishing apparatus is used to polish a surface of a substrate such as a semiconductor wafer to a flat mirror finish. The substrate polishing apparatus has a polishing table and a polishing pad mounted on the polishing table for polishing a semiconductor substrate. The polishing pad has a through hole formed therein. The substrate polishing apparatus also has a light emission and reception device for emitting measurement light through the through hole formed in the polishing pad to the semiconductor substrate and receiving reflected light from the semiconductor substrate so as to measure a film on the semiconductor substrate. The light emission and reception device is disposed in the polishing table. The substrate polishing apparatus includes a supply passage for supplying a fluid to a path of the measurement light. The supply passage has an outlet portion detachably mounted on the polishing table. The substrate polishing apparatus also includes a protection cover mounted on the polishing table and fitted into the through hole when the polishing pad is attached to the polishing table.

14 Claims, 52 Drawing Sheets

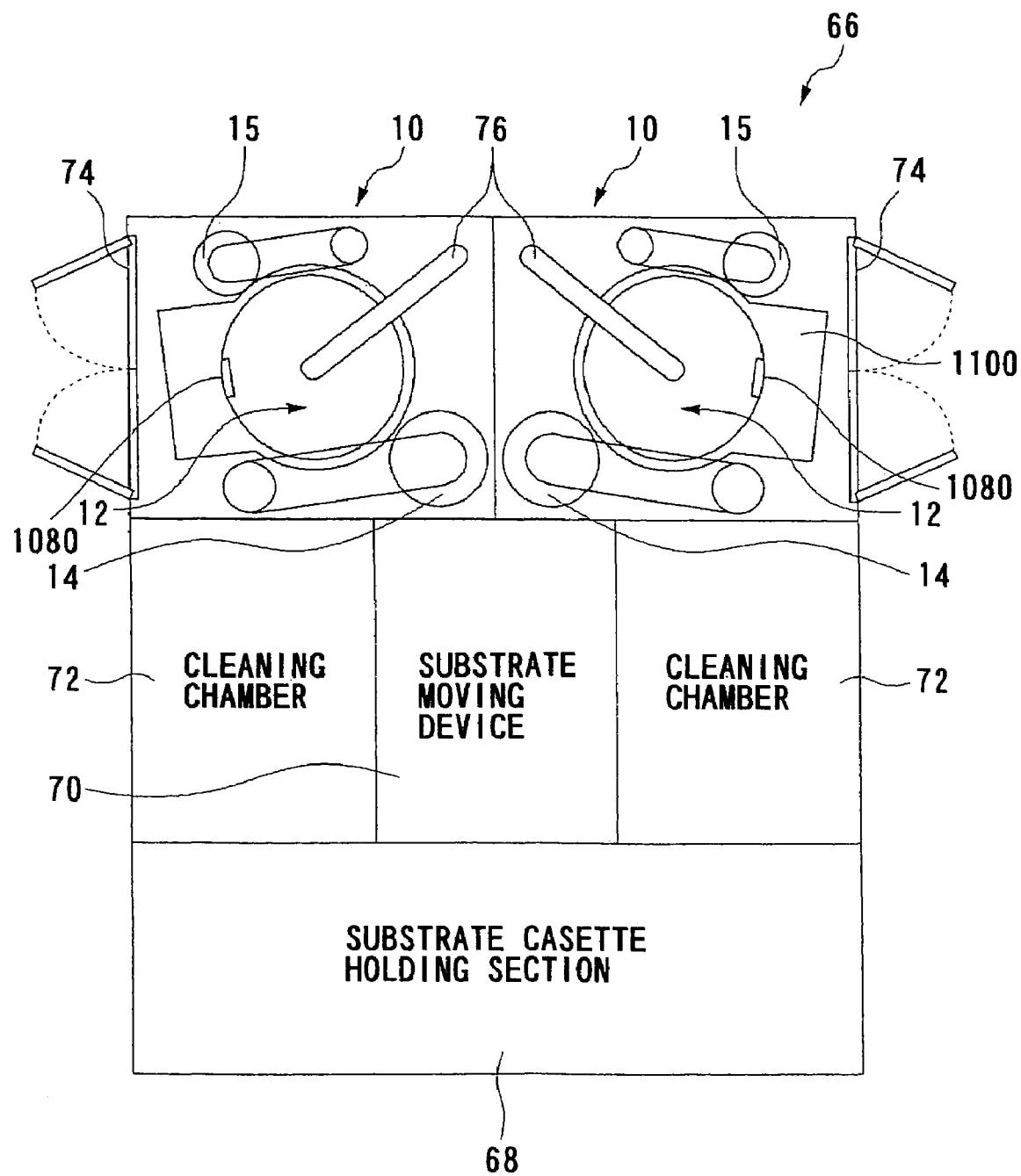
F I G. 3

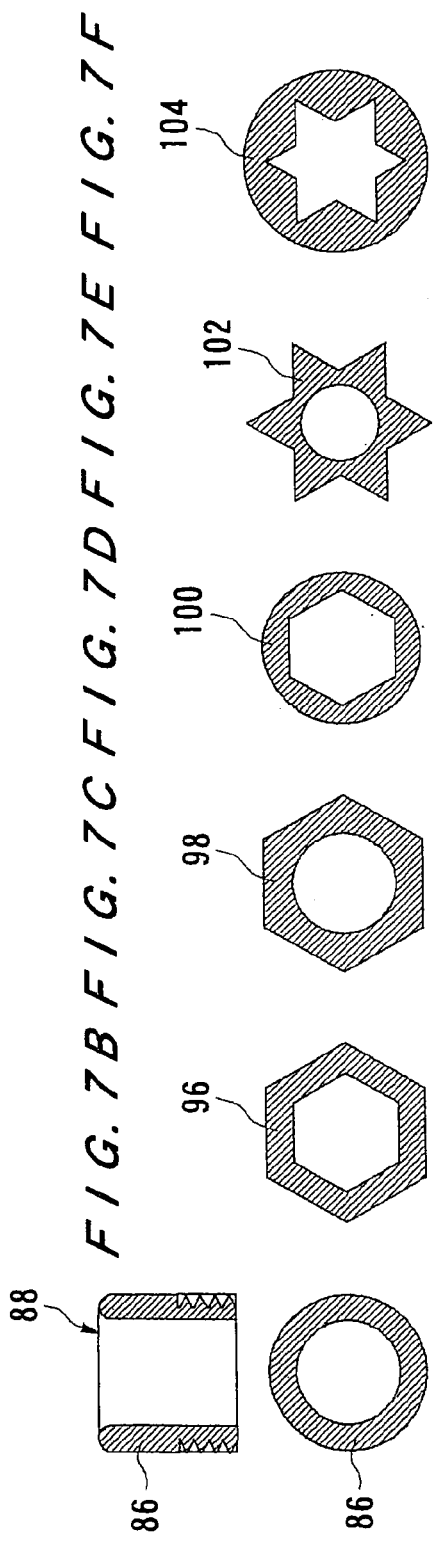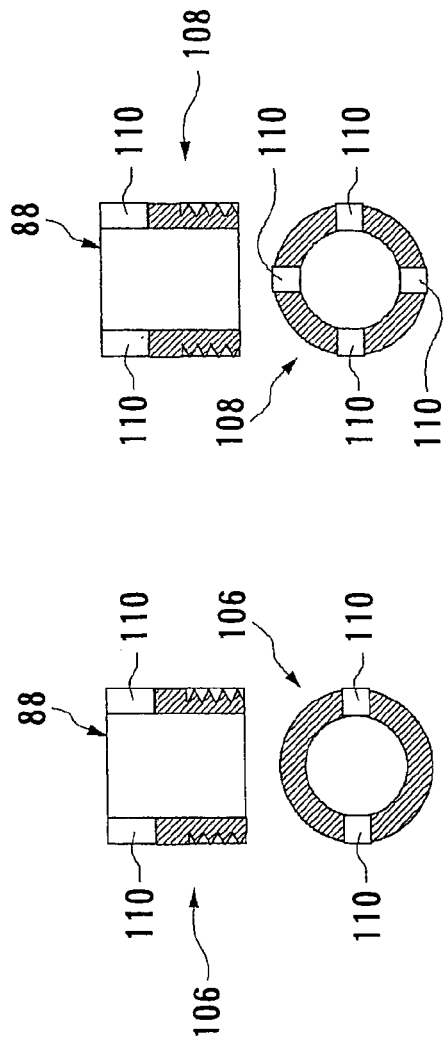

F I G. 9A
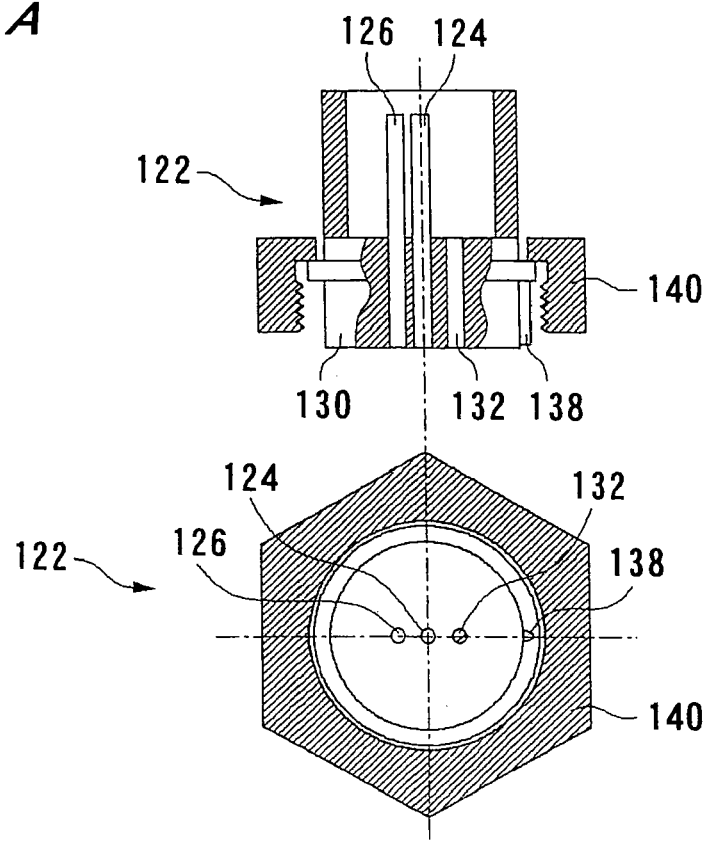
F I G. 9B
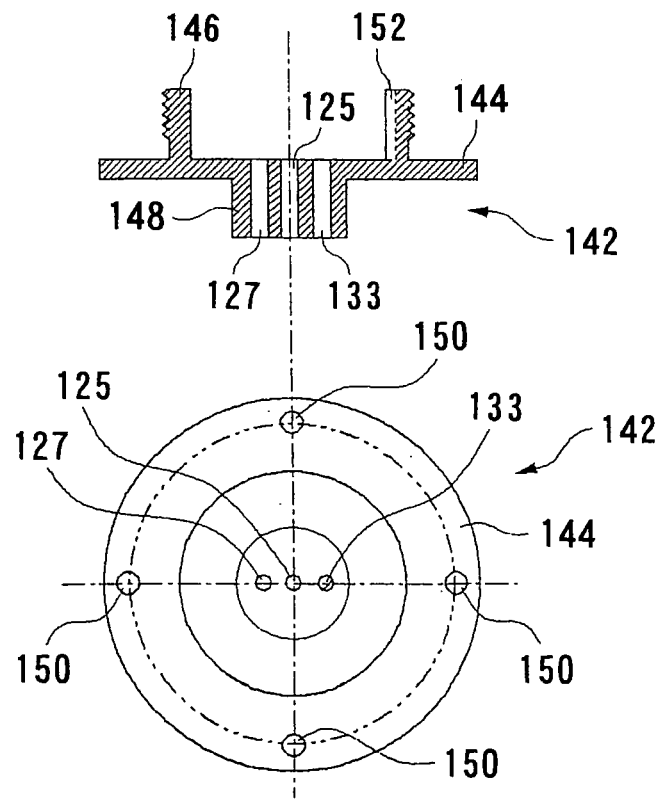

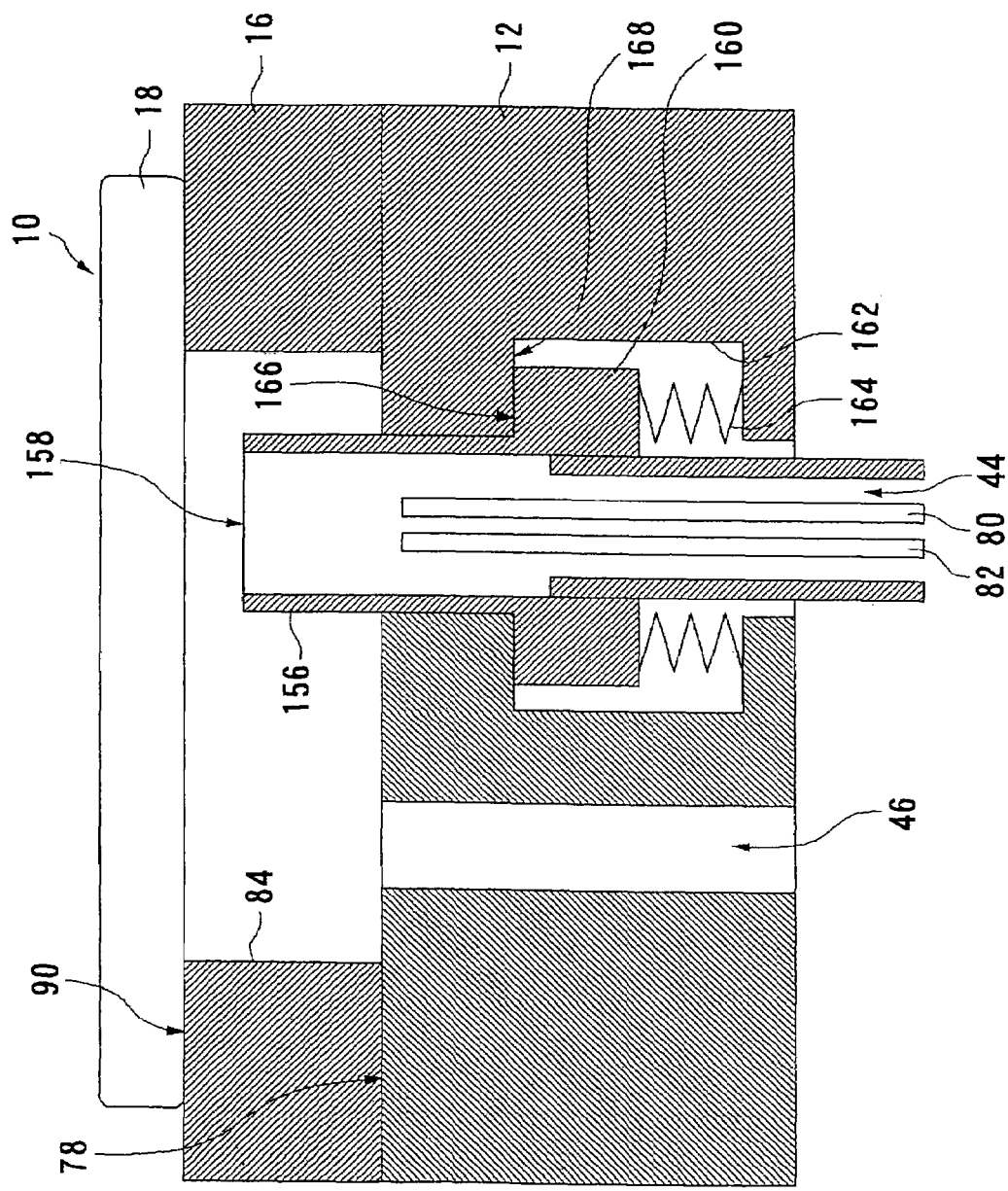

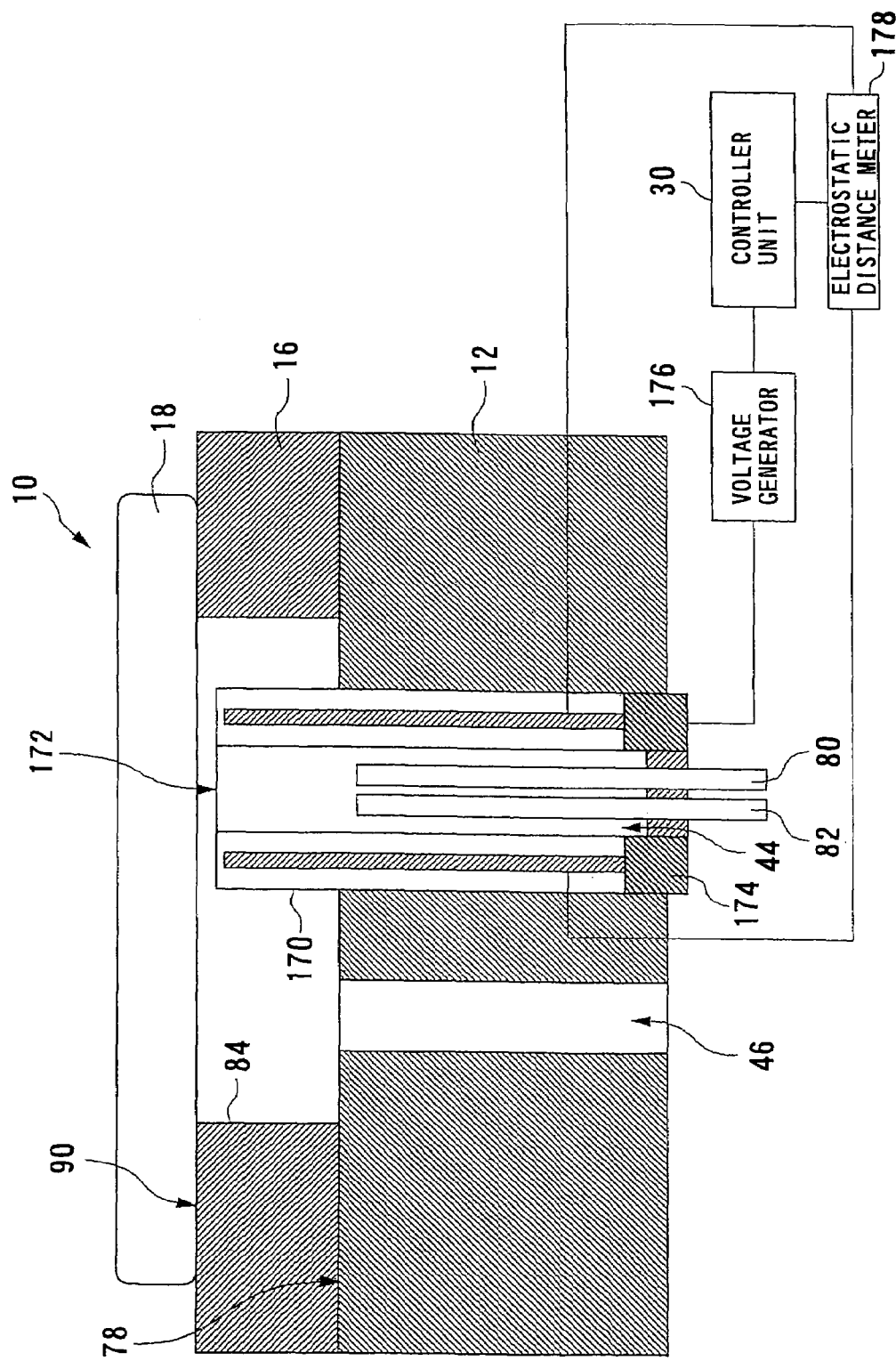

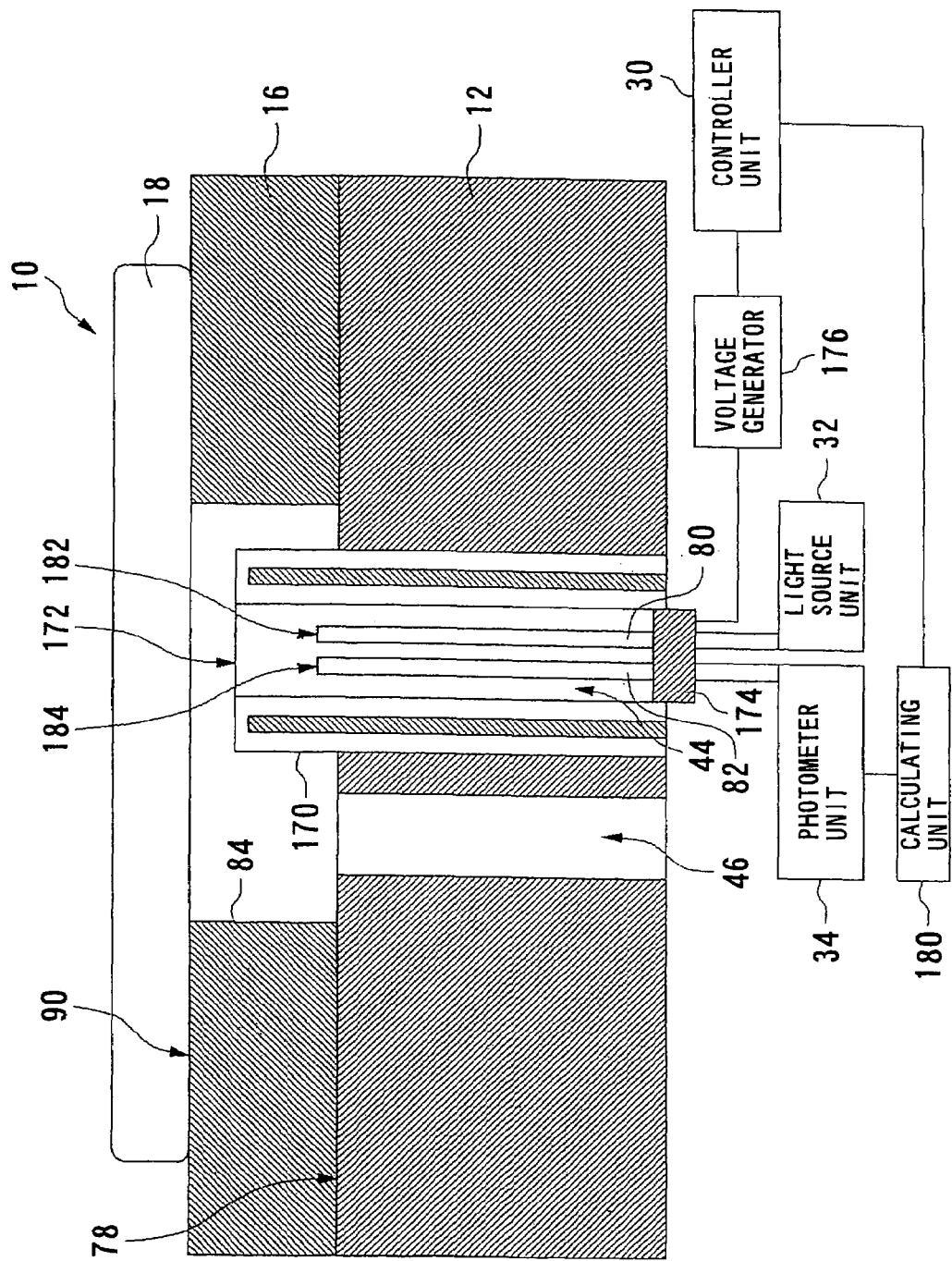

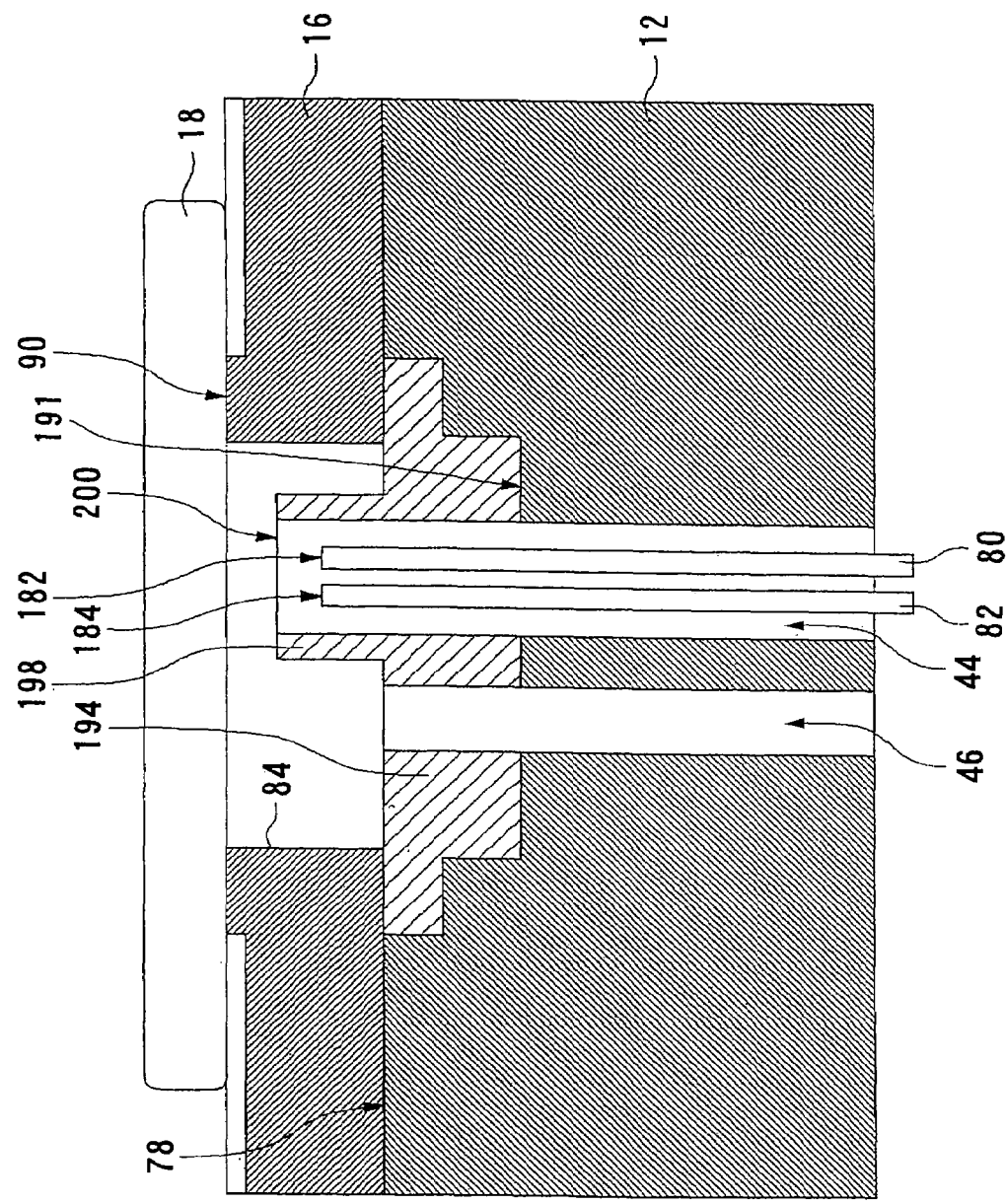

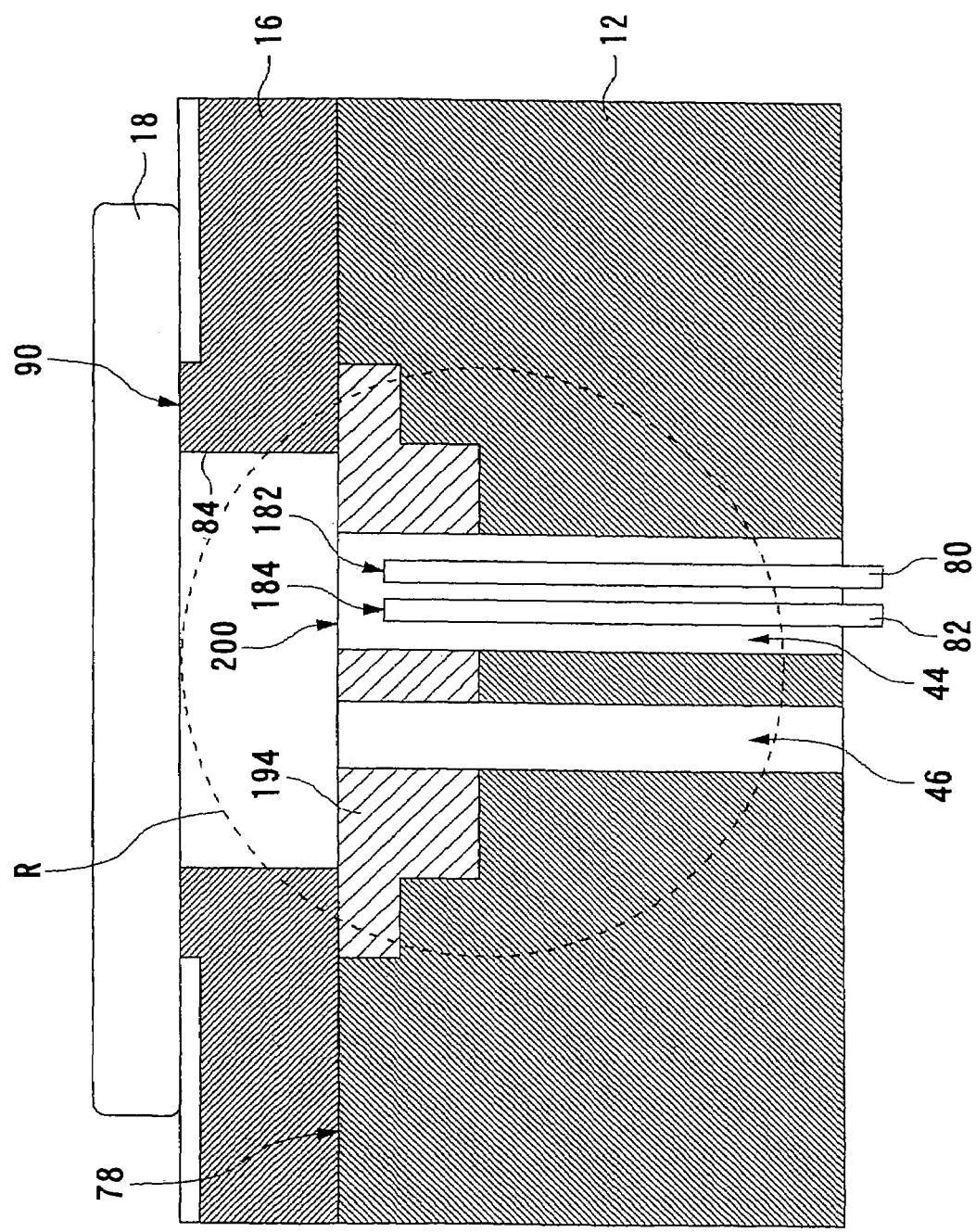

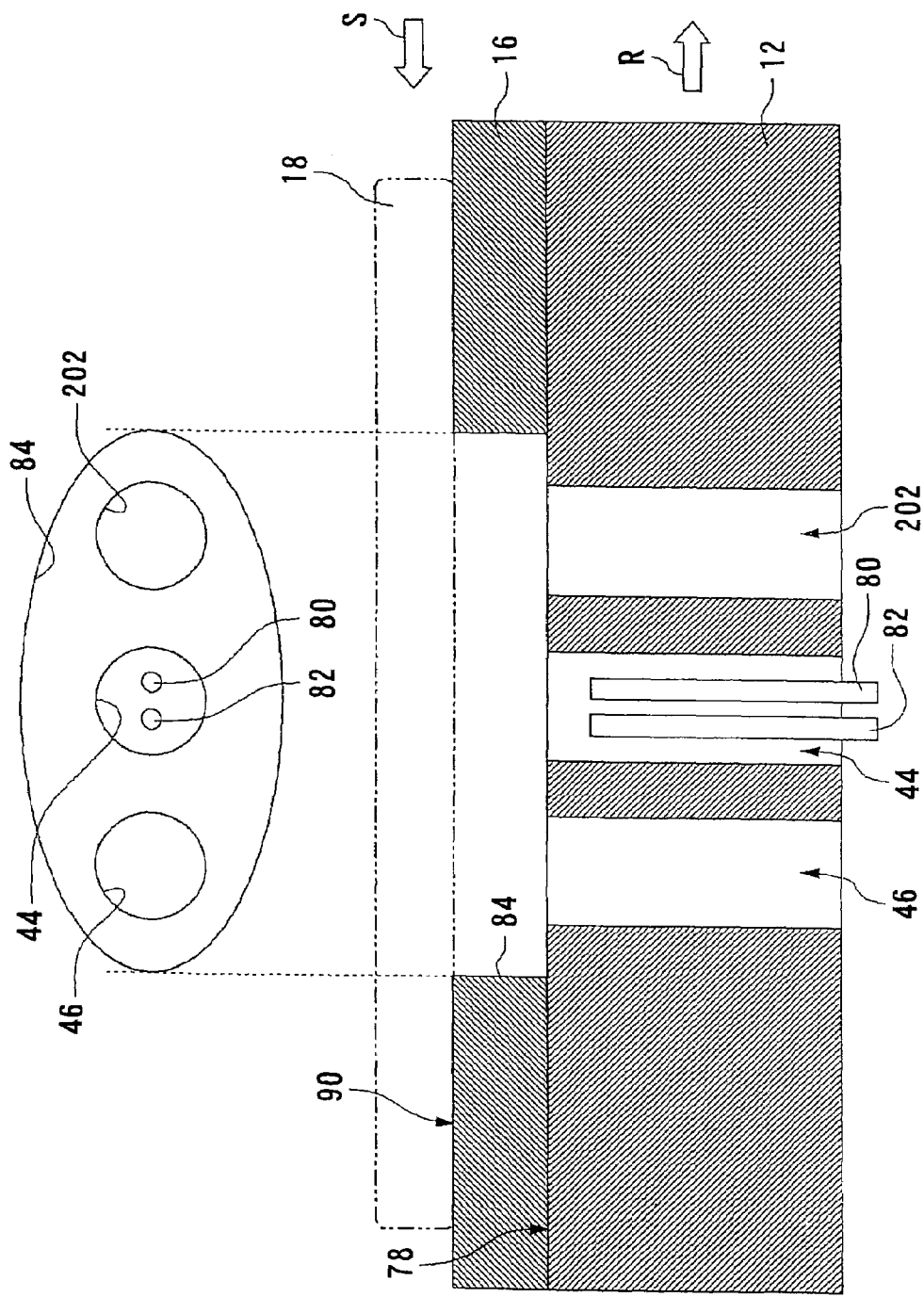

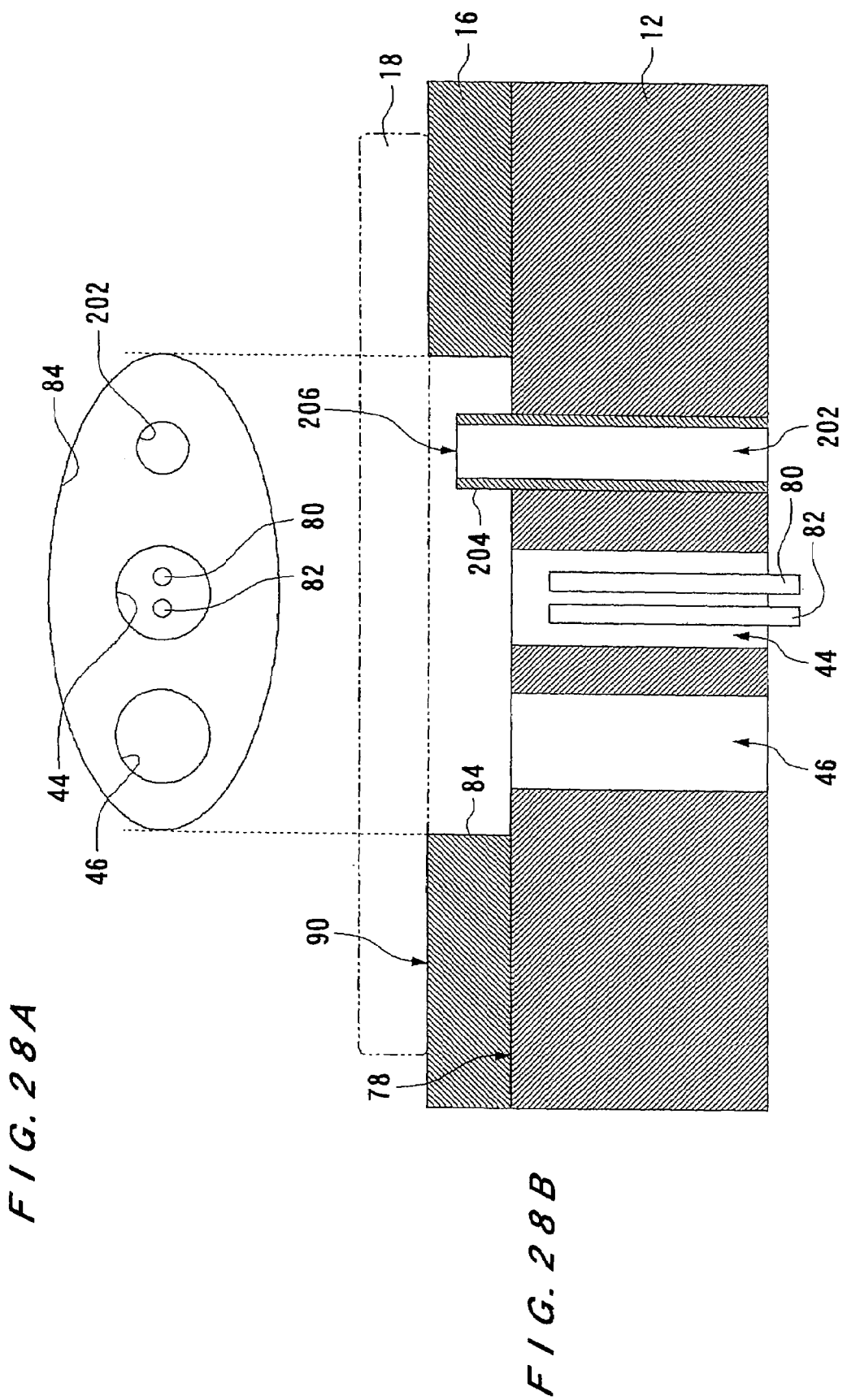

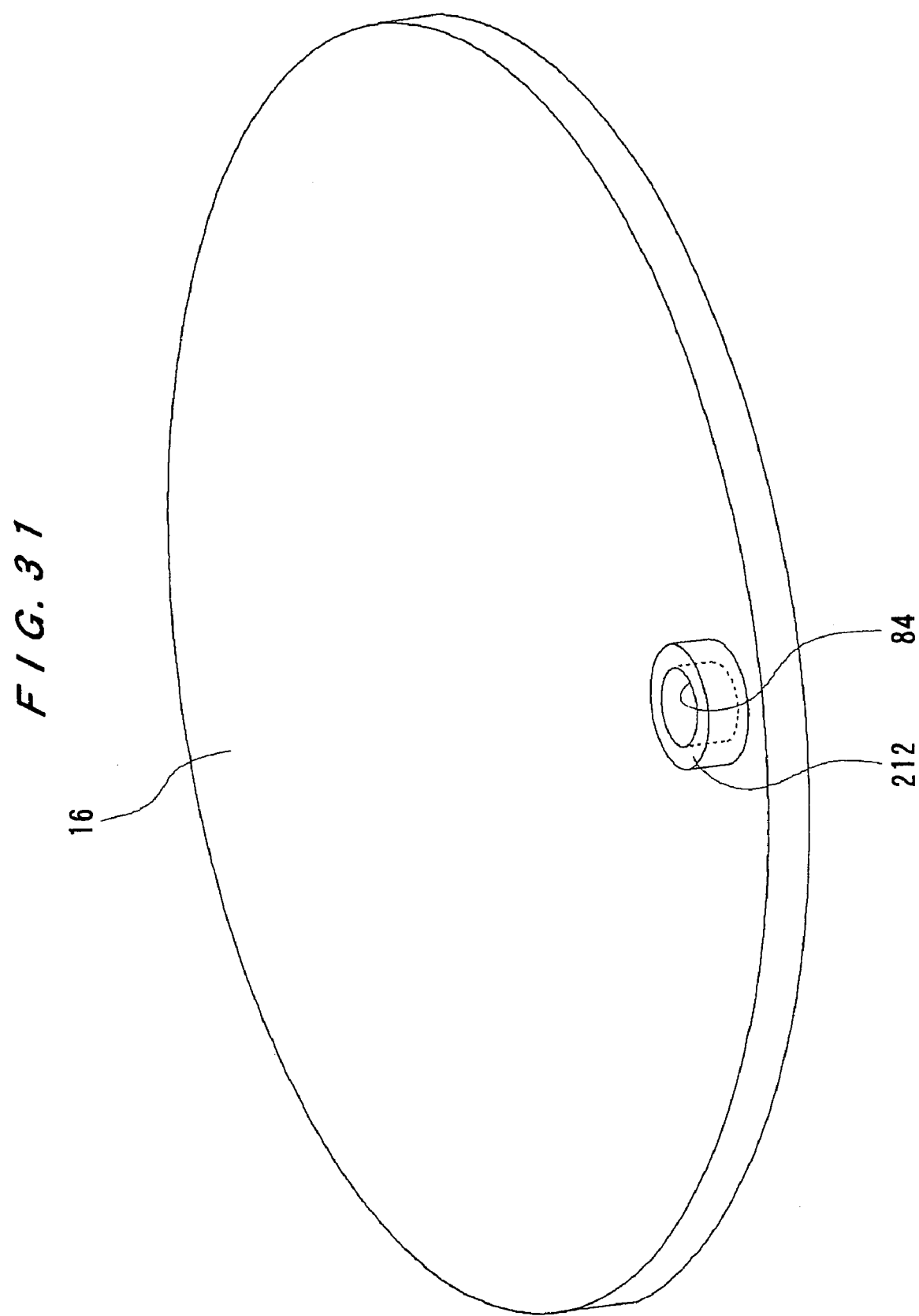

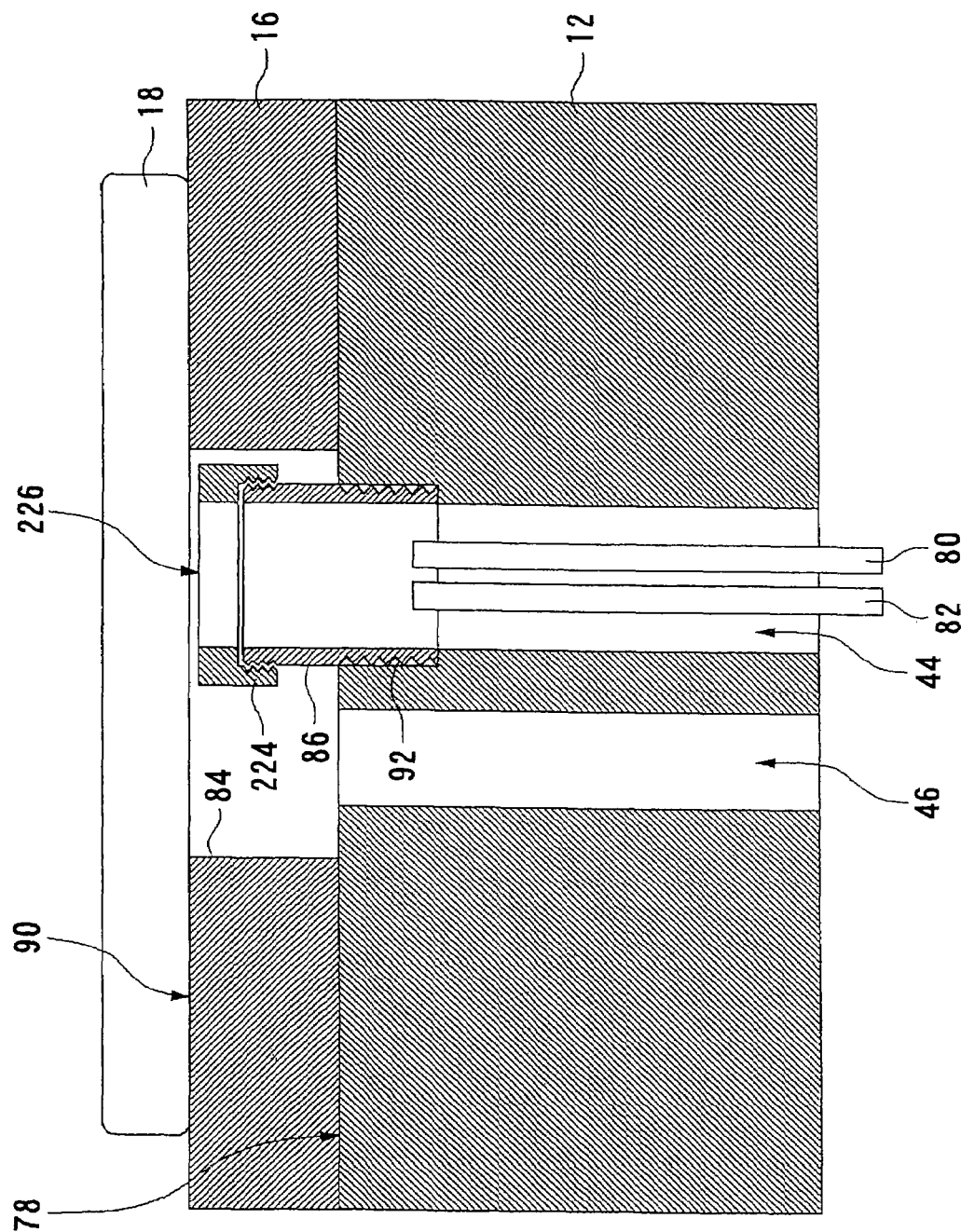

F I G. 43A
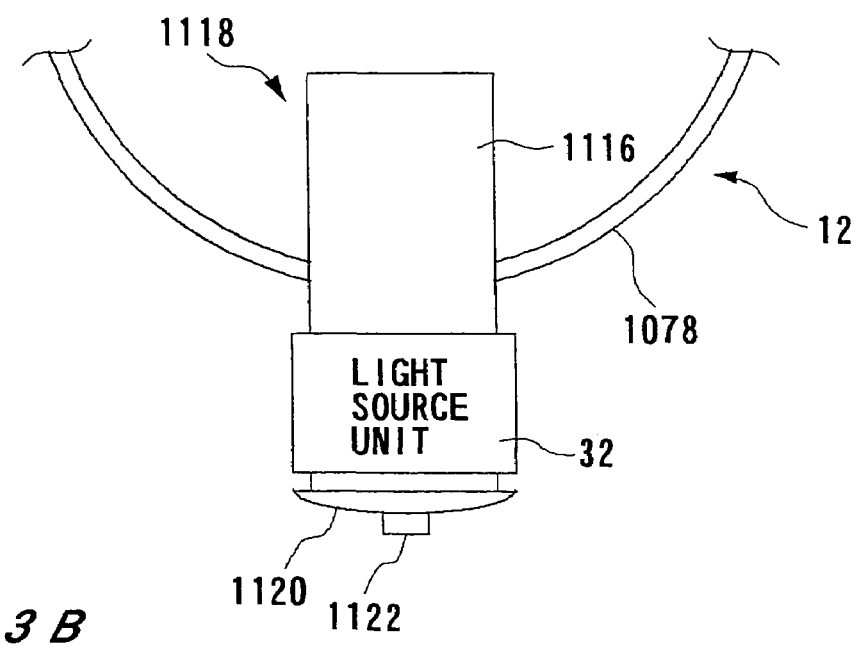
F I G. 43B
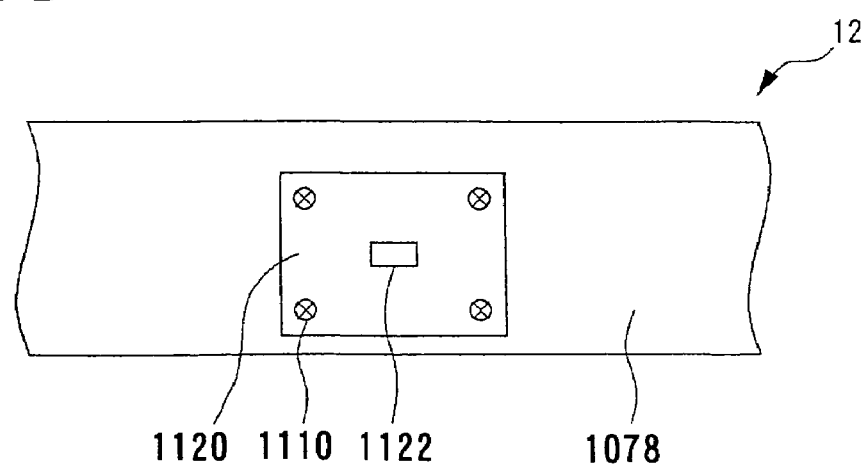

F I G. 49A
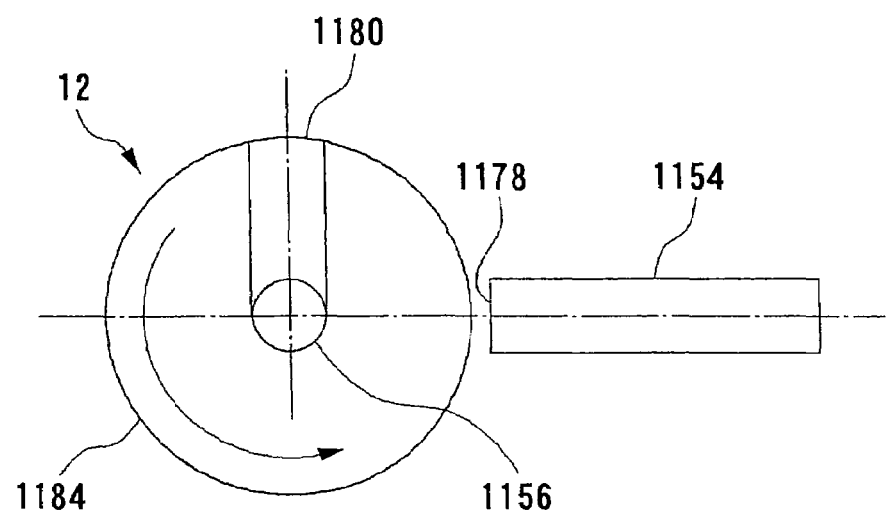
F I G. 49B
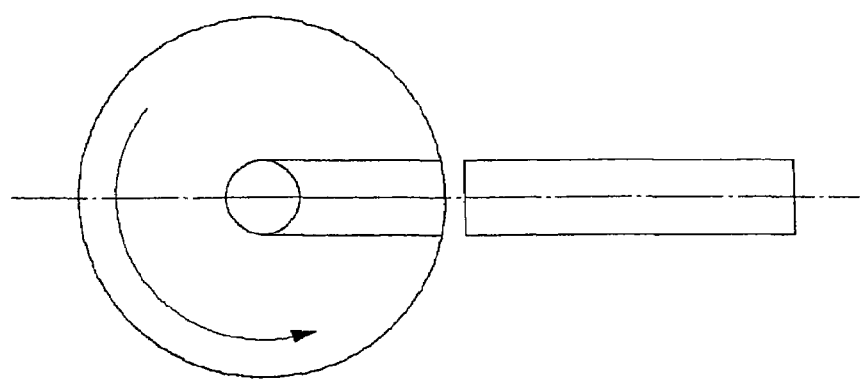

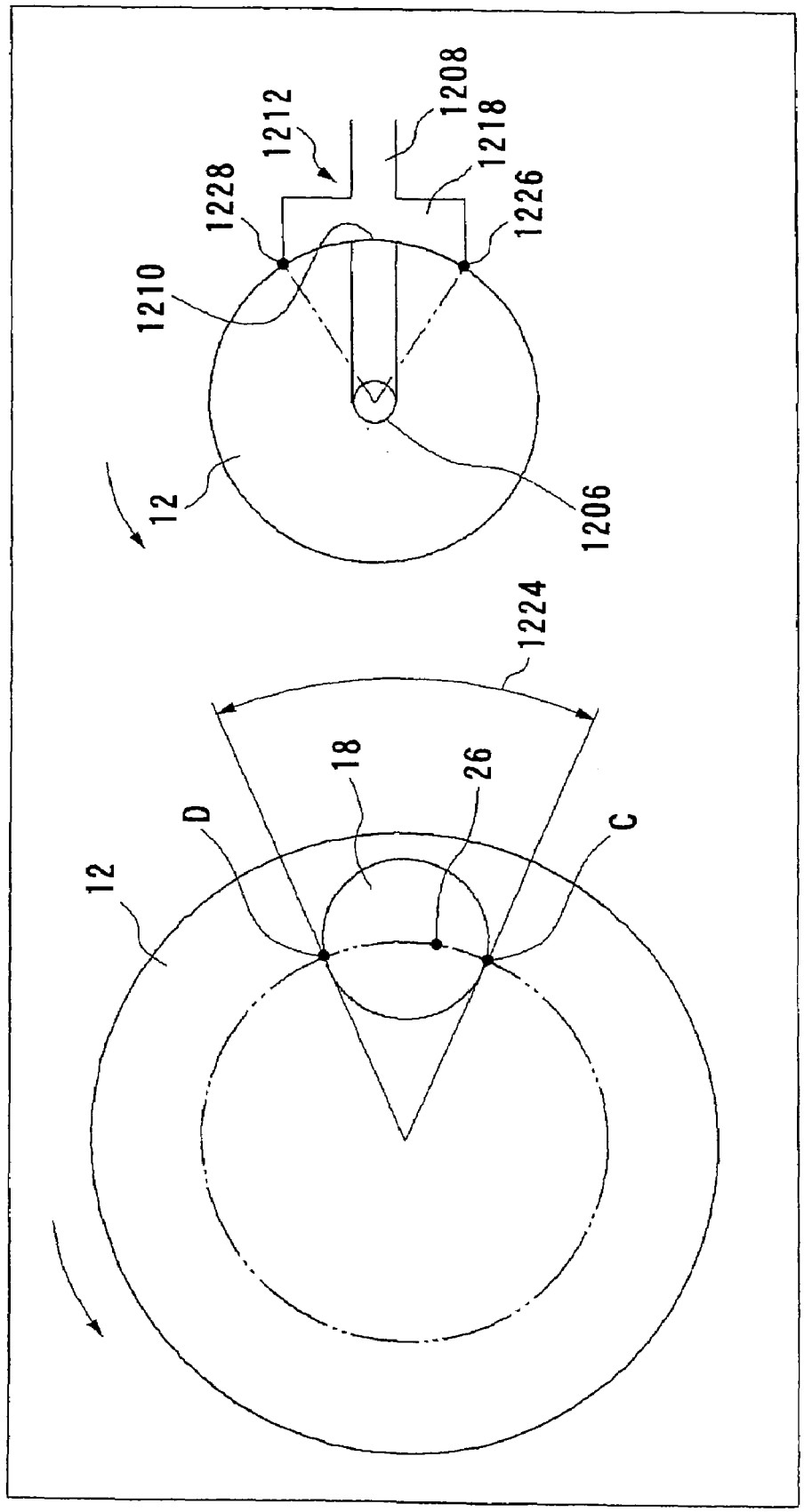

SUBSTRATE POLISHING APPARATUS

This application is a continuation-in-part of U.S. application Ser. No. 10/617,794 filed Jul. 14, 2003 and international application No. PCT/JP2004/006768 filed May 13, 2004.

BACKGROUND OF THE INVENTION

1. Field of the Invention

The present invention relates to a substrate polishing apparatus, and more particularly to a substrate polishing apparatus capable of improving measurement accuracy of a substrate measuring device which is incorporated in the substrate polishing apparatus.

2. Description of the Related Art

In a semiconductor fabrication process, a substrate polishing apparatus is used to polish a surface of a substrate such as a semiconductor wafer to a flat and mirror surface. The substrate polishing apparatus has a rotatable table (polishing table), and a substrate is pressed against a polishing surface on the rotatable table. Then, while a polishing abrasive is supplied onto the polishing surface, the rotatable table is rotated to polish the substrate. There has been proposed a substrate measuring device utilizing light as a device for measuring a film on a substrate during polishing the substrate. For example, a film thickness can be measured to determine an end point of polishing based on the measured film thickness.

There has been proposed a stream-type device as this type of substrate measuring device. For example, Japanese laid-open patent publication No. 2001-235311 discloses a substrate measuring device having a water supply passage provided in a rotatable table. An outlet of the water supply passage is provided in the polishing surface, and pure water is ejected through the water supply passage to the substrate. Two optical fibers are disposed in a stream. Measurement light is emitted through one of the optical fibers to the substrate, and reflected light is received through the other of the optical fibers from the substrate. Then, the film thickness is calculated based on the reflected light.

In the above substrate polishing apparatus, the substrate is polished in the presence of the polishing abrasive between the substrate and the polishing surface. When the polishing abrasive flows into the pure water supplied through the water supply passage, the transparency of the pure water is lowered. As a result, an amount of the reflected light that has been received is lowered. Therefore, it has been a task for the stream-type measuring device to prevent the pure water from being mixed with the polishing abrasive or keep the transparency of the pure water to such a degree that the measurement is not affected even when the polishing abrasive flows into the pure water.

The above substrate polishing apparatus has several expendable components. One of the expendable components is a light source component for emitting measurement light. The light source component comprises a lamp, for example. The lamp has a service life of about four months, for example, although the service life varies depending on the type of lamp and condition under which the lamp is used. The substrate polishing apparatus may have a control valve disposed in the water supply passage for controlling water-injection timing. In this case, the control valve may be one of the expendable components.

The expendable components are usually embedded in the polishing table. For example, the expendable components are disposed inwardly of a skirt which is provided along an outer edge of the polishing table.

The expendable components are required to be replaced at regular or irregular intervals. In a replacing operation, an operator puts a hand into the skirt of the polishing table from below the skirt, and then replaces the expendable components. However, it is difficult for the operator to reach the expendable components, and hence the replacing operation is not easy to accomplish.

The stream-type substrate measuring device described above supplies water into a through-hole formed in a polishing pad, so that slurry flowing between the polishing table and the substrate into the through-hole can be diluted, and that the slurry attached to the substrate can be cleaned. Thus, influence on measurement from the slurry is reduced to maintain a required capability of measurement.

However, a large amount of water should be supplied in order to maintain a required capability of measurement. When a large amount of water is supplied, the water flows to the polishing surface on the polishing table to cause the slurry to be diluted. Dilution of the slurry may have an influence on the characteristics of the polishing capability. Heretofore, as described above, if the amount of water is increased in consideration of the measuring capability, the polishing capability is lowered, and there is a trade-off relationship between the measuring capability and the polishing capability.

SUMMARY OF THE INVENTION

The present invention has been made in view of the above drawbacks. It is an object of the present invention to provide a substrate polishing apparatus which can reduce the influence that a polishing abrasive has on film measurement, and allows an expendable component to be replaced easily, and can reduce the influence that a measurement fluid has on the polishing capability while maintaining the measuring capability of a substrate measuring device.

In order to achieve the above object, according to a first aspect of the present invention, there is provided a substrate polishing apparatus comprising: a polishing table; a polishing pad mounted on the polishing table for polishing a semiconductor substrate, the polishing pad having a through hole formed therein; a light emission and reception device for emitting measurement light through the through hole formed in the polishing pad to the semiconductor substrate and receiving reflected light from the semiconductor substrate so as to measure a film on the semiconductor substrate, the light emission and reception device being disposed in the polishing table; a supply passage for supplying a fluid to a path of the measurement light, the supply passage having an outlet portion detachably mounted on the polishing table; and a protection cover mounted on the polishing table and fitted into the through hole when the polishing pad is attached to the polishing table.

According to a second aspect of the present invention, there is provided a polishing apparatus comprising: a polishing table having a polishing pad for polishing a workpiece, the polishing pad having a hole; an optical measurement device disposed in the polishing table for emitting measurement light to the workpiece through the hole and receiving reflected light from the workpiece so as to measure a film on the workpiece; a supply passage disposed in the polishing table for supplying a fluid to a path of the measurement light, the supply passage having an outlet portion detachably mounted on the polishing table; and a protection cover mounted on the polishing table and fitted into the hole when said polishing pad is attached to the polishing table.

According to another aspect of the present invention, there is provided a substrate polishing apparatus comprising: a rotatable table having a polishing pad for polishing a semiconductor substrate; a light emission and reception device for emitting measurement light through a through hole formed in the polishing pad to the semiconductor substrate and receiving reflected light from the semiconductor substrate so as to measure a film on the semiconductor substrate; and a supply passage for supplying a fluid to a path of the measurement light; wherein the supply passage has an outlet portion positioned in the through hole.

According to the present invention, since the outlet portion of the supply passage is positioned in the through hole, the outlet portion of the supply passage is close to the semiconductor substrate. Therefore, a flow velocity of the fluid supplied from the supply passage is increased at the outlet portion, and the fluid is vigorously ejected from a gap between the semiconductor substrate and the outlet portion toward the outside of the supply passage, thus forming a flow of the fluid along the semiconductor substrate. The flow of the fluid can effectively remove a polishing abrasive from an area where the measurement light is applied, which is located in front of the outlet portion.

In a preferred aspect of the present invention, the outlet portion is detachably mounted on the rotatable table.

According to another aspect of the present invention, there is provided a substrate polishing apparatus comprising: a rotatable table having a polishing pad for polishing a semiconductor substrate; a light emission and reception device for emitting measurement light through a through hole formed in the polishing pad to the semiconductor substrate and receiving reflected light from the semiconductor substrate so as to measure a film on the semiconductor substrate; and a supply passage for supplying a fluid to a path of the measurement light; wherein the supply passage has an outlet portion detachably mounted on the rotatable table.

With this structure, the outlet portion can be mounted after the polishing pad is installed on the rotatable table. Therefore, the polishing pad can be easily installed in position. The outlet portion can be removed before the polishing pad is removed. Thus, the polishing pad can be easily removed without causing damage to the outlet portion. The outlet portion projects from the rotatable table closely to the substrate. Consequently, a flow velocity of the fluid supplied from the supply passage is increased at the outlet portion, and the fluid is vigorously ejected from a gap between the semiconductor substrate and the outlet portion toward the outside of the supply passage, thus forming a flow of the fluid along the semiconductor substrate. The flow of the fluid can effectively remove a polishing abrasive from an area where the measurement light is applied, which is located in front of the outlet portion.

In a preferred aspect of the present invention, the light emission and reception device is mounted on the outlet portion.

With this structure, the light emission and reception device can be disposed in the through hole and can be thus positioned closely to the semiconductor substrate. Therefore, the reflected light can be received efficiently. Since the light emission and reception device and the outlet portion can be installed and removed together with each other, the light emission and reception device does not obstruct when replacing the polishing pad.

According to another aspect of the present invention, there is provided a substrate polishing apparatus comprising: a rotatable table having a polishing pad for polishing a semiconductor substrate; a light emission and reception device for emitting measurement light through a through hole formed in the polishing pad to the semiconductor substrate and receiving reflected light from the semiconductor substrate so as to measure a film on the semiconductor substrate; a supply passage for supplying a fluid to a path of the measurement light; and an outlet portion moving means for moving an outlet portion of the supply passage along a direction in which the through hole extends.

With this structure, the outlet portion can be moved into the through hole after the polishing pad is installed on the rotatable table. Further, the outlet portion can be moved and accommodated in the rotatable table before the polishing pad is removed. Therefore, the polishing pad can be easily replaced without causing damage to the outlet portion. The outlet portion projects from the rotatable table to a position closely to the substrate. Consequently, a flow velocity of the fluid supplied from the supply passage is increased at the outlet portion, and the fluid is vigorously ejected from a gap between the semiconductor substrate and the outlet portion toward the outside of the supply passage, thus forming a flow of the fluid along the semiconductor substrate. The flow of the fluid can effectively remove a polishing abrasive from an area where the measurement light is applied, which is located in front of the outlet portion.

In a preferred aspect of the present invention, the outlet portion moving means moves the light emission and reception device together with the outlet portion.

With this structure, the light emission and reception device can be disposed in the through hole and can be thus positioned closely to the semiconductor substrate. Therefore, the reflected light can be received effectively. Since the light emission and reception device and the outlet portion can be installed and removed together with each other, the light emission and reception device can be moved and accommodated in the rotatable table when replacing the polishing pad. Therefore, the light emission and reception device does not obstruct when replacing the polishing pad.

In a preferred aspect of the present invention, the outlet portion moving means comprises an urging means for urging the outlet portion toward a polishing surface of the polishing pad, and a limiting means for limiting movement of the outlet portion caused by the urging means, so that the outlet portion does not project from the polishing surface.

According to the present invention, the outlet portion is urged by the urging means to move toward the polishing surface, so that the outlet portion is disposed in the through hole. The outlet portion can be moved toward the rotatable table against the urging force of the urging means. When replacing the polishing pad, if the polishing pad is placed onto the outlet portion, the outlet portion is pressed by the polishing pad and accommodated in the rotatable table. When the through hole of the polishing pad and the outlet portion are aligned with each other, the outlet portion is urged to project into the through hole. Therefore, the outlet portion does not obstruct the installation of the polishing pad, and hence the polishing pad can be easily positioned.

In a preferred aspect of the present invention, the outlet portion moving means adjusts the position of the outlet portion according to a dressing process of the polishing surface of the polishing pad.

According to the present invention, the position of the outlet portion is adjusted according to a thickness of the polishing pad that has been scraped by the dressing process.

Therefore, the substrate and the outlet portion can be kept in a suitable positional relationship.

In a preferred aspect of the present invention, a substrate polishing apparatus comprises a rotatable table having a polishing pad for polishing a semiconductor substrate; a light emission and reception device for emitting measurement light through a through hole formed in the polishing pad to the semiconductor substrate and receiving reflected light from the semiconductor substrate so as to measure a film on the semiconductor substrate; a supply passage for supplying a fluid to a path of the measurement light; and a light emission and reception device moving means for moving the light emission and reception device in a direction in which the through hole extends.

With this structure, the light emission and reception device can be disposed in the through hole and can be thus positioned closely to the semiconductor substrate. Therefore, the reflected light can be received effectively. Since the light emission and reception device is movable, the light emission and reception device can be accommodated in the rotatable table when replacing the polishing pad, and does not obstruct the replacement of the polishing pad.

In a preferred aspect of the present invention, the light emission and reception device moving means adjusts the position of the light emission and reception device according to the dressing process of the polishing surface of the polishing pad.

According to the present invention, the position of the light emission and reception device is adjusted according to the thickness of the polishing pad that has been scraped by the dressing process. Therefore, the substrate and the light emission and reception device can be kept in a suitable positional relationship, so that the reflected light can be received efficiently.

In a preferred aspect of the present invention, a substrate polishing apparatus comprises a rotatable table having a polishing pad for polishing a semiconductor substrate, a light emission and reception device for emitting measurement light through a through hole formed in the polishing pad to the semiconductor substrate and receiving reflected light from the semiconductor substrate so as to measure a film on the semiconductor substrate, and a supply passage for supplying a fluid to a path of the measurement light, wherein the supply passage has an outlet portion made of a soft material whose softness is substantially the same as or higher than that of the polishing pad. The outlet portion of the supply passage may be made of the same material as the polishing pad.

With this structure, the semiconductor substrate is prevented from being damaged when the outlet portion is brought into contact with the semiconductor substrate while the semiconductor substrate is polished. Therefore, the outlet portion can be positioned closer to the semiconductor substrate, and an outlet can be positioned substantially in the same plane as the polishing surface. According to the present invention, the outlet portion and the polishing pad can be dressed together, and hence the outlet portion can be adjusted in vertical position together with the polishing pad for thereby allowing the outlet to be easily positioned substantially in the same plane as the polishing surface.

In a preferred aspect of the present invention, a substrate polishing apparatus comprises a rotatable table having a polishing pad for polishing a semiconductor substrate, a light emission and reception device for emitting measurement light through a through hole formed in the polishing pad to the semiconductor substrate and receiving reflected light from the semiconductor substrate so as to measure a film on the semiconductor substrate, and a supply passage for supplying a fluid to a path of the measurement light, wherein the supply passage has an outlet portion made of a material having a larger elastic modulus than that of the polishing pad.

With this structure, the vertical position of the outlet portion can be adjusted by setting a dressing pressure higher than a polishing pressure as described below. Specifically, first, the substrate polishing apparatus dresses the outlet portion together with the polishing pad. Since the elastic modulus of the outlet portion is larger than the elastic modulus of the polishing pad, when the dressing process is finished and the pressure applied during the dressing process is released, the polishing pad extends such that the expansion of the polishing pad is greater than that of the outlet portion. Therefore, when the dressing process is finished, the outlet portion is retracted into the through hole of the polishing pad. In the substrate polishing apparatus, the polishing pressure is set to be smaller than the dressing pressure. Consequently, when the substrate is polished, the outlet portion does not project from the polishing surface and thus remains positioned in the through hole of the polishing pad without interfering with the polishing process.

In a preferred aspect of the present invention, a substrate polishing apparatus comprises a rotatable table having a polishing pad for polishing a semiconductor substrate, a light emission and reception device for emitting measurement light through a through hole formed in the polishing pad to the semiconductor substrate and receiving reflected light from the semiconductor substrate so as to measure a film on the semiconductor substrate, and a supply passage for supplying a fluid to a path of the measurement light, wherein the supply passage has a mirror inner surface.

According to the present invention, since the supply passage has the mirror inner surface, absorption of light in the supply passage is suppressed to reduce the attenuation of the measurement light and the reflected light. Accordingly, the amount of the reflected light to be received is increased, resulting in an increase in S/N ratio.

According to another aspect of the present invention, there is provided a substrate polishing apparatus comprising: a rotatable table having a polishing pad for polishing a semiconductor substrate; a light emission and reception device for emitting measurement light through a through hole formed in the polishing pad to the semiconductor substrate and receiving reflected light from the semiconductor substrate so as to measure a film on the semiconductor substrate; and a supply passage for supplying a fluid to a path of the measurement light; wherein the supply passage has a nonreflective inner surface.

According to the present invention, the nonreflective inner surface is effective to suppress the reflection of light in the supply passage, thus reducing wavelength shift due to the reflection on the inner surface of the supply passage. Accordingly, in the case where the film on the substrate is measured based on the wavelength shift, the nonreflective inner surface is capable of increasing S/N ratio.

According to another aspect of the present invention, there is provided a substrate polishing apparatus comprising: a rotatable table having a polishing pad for polishing a semiconductor substrate; a light emission and reception device for emitting measurement light through a through hole formed in the polishing pad to the semiconductor substrate and receiving reflected light from the semiconductor substrate so as to measure a film on the semiconductor substrate; a supply passage for supplying a fluid to a path of the measurement light; and a protection cover detachably mounted on the rotatable table when the polishing pad is replaced; wherein the protection cover is received in a through hole formed in the polishing pad and covers an opening which constitutes the supply passage formed in the rotatable table.

According to the present invention, since the protection cover is received in the through hole of the polishing pad, the polishing pad can be replaced together with the protection cover attached thereto. Since the protection cover covers the opening constituting the supply passage, even if the outlet portion of the supply passage and the light emission and reception device project from a mount surface of the polishing pad, the polishing pad can be replaced while the supply passage is protected by the protection cover.

According to another aspect of the present invention, there is provided a substrate polishing apparatus comprising: a rotatable table having a polishing pad for polishing a semiconductor substrate; a light emission and reception device for emitting measurement light through a through hole formed in the polishing pad to the semiconductor substrate and receiving reflected light from the semiconductor substrate so as to measure a film on the semiconductor substrate; a supply passage for supplying a fluid to a path of the measurement light; and an auxiliary supply passage for supplying a fluid positioned at the forward of the supply passage in a rotating direction of the rotatable table.

According to the present invention, as described below, a transparency of the fluid in a measuring path can be increased. Specifically, as the rotatable table is rotated, the rotatable table and the polishing abrasive are moved relative to each other. As seen from the rotatable table, the polishing abrasive is moved backward in the rotating direction of the rotatable table. According to the present invention, since the auxiliary supply passage is disposed at the forward of the supply passage in the rotating direction of the rotatable table, the polishing abrasive is diluted in a location forward of the measuring area. Specifically, the polishing abrasive is primarily diluted in the auxiliary supply passage, and then secondarily diluted in the rear measuring area. Thus, the transparency of the measuring area is increased, and hence the measurement accuracy can be increased.

In a preferred aspect of the present invention, the auxiliary supply passage has an outlet disposed in the through hole.

With this structure, since the outlet of the auxiliary supply passage is positioned closely to the semiconductor substrate, the polishing abrasive is effectively removed by the fluid supplied from the auxiliary supply passage. Therefore, the transparency of the measuring area is further increased. In the case where the auxiliary supply passage is used, the total amount of the measurement fluid to be supplied (the sum of a main amount of supply and an auxiliary amount of supply) can be small compare to the case where the auxiliary supply passage is not used. Thus, the consumed amount of the measurement fluid can be reduced.

In a preferred aspect of the present invention, the auxiliary supply passage has a shape surrounding the supply passage.

With this structure, the supply of the fluid from the auxiliary supply passage can effectively increase the transparency of the measuring area.

In a preferred aspect of the present invention, the outlet of the auxiliary supply passage is narrower than the outlet of the supply passage.

With this structure, a flow velocity of the fluid from the preceding auxiliary supply passage is larger than a flow velocity of the fluid from the supply passage, and hence the auxiliary supply passage has a greater share in primary diluting of the fluid for thereby further increasing the transparency of the measuring area.

In a preferred aspect of the present invention, a second through hole formed in the polishing pad is supplied with the fluid.

In a preferred aspect of the present invention, a substrate polishing apparatus comprises a rotatable table having a polishing pad for polishing a semiconductor substrate, a light emission and reception device for emitting measurement light through a through hole formed in the polishing pad to the semiconductor substrate and receiving reflected light from the semiconductor substrate so as to measure a film on the semiconductor substrate, and a supply passage for supplying a fluid to a path of the measurement light, wherein the supply passage has an outlet whose area is smaller than an area of the other portion of the supply passage.

With this structure, the flow velocity of the fluid ejected from the outlet of the supply passage is increased, and hence the influence that the polishing abrasive has on measurement can be reduced.

According to another aspect of the present invention, there is provided a substrate polishing apparatus comprising: a rotatable table having a polishing pad for polishing a semiconductor substrate; a light emission and reception device for emitting measurement light through a through hole formed in the polishing pad to the semiconductor substrate and receiving reflected light from the semiconductor substrate so as to measure a film on the semiconductor substrate; a supply passage for supplying a fluid to a path of the measurement light; and a polishing pad piece fitted in an opening formed in the polishing pad, the through hole being formed in the polishing pad piece; wherein the polishing pad piece has a pad piece surface continuously connected to a surface of the polishing pad, and the pad piece surface is flat.

According to the present invention, the amount of the polishing abrasive flowing into the through hole can be reduced as follows. Generally, the polishing pad has a groove serving as a passage for the polishing abrasive and scraped particles in order to wash out the polishing abrasive and the scraped particles smoothly from the polishing surface. The groove may be a path through which the polishing abrasive flows into the through hole provided for measuring the film. The polishing surface of the polishing pad may have a number of dimples. These dimples are also responsible for increasing the amount of the polishing abrasive flowing into the through hole. According to the present invention, since the polishing pad piece having the through hole has the flat surface, the amount of the polishing abrasive flowing into the through hole can be reduced. The polishing pad piece is provided separately from the polishing pad. Therefore, a structure in which the polishing pad has a flat portion can be easily achieved.

In a preferred aspect of the present invention, the polishing pad piece is made of the same material as the polishing pad.

With this structure, the semiconductor substrate is prevented from being damaged while the semiconductor substrate is polished.

In a preferred aspect of the present invention, the substrate polishing apparatus has a fixing means for fixing the polishing pad piece to the rotatable table and positioning the polishing pad piece in a position where the measurement light passes through the through hole.

According to the present invention, the polishing pad piece is positioned and fixed by the fixing means to locate the through hole in a suitable position when the polishing pad is replaced. The polishing pad is mounted on the rotatable table so as to be fitted in the opening. Therefore, the through hole can be easily disposed in a suitable position when the polishing pad is assembled. In the actual apparatus, the size of the through hole for measurement is much smaller than the size of the polishing pad. Therefore, it is not easy to perform a fine adjustment of the position of the through hole by moving the entire polishing pad. According to the present invention, the separate polishing pad piece is provided to eliminate the above adjusting operation for thereby allowing the assembling operation of the polishing pad to be greatly facilitated. According to the present invention, it is possible to mount the polishing pad and then mount the polishing pad piece. The polishing pad piece may be installed on a base member, and the polishing pad piece and the base member may constitute a replacement cartridge. In this case, the replacement cartridge serves as a fixing means for fixing the polishing pad piece. Preferably, the replacement cartridge has supply and discharge ports for a measurement fluid, and also has an emission member for emitting measurement light and a reception member for receiving reflected light. This structure allows the assembling operation of the measuring device onto the rotatable table to be facilitated.

According to another aspect of the present invention, there is provided a substrate polishing apparatus comprising: a rotatable table having a polishing pad for polishing a semiconductor substrate; a light emission and reception device for emitting measurement light through a through hole formed in the polishing pad to the semiconductor substrate and receiving reflected light from the semiconductor substrate so as to measure a film on the semiconductor substrate; and a supply passage for supplying a fluid to a path of the measurement light; wherein the through hole has a water repellent inner surface.

Since the through hole has the water repellent inner surface, a measurement fluid supplied to the through hole can hardly seep into the polishing pad. This structure is effective to suppress property change of the polishing pad due to the fluid which is contained in the polishing pad, thereby reducing change in polishing characteristics of the polishing pad.

According to another aspect of the present invention, there is provided a substrate polishing apparatus comprising: a polishing table against which a substrate is pressed; a substrate measuring device disposed in the polishing table for detecting a film thickness or a polishing end point of the substrate; and an expendable component replacement door which is openably and closably disposed on the polishing table for allowing an expendable component to be taken into and out of the polishing table.

In a preferred aspect of the present invention, the substrate measuring device applies measurement light to the substrate and measures a film on the substrate based on reflected light from the substrate.

According to the present invention, since an expendable component can be taken into and out of the polishing table using the expendable component replacement door, the expendable component can be easily replaced.

In the present invention, the expendable component replacement door includes an arrangement capable of opening and closing a replacement mouth formed in the polishing table. The expendable component replacement door may be attached to the polishing table by a hinge. The expendable component replacement door may be slidably provided on the polishing table. Alternatively, the expendable component replacement door may be a removable cover.

In the present invention, the substrate and the polishing table may be relatively pressed against each other. Typically, the substrate is urged toward the polishing table. However, the present invention is not limited to such a structure.

In a preferred aspect of the present invention, the expendable component comprises a light source component for emitting the measurement light. The light source component may be a lamp, and the lamp may be a halogen lamp or a xenon flash lamp. Alternatively, the light source component may be an LED or a laser light source.

In a preferred aspect of the present invention, the expendable component comprises a control valve disposed in a passage for a fluid which is used in a measurement process using the measurement light. The control valve may be disposed in a fluid supply passage or a fluid discharge passage.

In a preferred aspect of the present invention, the expendable component replacement door is disposed on a side surface of the polishing table. The operator can easily replace an expendable component through the side surface of the polishing table.

In a preferred aspect of the present invention, the expendable component replacement door is disposed on a surface of the polishing table against which the substrate is pressed, and is deviated from an orbit of the substrate. The expendable component replacement door can be thus disposed without affecting the polishing process. If the substrate is positioned upwardly of the polishing table, then the surface of the polishing table against which the substrate is pressed is an upper surface of the polishing table. Generally, the polishing pad or a fixed abrasive comprising abrasive particles of cerium oxide ($CeO_2$) or the like fixed together by a binder such as resin is mounted on the polishing table.

The expendable component replacement door may be disposed below the polishing pad.

According to another aspect of the present invention, there is provided a substrate polishing apparatus comprising: a polishing table against which a substrate is pressed; a substrate measuring device disposed in the polishing table for detecting a film thickness or a polishing end point of the substrate; a plurality of expendable components having the same function, the plurality of expendable components being mounted on the polishing table and constituting the substrate measuring device; and an expendable component switching means for switching expendable component, of the plurality of expendable components, which functions to measure a film on the substrate.

In a preferred aspect of the present invention, the substrate measuring device applies measurement light to the substrate and measures a film on the substrate based on reflected light from the substrate.

According to the present invention, since the expendable components are switched, the number of times the expendable components are replaced can be reduced.

According to the present invention, there is also an advantage in that when the expendable component is consumed or breaks down, it is not necessary to shut off the substrate polishing apparatus immediately to perform a replacing operation. The expendable component may be replaced during other maintenance operation such as replacing the polishing pad. Therefore, an operating rate of the substrate polishing apparatus can be increased.

In a preferred aspect of the present invention, the expendable component switching means automatically switches the expendable components based on a usage situation of each of the expendable components which function to measure the film on the substrate. For example, the expendable component switching means is automatically operated based on a usage period in which the expendable component has been used.

According to the present invention, since the expendable components are automatically switched, the burden on the operator is further reduced.

In a preferred aspect of the present invention, the expendable component comprises a light source component for emitting the measurement light or a control valve disposed in a passage for fluid which is used in a measurement process using the measurement light. The present aspect may be combined with the ninth aspect described above. In this case, an expendable component replacement door is provided, and a plurality of expendable components having the same function are provided and switched.

According to another aspect of the present invention, there is provided a substrate polishing apparatus comprising: a polishing table against which a substrate is pressed; a substrate measuring device disposed in the polishing table for detecting a film thickness or a polishing end point of the substrate; and an expendable component constituting the substrate measuring device and disposed outside of the polishing table.

In a preferred aspect of the present invention, the substrate measuring device applies measurement light to the substrate and measures a film on the substrate based on reflected light from the substrate.

According to the present invention, since the expendable component is disposed outside of the polishing table, the expendable component can be easily replaced.

In a preferred aspect of the present invention, the expendable component comprises a light source component for emitting the measurement light.

In a preferred aspect of the present invention, the substrate polishing apparatus has the following structure for transmitting light between the polishing table which is being rotated and the outside of the polishing table: The substrate polishing apparatus has a fixed-side light guide disposed outside of the polishing table for transmitting the measurement light emitted by the light source component to the polishing table; and a rotary-side light guide disposed in the polishing table for receiving the measurement light from the fixed-side light guide. With this structure, the film on the substrate on the rotatable table can be measured using the measurement light that is emitted by the light source component which is disposed outside of the polishing table.

In a preferred aspect of the present invention, the fixed-side light guide and the rotary-side light guide have a fixed-side light guide end portion and a rotary-side light guide end portion, respectively, which face each other when the polishing table is in a predetermined light guiding region extending in a rotating direction of the polishing table. The substrate polishing apparatus according to the present invention is arranged such that the fixed-side light guide end portion and the rotary-side light guide end portion face each other when the polishing table is in the predetermined light guiding region. Since the end portions of the rotary-side and fixed-side light guides are not required to communicate with each other at all times, the structure for transmitting the light becomes simple. The predetermined light guiding region is preferably set to include an angular position of the polishing table where the substrate is in a measurement position. The light is transmitted from the light source component to the polishing table when required for measurement. Consequently, the film can be measured reliably.

In a preferred aspect of the present invention, the expendable component comprises a control valve disposed in a passage for a fluid which is used in a measurement process using the measurement light.

In a preferred aspect of the present invention, the substrate polishing apparatus has the following structure for delivering a fluid between the polishing table which is being rotated and the fixed side. The substrate polishing apparatus has a fixed-side passage disposed outside of the polishing table, the control valve being disposed in the fixed-side passage; and a rotary-side passage disposed in the polishing table; wherein the fixed-side passage and the rotary-side passage have a fixed-side passage end portion and a rotary-side passage end portion, respectively, which face each other when the polishing table is in a predetermined conduction region extending in a rotating direction of the polishing table. The fixed-side passage and the rotary-side passage may be a supply passage or a discharge passage.

As described above, the substrate polishing apparatus according to the present invention is arranged such that the fixed-side passage end portion and the rotary-side passage end portion face each other when the polishing table is in the predetermined conduction region extending in the rotating direction of the polishing table. Since the above end portions are not required to communicate with each other at all times, the structure for delivering the fluid becomes simple. The predetermined conduction region is preferably set to include an angular position of the polishing table where the substrate is in the measurement position. The fluid is delivered to the polishing table when required for measurement. Consequently, the film can be measured reliably.

In a preferred aspect of the present invention, the substrate polishing apparatus has an orifice forming member having an orifice forming surface disposed closely to the polishing table with an orifice gap formed therebetween. The orifice forming surface is disposed at a position corresponding to a position of the rotary-side passage end portion and is disposed in a region where the fixed-side passage end portion is not provided.

According to the present invention, when the rotary-side passage end portion and the fixed-side passage end portion do not face each other, these passage end portions communicate with each other through the orifice gap. Therefore, when the above passage end portions do not face each other, the fluid can be delivered at a low flow rate.

In a preferred aspect of the present invention, a substrate polishing apparatus comprises a polishing table against which a substrate is pressed, a substrate measuring device for emitting measurement light from the polishing table to the substrate so as to measure a film on the substrate based on reflected light from the substrate, a rotary-side passage disposed in the polishing table for passing therethrough a fluid used in a measuring process using the measurement light, and a fixed-side passage disposed outside of the polishing table, wherein the rotary-side passage and the fixed-side passage have a rotary-side passage end portion and a fixed-side passage end portion, respectively, which face each other when the polishing table is in a predetermined conduction region extending in a rotating direction of the polishing table. The above passages may be a supply passage or a discharge passage.

In a preferred aspect of the present invention, the rotary-side passage end portion and the fixed-side passage end portion face each other when the angular position of the polishing table is in the conduction region. With this structure, the delivering of the fluid can be controlled, and hence it is possible to dispense with control valves to be provided in the above passages. Even in the case where such control valves are provided, the number of times the control valves are operated is greatly reduced. Therefore, the control valves are not required to be replaced, or intervals for replacing the control valves can be increased.

In a preferred aspect of the present invention, the substrate polishing apparatus has an orifice forming member having an orifice forming surface disposed closely to the polishing table with an orifice gap formed therebetween. The orifice forming surface is disposed at a position corresponding to a position of the rotary-side passage end portion and is disposed in a region where the fixed-side passage end portion is not provided.

According to the present invention, when the rotary-side passage end portion and the fixed-side passage end portion do not face each other, these passage end portions communicate with each other through the orifice gap. Therefore, when the passage end portions do not face each other, the fluid can be delivered at a low flow rate. According to the present invention, therefore, small and large flow rates can be switched by a simple structure of a passage junction.

In a preferred aspect of the present invention, a substrate polishing apparatus comprises a polishing table against which a substrate is pressed, a substrate measuring device for emitting measurement light from the polishing table to the substrate so as to measure a film on the substrate based on reflected light from the substrate, a fixed-side light guide disposed outside of the polishing table, and a rotary-side light guide disposed in the polishing table, wherein the fixed-side light guide and the rotary-side light guide have a fixed-side light guide end portion and a rotary-side light guide end portion, respectively, which face each other when the polishing table is in a predetermined light guiding region extending in a rotating direction of the polishing table. In this arrangement, the fixed-side light guide and the rotary-side light guide are not limited to light guides for measurement light, but may be light guides for reflected light. According to the present invention, the structure for transmitting light between the rotary side and the fixed side can be simplified.

In a preferred aspect of the present invention, a substrate polishing apparatus comprises a polishing table against which a substrate is pressed, a rotary-side passage disposed in the polishing table for passing a fluid therethrough, and a fixed-side passage disposed outside of the polishing table, wherein the rotary-side passage and the fixed-side passage have a rotary-side passage end portion and a fixed-side passage end portion, respectively, which face each other when the polishing table is in a predetermined conduction region extending in a rotating direction of the polishing table. According to the present invention, the flow of the fluid can be controlled by a simple structure for delivering the fluid between the rotary side and the fixed side. In this arrangement, the fluid to be delivered is not limited to a measurement fluid. The fluid may be delivered from the fixed side to the rotary side or vice versa.

In a preferred aspect of the present invention, a substrate polishing apparatus comprises a polishing table against which a substrate is pressed, a rotary-side light guide disposed in the polishing table for passing light therethrough, and a fixed-side light guide disposed outside of the polishing table, wherein the rotary-side light guide and the fixed-side light guide have a rotary-side light guide end portion and a fixed-side light guide end portion, respectively, which face each other when the polishing table is in a predetermined conduction region extending in a rotating direction of the polishing table. According to the present invention, the timing of transmission of light can be controlled by a simple structure for transmitting the light. In this arrangement, the light to be transmitted is not limited to measurement light. The light may be transmitted from the fixed side to the rotary side or vice versa. While various aspects of the present invention have been described above, the present invention is not limited to the above substrate polishing apparatuses. For example, another aspect of the present invention includes a substrate measuring device incorporated in the above substrate polishing apparatus.

According to another aspect of the present invention, there is provided a substrate polishing apparatus comprising: a polishing table against which a substrate is pressed; a light emission and reception device for emitting measurement light from the polishing table to the substrate and receiving reflected light from the substrate so as to measure a film on the substrate; and a fluid supply device for supplying a measurement fluid, which transmits the measurement light and the reflected light, to an area where the measurement light is applied; wherein the fluid supply device supplies a solvent used in a polishing slurry as the measurement fluid. The solvent is defined as a non-polishing-abrasive ingredient of the slurry. The substrate and the polishing table are relatively pressed against each other.

Typically, the substrate is urged toward the polishing table. However, the present invention is not limited to such a structure.

According to the present invention, since the solvent of the slurry is supplied as a measurement fluid, even if the measurement fluid flows out onto the polishing table and is mixed with the slurry, the influence that the diluted slurry has on the polishing capability can be reduced. The present invention is based on the fact that even if the slurry itself has a low transparency, the transparency of the slurry solvent is relatively high. Therefore, the measuring capability is maintained by using the solvent of the slurry, and the influence that the measurement fluid has on the polishing capability is reduced, as described above.

In a preferred aspect of the present invention, the solvent comprises an alkaline solvent of a silica slurry. A silica slurry for polishing a silicon oxide film ($SiO_2$) contains an alkaline solvent (pH 10–11) in order to secure a removal rate. If the alkaline solvent is diluted by pure water, the removal rate is lowered. According to the present invention, the alkaline solvent of the silica slurry is used as a measurement fluid for thereby reducing the influence on the removal rate. The alkaline solvent is KOH or $NH_4OH$, for example.

In a preferred aspect, the solvent comprises a surface-active agent solution of a ceria slurry. The ceria slurry for polishing a silicon oxide film ($SiO_2$) or an STI wafer contains a surface-active agent solution as a solvent for thereby keeping a low removal rate and securing step characteristics. If the surface-active agent is diluted by pure water, then the removal rate is increased, and the step characteristics may be deteriorated. According to the present invention, the surface-active agent solution of the ceria slurry is used as the measurement fluid, and hence the influence on the removal rate and the step characteristics can be reduced. The surface-active agent is preferably a cationic surface-active agent. The cationic surface-active agent may be ammonium polycarboxylate or the like.

In a preferred aspect of the present invention, the supply passage of the fluid supply device is made of a highly chemical-resistant material such as resin or ceramic. The supply passage may be coated with a highly chemical-resistant material, and such a structure is included in the above structure. According to the present invention, the supply passage member is prevented from being damaged by the solvent which is used as a measurement fluid.

Furthermore, the substrate is prevented from being contaminated by impurity which has been eluted from the supply passage member due to the effect of the solvent. It is preferable that the members for guiding measurement light and reflected light, e.g., optical fibers, have the same structure as described above.

According to another aspect of the present invention, there is provided a substrate measuring device for measuring a film on a substrate incorporated in a substrate polishing apparatus having a polishing table against which a substrate is pressed, characterized in that the polishing table has a fluid supply device for supplying a measurement fluid, and the fluid supply device supplies a solvent used in a polishing slurry as the measurement fluid.

According to another aspect of the present invention, there is provided a substrate polishing apparatus comprising: a polishing table against which a substrate is pressed; a light emission and reception device for emitting measurement light from the polishing table to the substrate and receiving reflected light from the substrate so as to measure a film on the substrate; and a fluid supply device for supplying a measurement fluid, which transmits the measurement light and the reflected light, to an area where the measurement light is applied; wherein the fluid supply device supplies a highly viscous fluid as the measurement fluid, and the highly viscous fluid is more viscous than a polishing slurry. Typically, the highly viscous fluid is liquid. However, the highly viscous fluid is not limited to liquid. The highly viscous fluid may be sol or the like. In the present invention, gel may be included in the highly viscous fluid.

According to the present invention, since the highly viscous fluid is supplied as the measurement fluid, the diffusion of the slurry flowing into the measuring area can be reduced. Therefore, the influence that the slurry has on film measurement is reduced, thus increasing the measuring capability.

Further, according to the present invention, the highly viscous fluid is used as the measurement fluid, and hence the amount of the measurement fluid that flows out can be reduced. Because of the above diffusion reducing capability, the measuring capability is increased, and hence the same measuring capability can be obtained even if an amount of the highly viscous fluid to be supplied is smaller than an amount of water to be supplied. Thus, the amount of the measurement fluid flowing out can be reduced. Since the amount of the measurement fluid flowing out is reduced, the influence that the measurement fluid has on the polishing capability is reduced. According to the present invention, therefore, the influence that the measurement fluid has on the polishing capability is reduced while the measuring capability is maintained.

According to another aspect of the present invention, there is provided a substrate measuring device incorporated in a substrate polishing apparatus having a polishing table against which a substrate is pressed for emitting measurement light from the polishing table to the substrate and receiving reflected light from the substrate so as to measure a film on the substrate, the substrate measuring device comprising: a fluid supply device for supplying a measurement fluid, which transmits the measurement light and the reflected light, to an area where the measurement light is applied; wherein the fluid supply device supplies a highly viscous fluid as the measurement fluid, and the highly viscous fluid is more viscous than a polishing slurry.

According to another aspect of the present invention, there is provided a substrate polishing apparatus comprising: a polishing table against which a substrate is pressed; a light emission and reception device for emitting measurement light from the polishing table to the substrate and receiving reflected light from the substrate so as to measure a film on the substrate; and a fluid supply device for supplying a measurement fluid, which transmits the measurement light and the reflected light, to an area where the measurement light is applied; wherein the fluid supply device supplies a gas as the measurement fluid.

According to the present invention, since a gas is used as the measurement fluid, the slurry is removed from the measuring area, and hence an excellent measuring capability can be obtained. Even if the gas flows out, the slurry is not diluted, and hence the influence that the measurement fluid has on the polishing capability can be reduced. According to the present invention, therefore, the influence that the measurement fluid has on the polishing capability is reduced while maintaining the measuring capability. The gas may comprise air, nitrogen, or a noble gas.

In a preferred aspect of the present invention, a light-emitting member and a light-receiving member are made of a water-repellent material. Alternatively, the light-emitting member and the light-receiving member may have a water-repellent-finished surface, respectively. With this structure, when the slurry is attached to the light-emitting member and the light-receiving member, the attached slurry can be easily removed.

Although various aspects of the present invention have been described above, the present invention is not limited to the above substrate polishing apparatuses. For example, another aspect of the present invention includes a substrate measuring device incorporated in a substrate polishing apparatus. The substrate measuring device is incorporated in a substrate polishing apparatus which has a polishing table against which a substrate is pressed, and measures a film on the substrate. The polishing table has a fluid supply device for supplying a measurement fluid, and the fluid supply device supplies a solvent used in a polishing slurry as the measurement fluid. With this structure, the influence that the measurement fluid has on the polishing capability can be reduced.

In a preferred aspect of the present invention, there is provided a substrate processing apparatus which incorporates the substrate polishing apparatus described above. In a preferred aspect of the present invention, there are also provided a substrate polishing method which is carried out with use of the above substrate polishing apparatus, and a substrate measuring method which is carried out with use of the above substrate measuring device.

BRIEF DESCRIPTION OF THE DRAWINGS

FIG. 3 is a view showing a substrate processing system having the substrate polishing apparatus according to the embodiment of the present invention;

FIGS. 7A through 7H are views showing various structures of a pipe piece;

FIGS. 9A and 9B are views each showing a pipe unit of the substrate polishing apparatus according to the second embodiment of the present invention;

FIG. 11 is a view showing a structure of a substrate polishing apparatus according to a third embodiment of the present invention;

FIG. 12 is a view showing a structure of a substrate polishing apparatus according to a fourth embodiment of the present invention;

FIG. 13 is a view showing a structure of a substrate polishing apparatus according to a fifth embodiment of the present invention;

FIG. 19 is a view showing a structure of a modification of the substrate polishing apparatus when polishing a substrate according to the seventh embodiment of the present invention;

FIG. 20 is a view showing a structure of a modification of the substrate polishing apparatus when polishing a substrate according to the seventh embodiment of the present invention;

FIGS. 25A and 25B are views showing a structure of a substrate polishing apparatus according to an eighth embodiment of the present invention;

FIGS. 28A and 28B are views showing a third modification of the substrate polishing apparatus according to the eighth embodiment of the present invention;

FIG. 31 is a view showing a polishing pad used in a substrate polishing apparatus according to a ninth embodiment of the present invention;

FIG. 39 is a view showing an example of a substrate polishing apparatus according to a twelfth embodiment of the present invention;

FIGS. 43A and 43B are views showing a modification of the expendable component replacement door, FIG. 43A being a plane view and FIG. 43B being a side view;

FIGS. 49A and 49B are views showing an example of the optical rotary joint;

FIG. 52 is a view showing the rotary joint for a measurement fluid;

DETAILED DESCRIPTION OF THE PREFERRED EMBODIMENTS

First, an entire structure of a substrate polishing apparatus will be described below with reference to FIG. 1.

Figure 1:
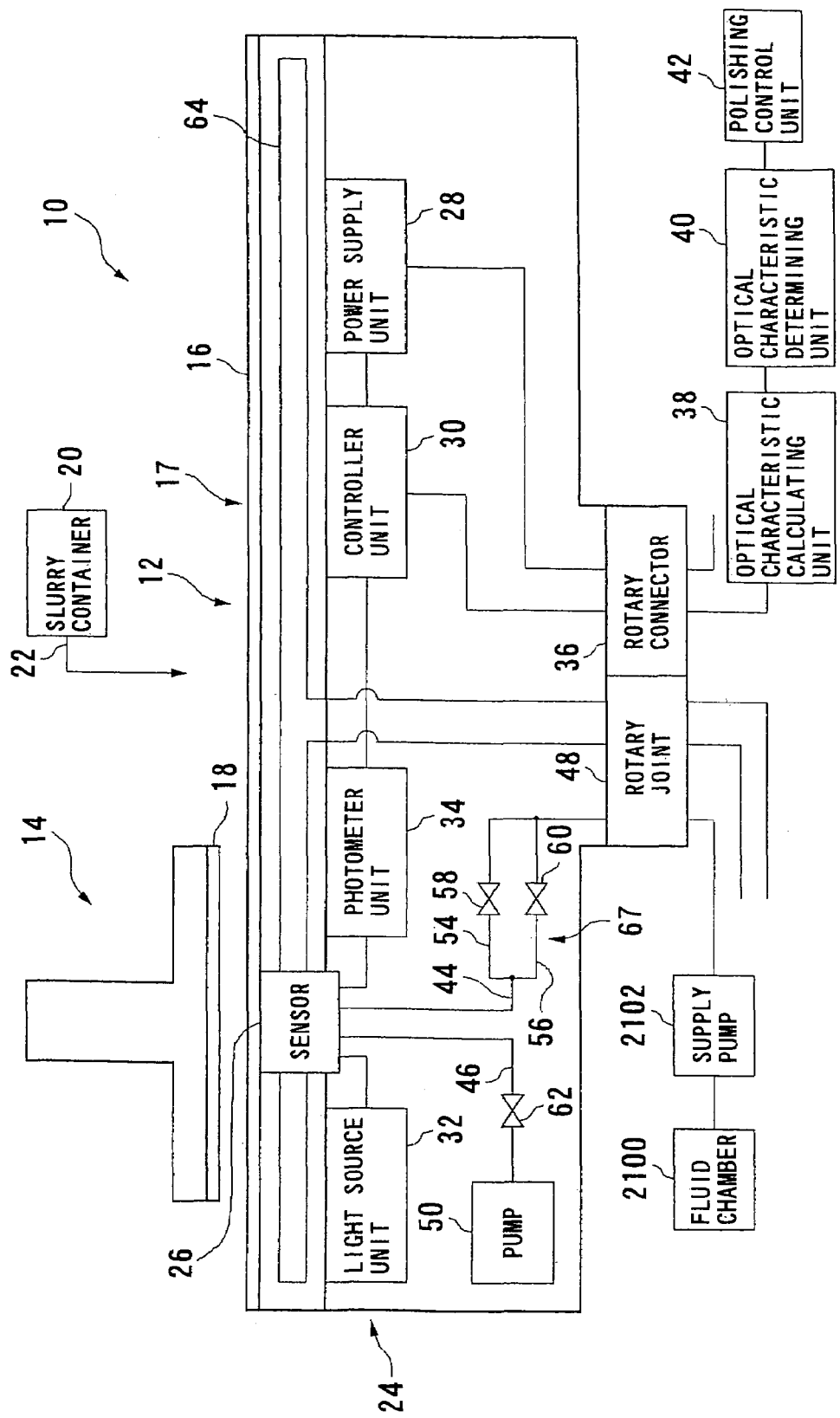
FIG. 1 is a view showing an entire structure of a substrate polishing apparatus according to an embodiment of the present invention.
Figure 2:
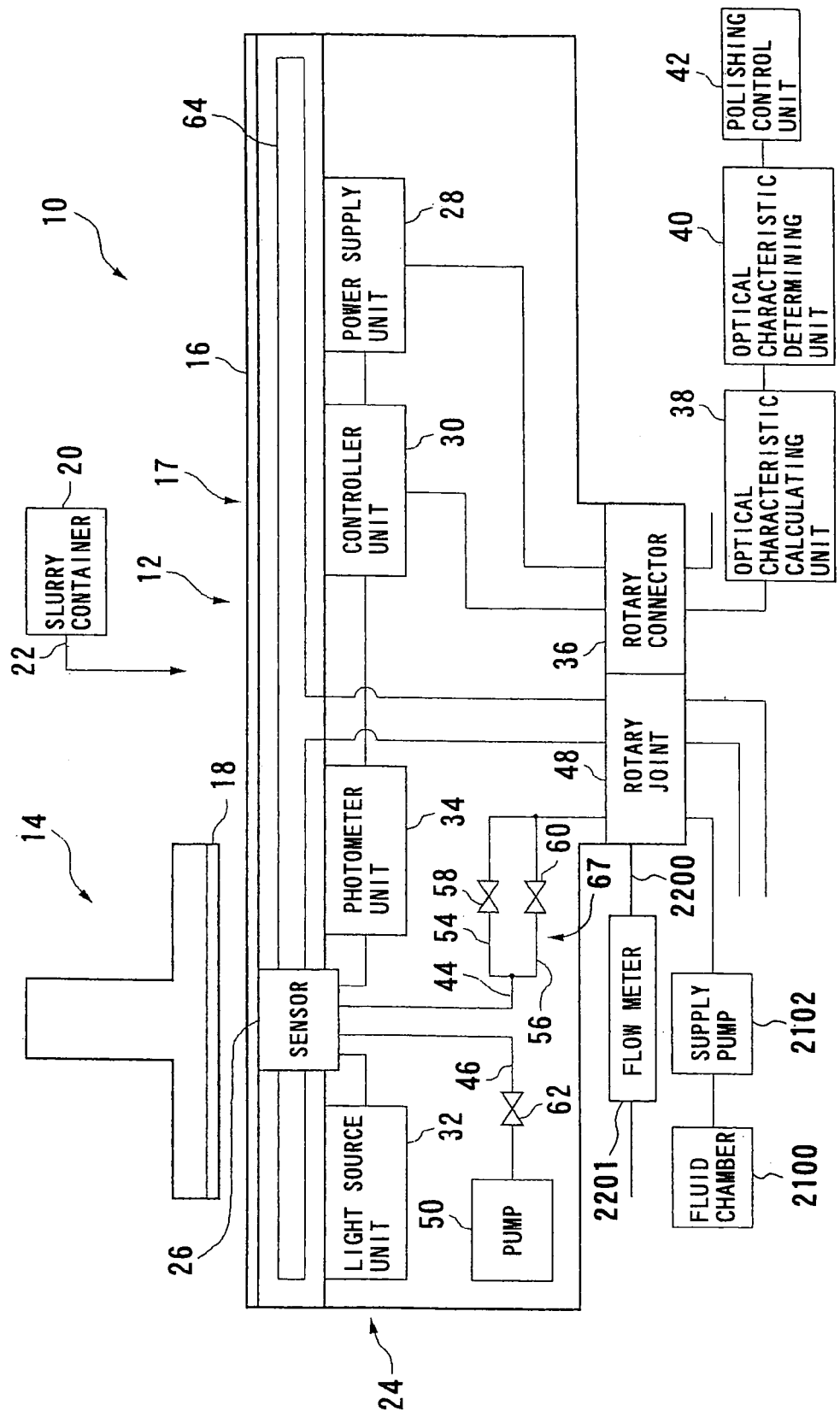
FIG. 2 is a view showing another example of an entire structure of the substrate polishing apparatus shown in FIG. 1.

FIG. 1 shows a substrate polishing apparatus according to a first embodiment of the present invention. FIG. 2 shows another example of an entire structure of the substrate polishing apparatus shown in FIG. 1. The substrate polishing apparatus 10 is a so-called chemical mechanical polishing (CMP) apparatus, and has a rotatable table (polishing table) 12 and a top ring 14. A polishing pad 16 is attached to the rotatable table 12. As the polishing pad 16, a fixed abrasive type polishing pad which is formed by fixing polishing abrasive particles by a binder agent such as epoxy may be used in addition to a polishing cloth made of polyurethane foam, a nonwoven fabric type polishing cloth, and a suede type polishing cloth. The top ring 14 supports a substrate 18 on a lower surface thereof and is rotated together with the substrate 18. The top ring 14 presses the substrate 18 against the polishing pad 16 at a location away from a center of the rotatable table 12. Slurry (polishing abrasive) for polishing is supplied between the polishing pad 16 and the substrate 18. The slurry is supplied from a slurry container 20 through a slurry supply passage 22. The substrate 18 is rotated in the presence of the slurry in a state such that the substrate 18 is pressed against the polishing pad 16 on the rotatable table 12. Further, the rotatable table 12 is rotated. The substrate 18 is thus polished.

The substrate polishing apparatus 10 is used to polish a thin film formed on the substrate 18. Polishing is completed when the thickness of the thin film becomes a predetermined value. In the present embodiment, determination of completion is referred to as end point detection. The substrate polishing apparatus 10 has a film thickness measuring device 24, which will be described below, for end point detection.

A film to be measured by the film thickness measuring device 24 is an insulating film such as a silicon oxide film or a metal film, for example. The film thickness measuring device 24 has a sensor 26 mounted in the rotatable table 12, and also has a power supply unit 28, a controller unit 30, a light source unit 32, and a photometer unit 34, which are mounted on a lower surface of the rotatable table 12.

The power supply unit 28 receives electric power via a rotary connector 36 and supplies the electric power to the respective units in the film thickness measuring device 24. The controller unit 30 controls the entire system of the film thickness measuring device 24. The light source unit 32 supplies measurement light to the sensor 26, and the measurement light is applied to the substrate 18 through the sensor 26. The sensor 26 receives reflected light from the substrate 18 and transmits it to the photometer unit 34. In the photometer unit 34, light signals are converted into electric signals. The electric signals are processed in the controller unit 30.

The controller unit 30 is connected to an optical characteristic calculating unit 38 via the rotary connector 36, and the optical characteristic calculating unit 38 is connected to an optical characteristic determining unit 40. The signals processed in the controller unit 30 are transmitted to the optical characteristic calculating unit 38, which calculates optical characteristics such as the film thickness, the reflection intensity, and the spectrum. The optical characteristic determining unit 40 determines the optical characteristics such as the film thickness and performs end point detection to determine whether or not the film thickness reaches a predetermined value. The determined results are sent to a polishing control unit 42, which controls the entire system of the substrate polishing apparatus 10.

The film thickness measuring device 24 also has a supply passage 44 to supply a measurement fluid to the sensor 26, and a discharge passage 46 to discharge the measurement fluid from the sensor 26. The supply passage 44 is connected to a tank, which is not shown, via a rotary joint 48. The discharge passage 46 is connected to a pump 50 for compulsorily discharging a measurement fluid in the sensor 26 and a polishing liquid such as slurry flowing into the measurement fluid.

The optical characteristic determining unit 40 of the film thickness measuring device 24 stores a most recent data of light signal as a reference data. When bubbles and slurry enter a gap between the sensor 26 and the substrate 18 to cause light signal to be greatly changed with respect to the reference data, the optical characteristic determining unit 40 treats such light signal as an abnormal data. A threshold for determining that light signal is an abnormal data can be set by an operator.

In the present embodiment, the measurement fluid is pure water. The supply passage 44 and the discharge passage 46 are constituted by suitable pipes or the like. The supply passage 44 and the discharge passage 46 may include jackets provided in the rotatable table 12.

As shown in FIG. 1, the supply passage 44 has a parallel section 67, and the parallel section 67 comprises a main passage 54 and a sub passage 56. The main passage 54 and the sub passage 56 have supply control valves 58 and 60. The main passage 54 is used to supply pure water at a high flow rate and eject the pure water in the sensor 26. On the other hand, the sub passage 56 has an orifice (not shown) and is used to supply pure water at a low flow rate. The supply control valves 58 and 60 are opened and closed to switch low-flow-rate supply of pure water and ejection of pure water. The supply control valves 58 and 60 may not be closed depending on the flow rate of pure water to be supplied.

Further, the discharge passage 46 has a discharge control valve 62. The discharge control valve 62 is used to control the timing of compulsory discharge. The discharge control valve 62 and the supply control valves 58, 60 comprise an electromagnetic valve and constitute an electromagnetic valve unit, which is not shown. The electromagnetic valve unit is mounted on a lower surface of the rotatable table 12 as with other units.

Depending on a type of rotary joint, it may be required to secure a certain flow rate of the measurement fluid which is supplied from the supply pump 2102 to the rotary joint 48. In the case where the above-mentioned flow rate is larger than a flow rate of the measurement fluid to be supplied to the sensor 26, a rotary joint discharge passage 2200 is provided for discharging the measurement fluid from the rotary joint 48, as shown in FIG. 2. In this case, a flow meter (not shown) is provided on the supply passage 44 and a flow meter 2201 is provided on the rotary joint discharge passage 2200, 50 that a flow rate of the measurement fluid to be supplied to the sensor 26 is controlled by adjusting flow rates of the measurement fluids which are measured by the above flow meters. Practically, a flow rate of the measurement fluid to be supplied to the sensor 26 is controlled when maintenance of the substrate polishing apparatus is not carried out. There is a difference in a flow rate of the measurement fluid between when the sensor 26 measures a film on the substrate 18 and when the substrate polishing apparatus is in an idling state. Specifically, when measuring the film, the flow rate is controlled at an appropriate value so as to secure a stability of measuring performance, i.e., slurry-removal performance. On the other hand, when the substrate polishing apparatus in the idling state, the flow rate is controlled at a small value so as to prevent optical fibers, which will be described later, from being dried and to prevent entry of the slurry. In order to further increase an accuracy of the above control, the fluid chamber 2100 is designed to allow its static pressure to be measured, and the supply pump 2102, the supply control valves 58, 60, and the discharge control valve 62 are designed to allow their operations to be monitored.

In order to maintain the flow rate of the measurement fluid within an appropriate range, allowed values are set in advance so that the flow rates of the measurement fluids to be supplied to the rotary joint 48 and the sensor 26 are restricted below the allowed values, respectively. The allowed values depend on sampling times of the flow meters, opening and closing cycles of the supply control valves 58, 60, and the rotational speed of the rotatable table 12. Therefore, the substrate polishing apparatus is designed to allow an operator to set the rotational speed of the rotatable table 12 and to input the above allowed values. Further, in order to allow the operator to check the control conditions, the substrate polishing apparatus has a display such as a touch panel which shows at least one of the flow rate of the measurement fluid supplied to the rotary joint 48, the flow rate of the measurement fluid discharged through the rotary joint discharge passage 2200, and the flow rate of the measurement fluid supplied to the sensor 26.

Practically, if the flow rate of the measurement fluid deviates from an appropriate range, a determining unit (not shown) determines that an error has occurred and then performs a necessary step such as stopping the polishing process. However, when an operating state of the substrate polishing apparatus is switched between a state of measuring a film by the sensor 26 and a state of idling, the flow rate of the measurement fluid is quickly changed. In such a case, the above determining unit tends to determine that an error has occurred and thus may cause the substrate polishing apparatus to malfunction. Therefore, error detection is not performed when the operating state of the substrate polishing apparatus is switched.

When the polishing pad 16 is replaced with new one, an operator operates the touch panel or other control panel to switch the operating state of the substrate polishing apparatus so that supply of the measurement fluid is stopped. Further, any of the supply control valves 58, 60 and the discharge control valve 62 can be opened as desired by a predetermined setting. In order to prevent slurry from being supplied due to the malfunction during the stoppage of the supply of the measurement fluid, the slurry is not supplied while the replacement of the polishing pad 16 is carried out. Furthermore, the supply of the measurement fluid is stopped when a protection cover, which will be described later, is attached to the sensor 26.

In case of supplying pure water as the measurement fluid, the substrate polishing apparatus may employ the following structure. A pure water supply device (not shown) is provided between the supply pump 2102 and the fluid chamber 2100 or between the supply pump 2102 and the rotary joint 48. The above pure water supply device comprises a pressure control valve, a flow meter, and a flow rate control valve. Each of the pressure control valve, the flow meter, and the flow rate control valve has some portions which are made of a non-metal material such as SiC in order to prevent metal contamination from occurring when the pure water is brought into contact with such portions. The pure water supply device is constructed to suppress a pulsation of a valve-inlet pressure. In this embodiment, for example, the pressure control valve has a structure which utilizes an air pressure to perform a pressure control, the flow rate control valve is a type of needle valve, and the flow meter is a type of turbine flow meter. This flow meter converts a measured value into electric signal, so that the converted electric signal is sent to a controller (not shown) for thereby monitoring and controlling a flow rate of the pure water, i.e., the measurement fluid.

The substrate polishing apparatus 10 also has a water jacket 64 for cooling disposed in the rotatable table 12. The water jacket 64 is connected to a water tank, which is not shown, through the rotary joint 48.

A slip ring (not shown) is provided below the rotary joint 48. The slip ring has a rotary-side metal member disposed at rotary joint side and a fixed-side metal member disposed at slip ring side. The rotary-side metal member and the fixed-side metal member are brought into contact with each other at all times so as to allow electric signal and electric power to be transmitted therebetween. In the case where the rotary joint 48 has a hollow at a center of rotation thereof, the slip ring is disposed in alignment with the center of rotation of the rotary joint 48. With this structure, it is possible to transmit light from the fixed-side to the rotary-side. The rotary joint 48 has some portions which are made of a non-metal material such as SiC in order to prevent metal contamination from occurring when the measurement fluid is brought into contact with such portions.

The rotary joint may have at least three circular passages which are centrally aligned with the center of rotation. One of the three passages is used as a supply passage for the measurement fluid, and the others are used as cooling fluid passages each for a cooling fluid by which the rotatable table 12 is cooled. Preferably, the second passage from the center of rotation is used as the supply passage for the measurement fluid. In this case, if the measurement fluid discharged from the rotary joint discharge passage 2200 is used as the cooling fluid for cooling the rotatable table 12, it is possible to reduce an amount of the measurement fluid discharged from the rotary joint discharge passage 2200.

FIG. 3 shows an entire arrangement of a substrate processing apparatus 66 having the substrate polishing apparatuses 10. The substrate processing apparatus 66 has a substrate cassette holding section 68, a substrate moving device 70, and cleaning chambers 72 as well as the substrate polishing apparatuses 10. The substrate 18 as a workpiece to be polished is delivered from the substrate cassette holding section 68 to the substrate polishing apparatus 10. The polished substrate 18 is cleaned in the cleaning chamber 72 and returned to the substrate cassette holding section 68.

Each of the substrate polishing apparatuses 10 has a dresser 15 disposed adjacent to the rotatable table 12. The dresser 15 is used to dress the polishing pad 16 whose polishing capability has been lowered due to polishing operation and initialize (regenerate, repair, or dress) the polishing capability of the polishing pad 16. Structural details and a dressing operation of the dresser 15 will be described below. A brush is attached to a lower surface of the dresser 15. The polishing pad 16 is rotated while a polishing surface 90 (see FIG. 4) is supplied with a dressing liquid (pure water or the like). The dresser 15 is also rotated and then the lower surface thereof is pressed against the polishing surface 90 for a predetermined period of time. The polishing capability of the polishing pad 16 is thus initialized by the dresser 15. The dresser 15 may have a structure in which diamond particles are electrode posited on the lower surface thereof.

Further, the substrate processing apparatus 66 has working windows 74 in a chamber in which the substrate polishing apparatuses 10 are installed. Slurry is supplied through nozzles 76 to the rotatable tables 12. The nozzle 76 serves as the slurry supply passage 22 shown in FIG. 1. A measurement fluid is supplied to the rotatable table 12 from below, although not shown.

Next, there will be described the features of the structure of the present embodiment.

Figure 4:
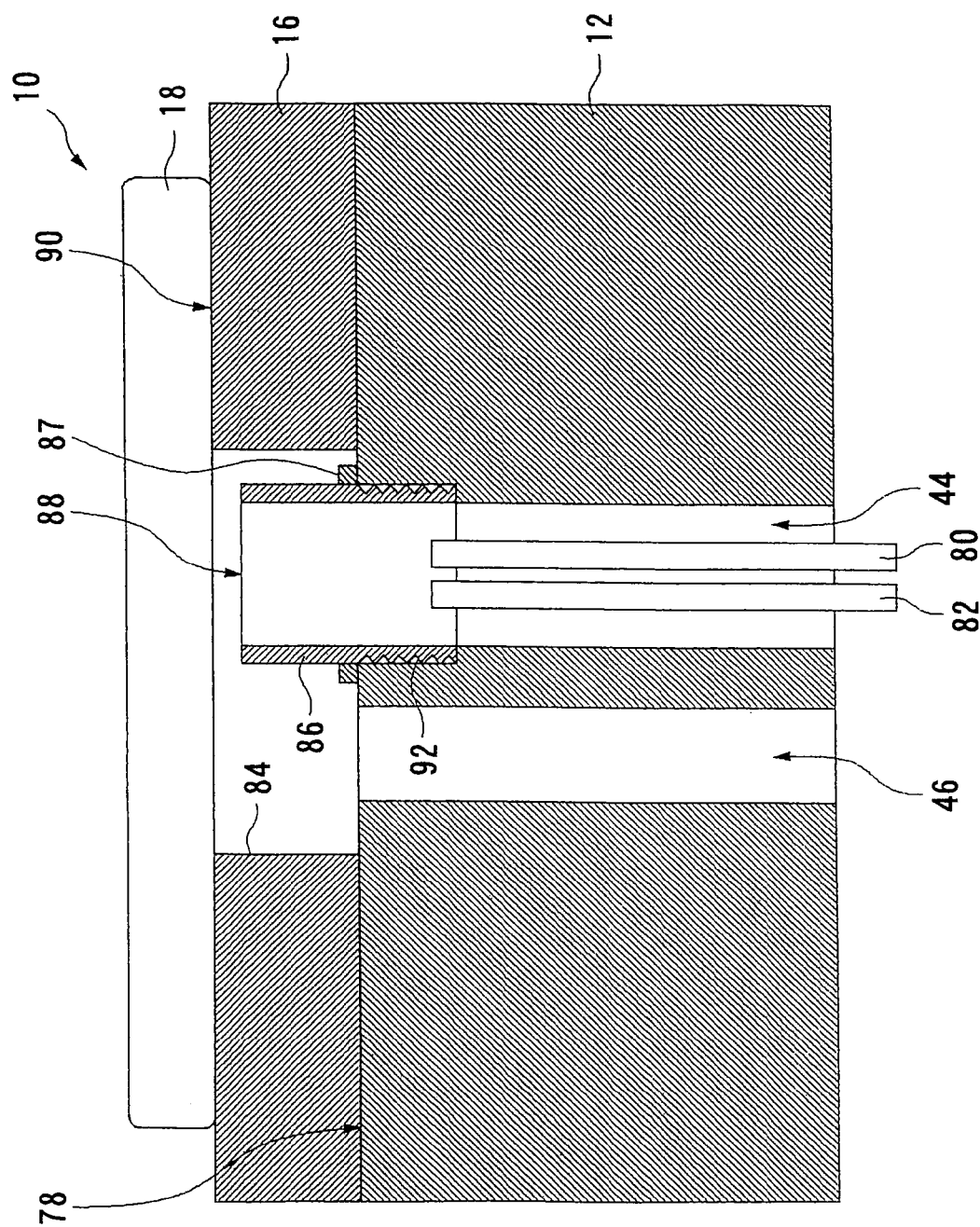
FIG. 4 is a view showing a structure of the substrate polishing apparatus according to the first embodiment of the present invention.

FIG. 4 is a view showing the substrate polishing apparatus 10 according to the first embodiment of the present invention, and showing a measuring area of the rotatable table 12 at an enlarged scale. A structure shown in FIG. 4 corresponds to the sensor 26 in the entire structure of the substrate polishing apparatus 10 shown in FIG. 1. As already described, the polishing pad 16 is placed on a polishing pad mount surface 78 of the rotatable table 12, and the substrate 18 is held in contact with the polishing pad 16. The supply passage 44 and the discharge passage 46 are formed in the rotatable table 12 and extend in parallel to each other.

A light-emitting optical fiber 80 and a light-receiving optical fiber 82 are disposed in the supply passage 44 and extend in parallel to each other. The light-emitting optical fiber 80 and the light-receiving optical fiber 82 are connected respectively to the light source unit 32 and the photometer unit 34 (see FIG. 1). The light-emitting optical fiber 80 applies measurement light, which is supplied from the light source unit 32, to the substrate 18. The light-receiving optical fiber 82 receives reflected light from the substrate 18 and transmits the received light to the photometer unit 34. In the present embodiment, the light-emitting optical fiber 80 and the light-receiving optical fiber 82 constitute a light emission and reception device for emitting the measurement light and receiving the reflected light.

The polishing pad 16 has a through hole 84 formed therein, and the supply passage 44 and the discharge passage 46 communicate with the through hole 84. A pipe piece 86 for providing the supply passage 44 in the through hole 84 is mounted on the rotatable table 12. In the present embodiment, the pipe piece 86 serves as an outlet portion of the supply passage 44, and an end portion of the pipe piece 86 serves as an outlet 88 for the measurement fluid. The outlet 88 serves as a supply port for supplying the measurement fluid, which is supplied through the supply passage 44, into the through hole 84. The pipe piece 86 is positioned in the through hole 84. Specifically, the outlet 88 is positioned above the rotatable table 12 and is also positioned in the vicinity of the polishing surface 90 of the polishing pad 16.

The pipe piece 86 comprises a cylindrical member and is fastened to the rotatable table 12 by a screw mechanism 92. Specifically, the screw mechanism 92 comprises a male screw formed on the pipe piece 86 and a female screw formed on the rotatable table 12, which are fitted together. The pipe piece 86 has a flange 87 provided on an outer circumferential surface thereof. When the pipe piece 86 is fastened to the rotatable table 12 by the screw mechanism 92, the flange 87 is held in close contact with the polishing pad mount surface 78 of the rotatable table 12. The outlet 88 on an upper end of the pipe piece 86 is thus positioned at an appropriate vertical position in the through hole 84.

In the substrate polishing apparatus 10 according to the present embodiment, the measurement fluid such as pure water is supplied through the supply passage 44 and discharged through the discharge passage 46. Therefore, the through hole 84 is filled with transparent pure water, and hence the polishing slurry is prevented from entering the through hole 84, thus allowing measurement with use of transmitted light to be performed.

In the present embodiment, particularly, since the pipe piece 86 serving as the outlet portion of the supply passage 44 extends into the through hole 84, the influence that the slurry has on the measurement accuracy is greatly reduced. This feature will be described below with reference to FIGS. 5A and 5B.

Figure 5A:
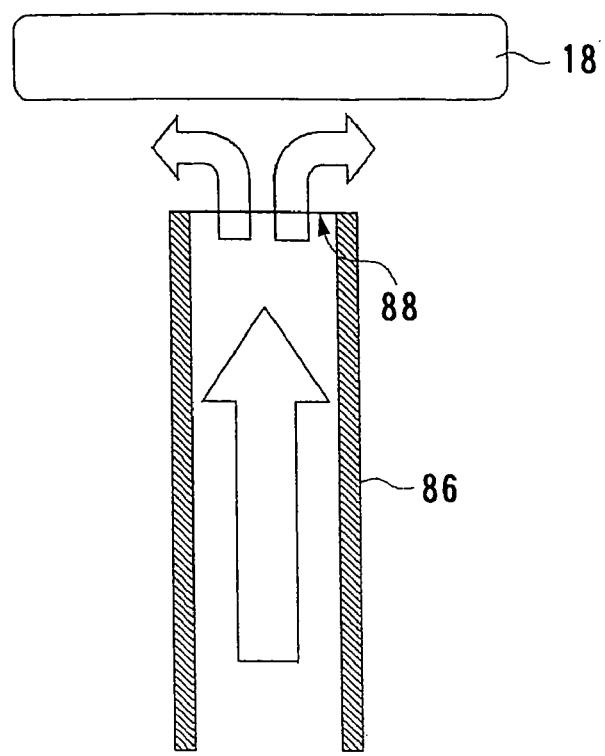
FIGS. 5A and 5B are views showing the relationship between a position of an outlet and a water flow.
Figure 5B:
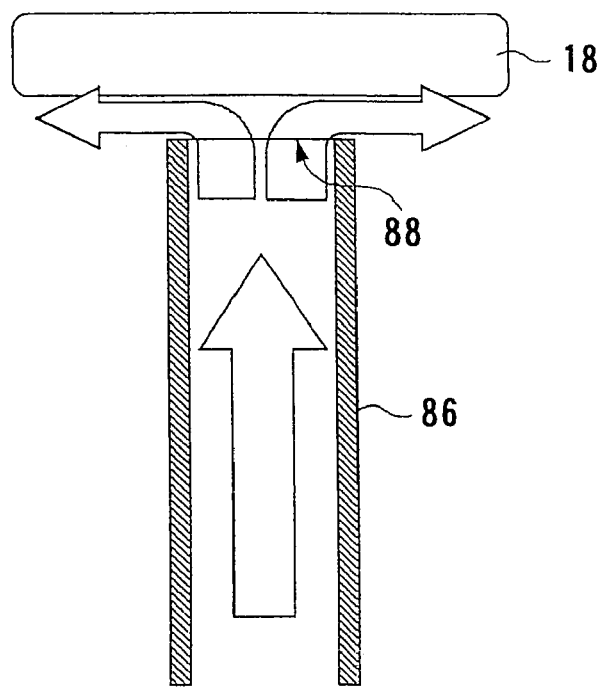

FIGS. 5A and 5B are views each illustrating the relationship between a position of the outlet 88 and a water flow. In FIG. 5A, a distance between the outlet 88 and the substrate 18 is large. This structure corresponds to an apparatus in which the outlet portion of the supply passage 44 is disposed in the rotatable table 12. On the other hand, in FIG. 5B, a distance between the outlet 88 and the substrate 18 is smaller than the distance in the arrangement shown in FIG. 5A. This structure corresponds to the structure of the present embodiment, i.e., the structure in which the outlet 88 is disposed in the through hole 84.

According to the arrangement shown in FIG. 5B, a gap between the outlet 88 and the substrate 18 is smaller than a gap in the arrangement shown in FIG. 5A. Therefore, in the arrangement shown in FIG. 5B, pure water is vigorously ejected from the outlet 88 at a flow velocity greater than that of the arrangement shown in FIG. 5A. The pure water that has been ejected from the outlet 88 produces a flow of pure water along the substrate 18. Consequently, the arrangement shown in FIG. 5B is more effective than the arrangement shown in FIG. 5A in removing a polishing abrasive from an area where measurement light is applied, which is located in front of the outlet portion, by the flow of pure water supplied from the supply passage 44.

According to the present embodiment, since the pipe piece 86 serving as the outlet portion of the supply passage 44 is positioned in the through hole 84 of the polishing pad 16, the outlet 88 of the supply passage 44 is close to the substrate 18. Therefore, a flow velocity of fluid supplied from the outlet 88 is increased at the outlet 88, and the fluid is vigorously ejected from the gap between the substrate 18 and the outlet 88 toward the outside of the supply passage 44, thus forming the flow of the fluid along the substrate 18. The flow of the fluid can effectively remove the polishing abrasive from the area where measurement light is applied, which is located in front of the outlet portion.

According to the present embodiment, furthermore, the pipe piece 86 serving as the outlet portion is detachably mounted on the rotatable table 12. Therefore, since the pipe piece 86 can be mounted after the polishing pad 16 is attached to the rotatable table 12, the polishing pad 16 can be easily mounted on the rotatable table 12. Further, if the pipe piece 86 is removed before the polishing pad 16 is removed, the polishing pad 16 can be easily removed without causing damage to the pipe piece 86.

Figure 6:
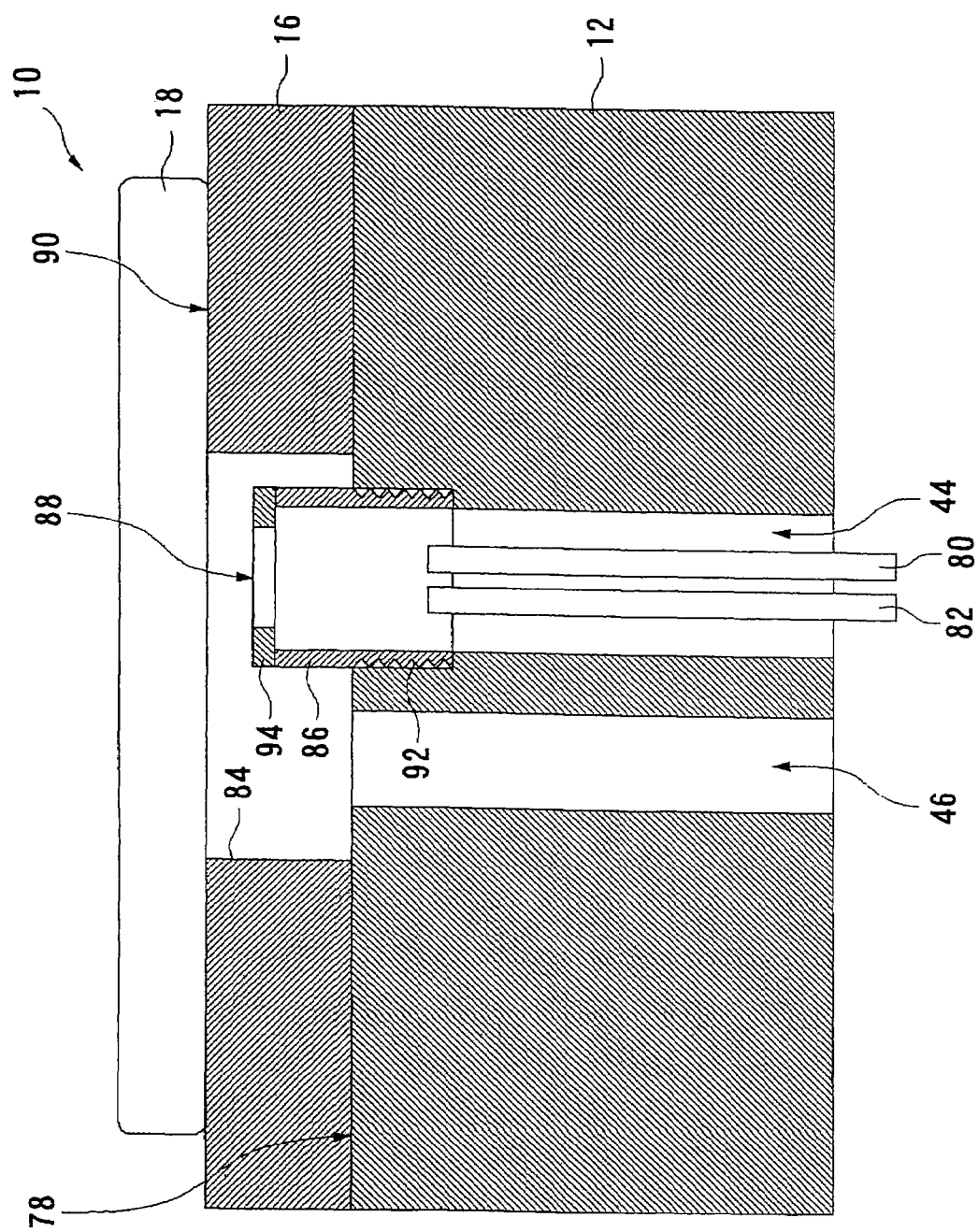
FIG. 6 is a view showing a modification of the substrate polishing apparatus according to the first embodiment of the present invention.

FIG. 6 is a view showing a modification of the above embodiment. This modification has the same basic structure as the above substrate polishing apparatus 10. However, in this modification, a plate-like restriction 94 having an opening smaller than a cross-sectional area of the supply passage 44 is mounted on the outlet portion of the pipe piece 86. With this structure, the area of the outlet 88 of the pipe piece 86 is smaller than the cross-sectional area of the supply passage 44.

In the structure shown in FIG. 6, since the area of the outlet 88 is smaller than the area of the supply passage 44, the flow velocity of the pure water ejected from the outlet 88 of the supply passage 44 becomes large. Thus, it is possible to increase the ability to remove the polishing abrasive from the area where measurement light is applied, which is located in front of the outlet portion.

In this modification, the restriction 94 is provided so that the area of the outlet 88 is smaller than the area of the supply passage 44. Alternatively, the outlet of the pipe piece may have a tapered shape such that the area of the outlet becomes gradually small.

Although the cylindrical pipe piece 86 constitutes the outlet portion of the supply passage 44 in the above embodiment, a pipe piece of different type may be employed alternatively. FIGS. 7A through 7H are views showing various types of pipe pieces that can be employed in the present invention. FIG. 7A shows the cylindrical pipe piece 86 employed in the present embodiment. FIG. 7B shows a pipe piece 96 whose outer surface and hole have a hexagonal cross section. In contrast thereto, a pipe piece 98 shown in FIG. 7C has an outer surface having a hexagonal cross section, and a pipe piece 100 shown in FIG. 7D has a hole having a hexagonal cross section. A pipe piece 102 shown in FIG. 7E has an outer surface having a star-shaped cross section and a hole having a circular cross section. A pipe piece 104 shown in FIG. 7F has an outer surface having a circular cross section and has a hole having a star-shaped cross section. Both pipe pieces 106, 108 respectively shown in FIGS. 7G and 7H comprise a cylindrical pipe piece. The pipe piece 106 has two notches 110 provided near the outlet 88, and the pipe 108 has four notches 110 provided near the outlet 88. These notches 110 are engaged with a tool when the pipe pieces 106, 108 are installed and removed. When the pipe pieces 106, 108 are disposed very closely to the substrate 18, pure water in the supply passage 44 can be released through the notches 110. FIGS. 7A through 7H only show an example of the pipe piece, and it is possible to select a pipe piece having another type of structure.

In the above embodiment, the pipe piece 86 has the screw mechanism 92 comprising the male screw on the pipe piece 86 and the female screw on the rotatable table 12, so that the pipe piece 86 is fastened to the rotatable table 12 by the screw mechanism 92. Alternatively, the pipe piece 86 may be fastened to the rotatable table 12 by any of other mechanisms. For example, the pipe piece 86 may be inserted into the rotatable table 12 so as to be attached thereto, or may be magnetically attached to the rotatable table 12 by a permanent magnet or an electromagnet. The pipe piece 86 may be bonded to the rotatable table 12.

Figure 8:
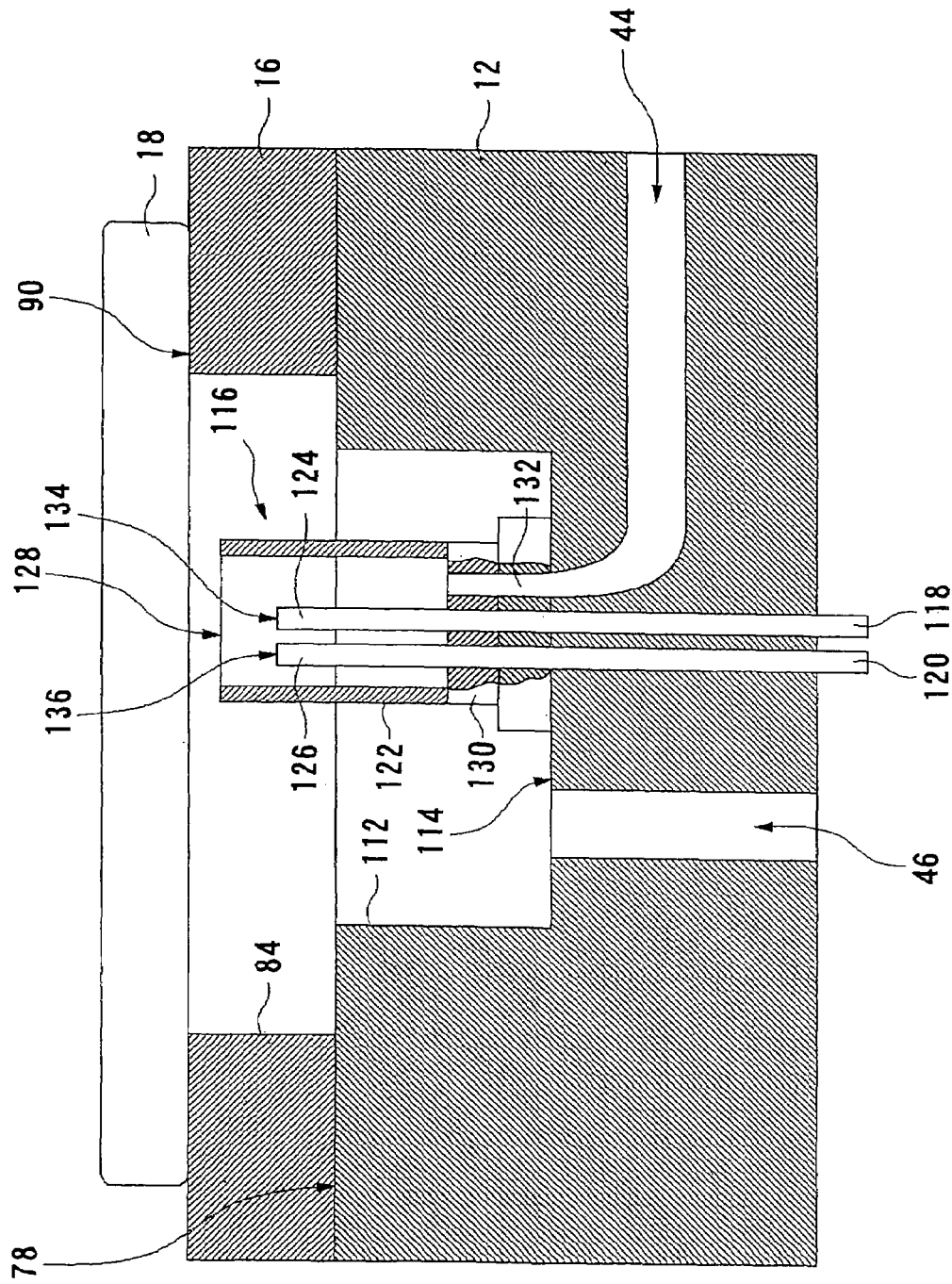
FIG. 8 is a view showing a structure of a substrate polishing apparatus according to a second embodiment of the present invention.

FIG. 8 is a view showing a substrate polishing apparatus 10 according to a second embodiment of the present invention, and showing a measuring area of the rotatable table 12 at an enlarged scale. As with the first embodiment, the polishing pad 16 is mounted on the rotatable table 12, and the substrate 18 is held in contact with the polishing pad 16.

In the present embodiment, the polishing pad mount surface 78 of the rotatable table 12 has a recess 112 formed therein. A pipe unit 116 serving as the outlet portion of the supply passage 44 is mounted on a pipe unit mount surface 114 constituting a bottom of the recess 112. The rotatable table 12 has the supply passage 44 for supplying pure water for measurement and the discharge passage 46 for discharging the pure water, and the supply passage 44 and the discharge passage 46 are exposed at the pipe unit mount surface 114. A light-emitting base optical fiber 118 and a light-receiving base optical fiber 120 extending in parallel to each other are disposed in the rotatable table 12. The light-emitting base optical fiber 118 and the light-receiving base optical fiber 120 have respective end surfaces exposed at the pipe unit mount surface 114.

The pipe unit 116 has a pipe piece 122, a light-emitting optical fiber 124, and a light-receiving optical fiber 126. As with the first embodiment, the pipe piece 122 has an upper end serving as an outlet 128 for a measurement fluid, and the outlet 128 is positioned in the through hole 84. Specifically, the outlet 128 is positioned above the rotatable table 12 and below the polishing surface 90 of the polishing pad 16. The pipe piece 122 has a solid lower portion serving as a fiber support 130 that supports the light-emitting optical fiber 124 and the light-receiving optical fiber 126. The fiber support 130 has a communication passage 132 formed therein for allowing the interior of the pipe piece 122 and the supply passage 44 in the rotatable table 12 to communicate with each other. The light-emitting optical fiber 124 and the light-receiving optical fiber 126 are disposed in parallel to each other in the pipe piece 122, and are supported by the fiber support 130. The light-emitting optical fiber 124 and the light-receiving optical fiber 126 constitute a light emission and reception device.

The light-emitting optical fiber 124 and the light-receiving optical fiber 126 have respective tip end portions 134, 136 positioned in the through hole 84. The light-emitting optical fiber 124 and the light-receiving optical fiber 126 extend to a lower surface of the pipe unit 116, and have respective end surfaces exposed at the lower surface of the pipe unit 116.

A mounting structure for the pipe unit 116 will be described below. FIG. 9A is a view showing the pipe piece 122 of the pipe unit 116, and FIG. 9B is a view showing a unit base for mounting the pipe unit 116 on the rotatable table 12.

As shown in FIG. 9A, the pipe piece 122 has a flange provided on an outer circumferential surface thereof. An annular fastening member 140 is disposed so as to surround the fiber support 130. The fastening member 140 has an inwardly projecting portion whose pressing surface engages with the flange of the pipe piece 122. The fastening member 140 has a female screw formed on an inner circumferential surface thereof. A key 138 for determining a direction in which the pipe piece 122 is mounted is disposed on an outer circumferential surface of the fiber support 130 of the pipe piece 122 and extends along the extending direction of the pipe piece 122.

As shown in FIG. 9B, a unit base 142 has a disk 144 to be mounted on the pipe unit mount surface 114, a cylindrical portion 146 extending upwardly from the disk 144, and a projecting portion 148 extending downwardly from the disk 144. The disk 144, the cylindrical portion 146, and the projecting portion 148 are integrally formed with each other. The disk 144 has four screw holes 150 formed therein by which the unit base 142 is fixed to the pipe unit mount surface 114. The fiber support 130 of the pipe piece 122 is received in the cylindrical portion 146. The cylindrical portion 146 has a key slot 152 formed on an inner circumferential surface thereof, and the key 138 is fitted into the key slot 152. The cylindrical portion 146 has a male screw formed on an outer circumferential surface thereof. The projecting portion 148 is received in a hole formed in the pipe unit mount surface 114.

A light-emitting junction optical fiber 125 and a light-receiving junction optical fiber 127 are provided in the unit base 142. The light-emitting junction optical fiber 125 serves to join the light-emitting optical fiber 124 and the light-emitting base optical fiber 118 to each other, and the light-receiving junction optical fiber 127 serves to join the light-receiving optical fiber 126 and the light-receiving base optical fiber 120 to each other. The unit base 142 has a communication passage 133 for joining the communication passage 132 in the pipe piece 122 and the supply passage 44 in the rotatable table 12 to each other.

With the above structure, the unit base 142 is fixed to the rotatable table 12 by screws, and the pipe piece 122 is fastened to the unit base 142 by the fastening member 140.

An operation of mounting the pipe unit 116 will be described below. First, the unit base 142 shown in FIG. 9B is placed on the pipe unit mount surface 114 of the rotatable table 12, and is then fixed to the pipe unit mount surface 114 by screws which are inserted into the screw holes 150 of the unit base 142. The unit base 142 is placed on the pipe unit mount surface 114 such that the projecting portion 148 of the unit base 142 is inserted in the hole formed in the pipe unit mount surface 114. At this time, the light-emitting base optical fiber 118 that is exposed at the pipe unit mount surface 114 and the light-emitting junction optical fiber 125, the light-receiving base optical fiber 120 and the light-receiving junction optical fiber 127, and the supply passage 44 and the communication passage 133 are aligned with each other, respectively. Then, the pipe piece 122 is fitted into the cylindrical portion 146 of the unit base 142 in such an orientation that the key 138 of the fiber support 130 is inserted in the key slot 152 of the cylindrical portion 146 of the unit base 142, and hence the pipe piece 122 is mounted on the unit base 142. In this state, the light-emitting junction optical fiber 125, the light-receiving junction optical fiber 127, and the communication passage 133 of the unit base 142 are aligned with the light-emitting optical fiber 124, the light-receiving optical fiber 126, and the communication passage 132 of the pipe piece 122, respectively. With the pipe piece 122 being mounted on the unit base 142, the fastening member 140 is turned to press the flange of the pipe piece 122, so that the pipe piece 122 is fastened to the unit base 142. The light-emitting junction optical fiber 125 and the light-emitting optical fiber 124 are joined to each other, and the light-receiving junction optical fiber 127 and the light-receiving optical fiber 126 are also joined to each, thus allowing those optical fibers to guide light.

The pipe unit 116 is detachably mounted on the rotatable table 12 as described above. The pipe unit 116 is removed when the polishing pad 16 is replaced, so that the polishing pad 16 can be easily replaced without being obstructed by the pipe piece 122, the light-emitting optical fiber 124, and the light-receiving optical fiber 126.

The light-emitting optical fiber 124 and the light-receiving optical fiber 126 are disposed in such a state that the tip end portions 134, 136 thereof are positioned upwardly of the rotatable table 12. The tip end portion 134 of the light-emitting optical fiber 124 and the tip end portion 136 of the light-receiving optical fiber 126 are positioned closely to the substrate 18, and hence the reflected light from the substrate 18 can be received efficiently.

The pipe piece 122 extends into the through hole 84, and the outlet 128 is positioned in the through hole 84. Therefore, as with the first embodiment, the polishing abrasive can effectively be removed from the area where measurement light is applied.

The pipe unit 116 serving as the outlet portion is detachably mounted on the rotatable table 12. Therefore, the outlet portion (the pipe unit 116) may be mounted after the polishing pad 16 is attached to the rotatable table 12, so that the polishing pad 16 can be easily attached to the rotatable table 12. Further, the outlet portion may be removed before the polishing pad 16 is removed, so that the polishing pad 16 can be easily removed without causing damage to the outlet portion.

Figure 10A:
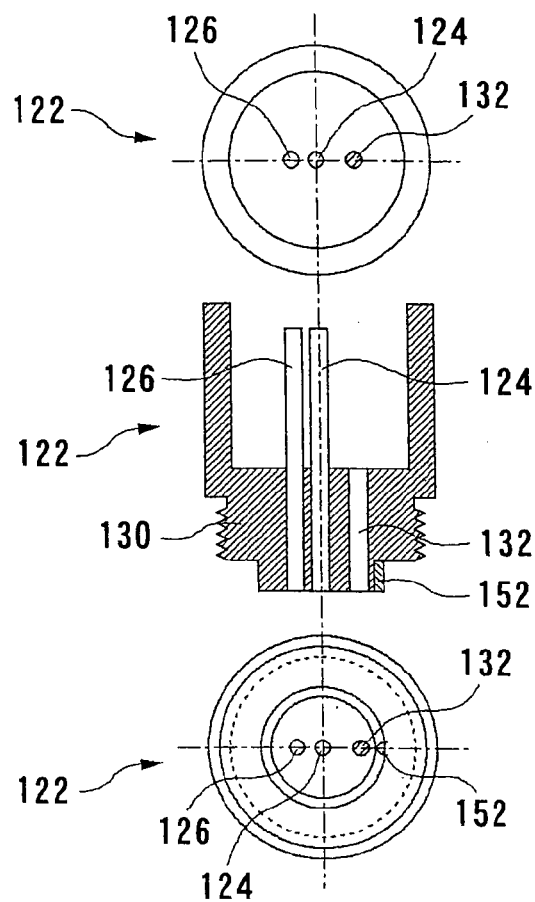
FIGS. 10A and 10B are views each showing a modification of the pipe unit.
Figure 10B:
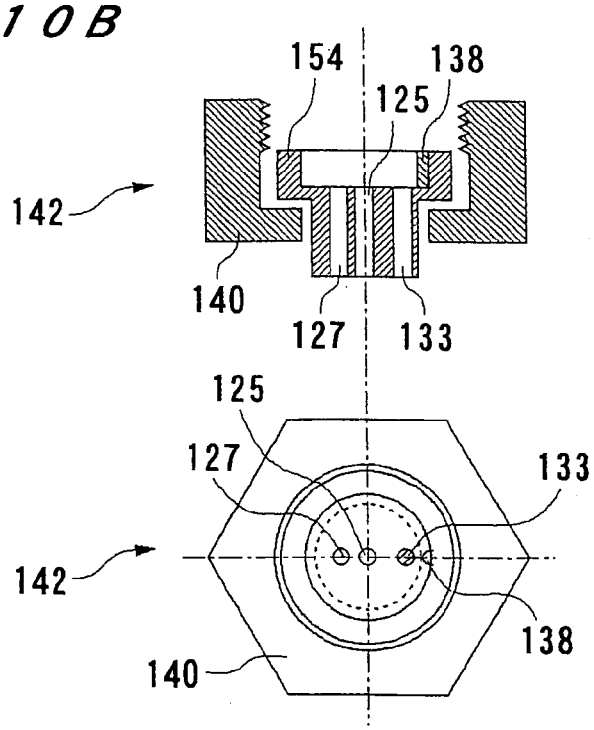

FIGS. 10A and 10B are views showing another mounting structure for the pipe unit 116 of the above embodiment. FIG. 10A shows a pipe piece 122, and FIG. 10B shows a unit base 142. As with the pipe piece 122 described above, the pipe piece 122 has a solid lower portion serving as a fiber support 130 that supports the light-emitting optical fiber 124 and the light-receiving optical fiber 126. The fiber support 130 has a male screw formed on an outer circumferential surface thereof. As shown in FIG. 10A, a key slot 152 is formed near a lower end thereof below the male screw. The key slot 152 serves to determine a direction in which the pipe piece 122 is mounted.

As shown in FIG 10B, the unit base 142 has a cylindrical portion 154 for receiving the lower end of the fiber support 130. The cylindrical portion 154 has a key 138 formed on an inner circumferential surface thereof. The key 138 engages with the key slot 152 of the fiber support 130.

The cylindrical portion 154 has a communication passage 133 for allowing the supply passage 44 and the interior of the pipe piece 122 to communicate with each other, and also has the light-emitting junction optical fiber 125 and the light-receiving junction optical fiber 127.

An annular fastening member 140 is disposed so as to surround the cylindrical portion 154. The fastening member 140 has a female screw formed on an inner circumferential surface thereof. The fastening member 140 has a lower end projecting inwardly and positioned between a flange of the cylindrical portion 154 and the rotatable table (not shown). The flange projects outwardly from an upper portion of the cylindrical portion 154.

In order to mount the pipe unit 116 onto the rotatable table 12, first, the cylindrical portion 154 of the unit base 142 is mounted on the pipe unit mount surface 114. At this time, the fastening member 140 is disposed between the cylindrical portion 154 and the non-illustrated rotatable table. The unit base 142 may be mounted on the rotatable table 12 by bonding, welding, pressure-fitting, or screw engagement with a flange. Alternatively, the unit base 142 may be mounted by a bolt inserted into the cylindrical portion 154 from below the rotatable table 12.

Then, the pipe piece 122 is inserted into the cylindrical portion 154 of the unit base 142 such that the key 138 of the cylindrical portion 154 is fitted into the key slot 152 of the fiber support 30. With the pipe piece 122 being inserted in the cylindrical portion 154, the fastening member 140 is turned to fasten the pipe piece 122 to the unit base 142. In this case also, the pipe unit 116 can be mounted on the rotatable table 12.

In the above embodiment, the pipe piece 122 has the light-emitting optical fiber 124 and the light-receiving optical fiber 126, and the unit base 142 has the light-emitting junction optical fiber 125 and the light-receiving junction optical fiber 127. Alternatively, a light-emitting optical fiber 124 and a light-receiving optical fiber 126 which extend continuously from the pipe piece 122 to the unit base 142 may be employed. This structure can be achieved by the following structure. The pipe piece 122 has a cylindrical optical fiber fixing member made of a resilient material. An optical fiber is inserted through the optical fiber fixing member and is then fastened by the optical fiber fixing member. The unit base 142 has a light-emitting optical fiber 124 and a light-receiving optical fiber 126 whose tip end portions project upwardly. The light-emitting optical fiber 124 and the light-receiving optical fiber 126 projecting upwardly of the unit base 142 are inserted into the optical fiber fixing member, so that the tip end portions of the light-emitting optical fiber 124 and the light-receiving optical fiber 126 are positioned in the pipe piece 122. Then, the optical fiber fixing member is tightened to fix the light-emitting optical fiber 124 and the light-receiving optical fiber 126 in place. The light-emitting optical fiber 124 and the light-receiving optical fiber 126 may be fixed together by the optical fiber fixing member, or may be fixed separately by respective optical fiber fixing members which are provided for the light-emitting optical fiber 124 and the light-receiving optical fiber 126, respectively.

In the above embodiment, the pipe piece 122 is mounted by the fastening member 140. However, the present invention is not limited to such a structure. For example, the pipe unit 116 may be mounted on the pipe unit mount surface 114 by a bolt and a nut. Alternatively, the pipe unit 116 may be bonded to the pipe unit mount surface 114.

FIG. 11 is a view showing a substrate polishing apparatus 10 according to a third embodiment of the present invention, and showing a measuring area of the rotatable table 12 at an enlarged scale. As with the first embodiment, the polishing pad 16 is placed on the polishing pad mount surface 78 of the rotatable table 12, and the substrate 18 is held in contact with the polishing pad 16. The rotatable table 12 incorporates therein the supply passage 44 for supplying pure water for measurement to the through hole 84 and the discharge passage 46 for discharging the pure water from the through hole 84. The light-emitting optical fiber 80 and the light-receiving optical fiber 82 are disposed in the supply passage 44. The light-emitting optical fiber 80 and the light-receiving optical fiber 82 constitute a light emission and reception device.

The substrate polishing apparatus 10 has a pipe piece 156 serving as an outlet portion of the supply passage 44. The pipe piece 156 comprises a cylindrical member extending from the inside of the rotatable table 12 to a position upward of the rotatable table 12 in a direction perpendicular to the polishing surface 90. The pipe piece 156 has an outlet 158 positioned in the through hole 84. Specifically, the outlet 158 is positioned below the polishing surface 90.

The supply passage 44 disposed in the rotatable table 12 comprises a tube. An outside diameter of the supply passage 44 is substantially equal to an inside diameter of the pipe piece 156. A tip end portion of the supply passage 44 is inserted in the pipe piece 156. The pipe piece 156 is slidable in the extending direction of the supply passage 44. The pipe piece 156 has a lower portion thicker than an upper portion thereof, thereby constituting a supported portion 160. The rotatable table 12 has a hole 162 in which the supported portion 160 of the pipe piece 156 is inserted. A spring 164 is mounted on a lower surface of the supported portion 160 for thereby urging the pipe piece 156 to move upwardly. The hole 162 formed in the rotatable table 12 has an upper end serving as a contact surface 168 for receiving a step 166 of the supported portion 160. When the step 166 is brought into contact with the contact surface 168, a movement of the pipe piece 156 under an urging force of the spring 164 is limited, and the pipe piece 156 is thus positioned.

The pipe piece 156 is urged upwardly by the spring 164 and hence the outlet 158 projects from the rotatable table 12. Therefore, when the pipe piece 156 is pressed toward the rotatable table 12, the pipe piece 156 is moved in a sliding motion to be accommodated in the rotatable table 12. The hole 162 formed in the rotatable table 12 has a size enough to allow the pipe piece 156 to move to a position where the outlet of the pipe piece 156 is accommodated in the rotatable table 12.

An operation of installing the polishing pad 16 according to the present embodiment will be described below. First, the polishing pad 16 is placed on the polishing pad mount surface 78 of the rotatable table 12. At this time, the polishing pad 16 is positioned such that the pipe piece 156 projecting from the rotatable table 12 is inserted in the through hole 84 formed in the polishing pad 16. In an initial stage of placing the polishing pad 16 on the rotatable table 12, the polishing pad 16 is roughly positioned. When the polishing pad 16 is placed on the pipe piece 156 and the pipe piece 156 is pressed toward the rotatable table 12, the pipe piece 156 is moved into the rotatable table 12 against the urging force of the spring 164, and accommodated in the rotatable table 12. Then, the position of the polishing pad 16 on the rotatable table 12 is adjusted. Specifically, the polishing pad 16 is moved on the rotatable table 12 so as to bring the through hole 84 over the pipe piece 156. When the through hole 84 is positioned over the pipe piece 156, the pipe piece 156 is moved upwardly by the urging force of the spring 164, and projects from the rotatable table 12. That is, the outlet 158 of the pipe piece 156 projects into the through hole 84.

In this manner, when the pipe piece 156 is pressed by the polishing pad 16 placed on the rotatable table 12, the pipe piece 156 is accommodated in the rotatable table 12. Therefore, the pipe piece 156 does not obstruct the installation of the polishing pad 16. When the through hole 84 of the polishing pad 16 and the pipe piece 156 are aligned with each other, the pipe piece 156 projects into the through hole 84. Consequently, the through hole 84 and the pipe piece 156 can be easily positioned with respect to each other.

With the substrate polishing apparatus 10 according to the third embodiment, since the outlet 158 of the pipe piece 156 is positioned in the through hole 84, the polishing abrasive can effectively be removed from the area where measurement light is applied, as with the first embodiment.

The pipe piece 156 serving as the outlet portion is urged to move toward the polishing surface 90 by the spring 164 as an urging means, so that the pipe piece 156 is disposed in the through hole 84. The outlet portion can be moved toward the rotatable table 12 against the urging force of the spring 164. When replacing the polishing pad 16, if the polishing pad 16 is placed on the outlet portion, the outlet portion is pushed by the polishing pad 16 and accommodated in the rotatable table 12. When the through hole 84 of the polishing pad 16 and the outlet portion are aligned with each other, the outlet portion is urged by the spring 164 to project into the through hole 84. Therefore, since the outlet portion does not obstruct the installation of the polishing pad 16, the polishing pad 16 can be easily positioned.

FIG. 12 is a view showing a substrate polishing apparatus 10 according to a fourth embodiment of the present invention, and showing a measuring area of the rotatable table 12 at an enlarged scale. As with the first embodiment, the polishing pad 16 is placed on the polishing pad mount surface 78 of the rotatable table 12, and the substrate 18 is held in contact with the polishing pad 16. The rotatable table 12 incorporates therein the supply passage 44 and the discharge passage 46 which extend in parallel to each other. The supply passage 44 accommodates therein the light-emitting optical fiber 80 and the light-receiving optical fiber 82 which extend in parallel to each other. The light-emitting optical fiber 80 and the light-receiving optical fiber 82 constitute a light emission and reception device.

The substrate polishing apparatus 10 has a pipe piece 170 serving as an outlet portion of the supply passage 44. The pipe piece 170 comprises a cylindrical member extending from the inside of the rotatable table 12 to a position upward of the rotatable table 12 in a direction perpendicular to the polishing surface 90. The pipe piece 170 has an outlet 172 positioned in the through hole 84. Specifically, the outlet 172 is positioned below the polishing surface 90. An outer circumferential surface of the pipe piece 170 is held in contact with the inner surface of the supply passage 44 within the rotatable table 12. The pipe piece 170 is vertically movable along the supply passage 44.

A piezoelectric element 174 is attached to a lower portion of the pipe piece 170. A voltage generator 176 for applying voltage is connected to the piezoelectric element 174. The substrate polishing apparatus 10 also has an electrostatic distance meter 178 for measuring a distance between the outlet 172 and the substrate 18. The electrostatic distance meter 178 is connected to the controller unit 30. The controller unit 30 sends a command signal to the voltage generator 176 based on a distance measured by the electrostatic distance meter 178 so as to control the movement of the pipe piece 170.

Since the pipe piece 170 is attached to the piezoelectric element 174, when voltage is applied to the piezoelectric element 174, the pipe piece 170 is moved along the supply passage 44 so as to change the position of the pipe piece 170. Therefore, the position of the pipe piece 170 can be changed at any time such as when replacing or dressing the polishing pad 16 or when polishing the substrate 18. While the substrate 18 is polished, the electrostatic distance meter 178 measures a distance between the outlet 172 and the substrate 18, and the position of the pipe piece 170 is adjusted based on the measured distance. Specifically, when the polishing pad 16 is worn by polishing to cause the substrate 18 to be positioned closely to the outlet 172, the pipe piece 170 is lowered to avoid a contact between the pipe piece 170 and the substrate 18. If the pipe piece 170 is moved toward the substrate 18 insofar as the pipe piece 170 is kept out of contact with the substrate 18 while the substrate 18 is polished, a flow velocity of pure water ejected from the gap between the substrate 18 and the outlet 172 can be large. Therefore, the polishing abrasive can effectively be removed from the area where measurement light is applied. When dressing the polishing pad 16, the pipe piece 170 is lowered to a position where the pipe piece 170 is kept out of contact with the dresser, or the pipe piece 170 is accommodated in the rotatable table 12, so that the pipe piece 170 is prevented from being scraped by the dressing process. When replacing the polishing pad 16, the pipe piece 170 is accommodated in the rotatable table 12. Since the pipe piece 170 does not project from the polishing pad mount surface 78, the pipe piece 170 is not obstructive, and hence the polishing pad 16 can be easily attached.

As described above, with the substrate polishing apparatus 10 according to the fourth embodiment, since the outlet portion can be moved by the piezoelectric element 174 serving as an outlet portion moving means, the outlet portion can be moved into the through hole 84 after the polishing pad 16 is attached to the rotatable table 12.

The outlet portion can be moved and accommodated in the rotatable table 12 before the polishing pad 16 is removed. Therefore, the polishing pad 16 can be easily replaced without causing damage to the outlet portion. The outlet portion projects from the rotatable table 12 to be positioned closely to the substrate 18. Therefore, the flow velocity of the fluid supplied from the supply passage 44 is increased at the outlet portion, and the fluid is vigorously ejected from the gap between the substrate 18 and the outlet portion toward the outside of the supply passage 44, thus forming a flow along the substrate 18. The flow of the fluid can effectively remove the polishing abrasive from the area where measurement light is applied, which is located in front of the outlet portion. Since the distance between the substrate 18 and the outlet portion is measured by the electrostatic distance meter 178, it is possible to adjust the position of the outlet portion according to the thickness of the polishing pad 16 which has been scraped by the dressing process, and hence an positional relationship between the substrate 18 and the outlet portion can be kept appropriately.

FIG. 13 is a view showing a substrate polishing apparatus 10 according to a fifth embodiment of the present invention, and showing a measuring area of the rotatable table 12 at an enlarged scale. The substrate polishing apparatus 10 according to the fifth embodiment has the same basic structure as the substrate polishing apparatus 10 according to the fourth embodiment. However, the substrate polishing apparatus 10 according to the fifth embodiment is different from the substrate polishing apparatus 10 according to the fourth embodiment in that while the pipe piece 170 is movable in the fourth embodiment, the light-emitting optical fiber 80 and the light-receiving optical fiber 82 are movable in the fifth embodiment.

The supply passage 44 formed in the rotatable table 12 accommodates therein the light-emitting optical fiber 80 and the light-receiving optical fiber 82 extending in parallel to each other. The light-emitting optical fiber 80 and the light-receiving optical fiber 82 constitute a light emission and reception device. The light-emitting optical fiber 80 and the light-receiving optical fiber 82 are connected to the light source unit 32 and the photometer unit 34, respectively. The light-emitting optical fiber 80 applies measurement light supplied from the light source unit 32 to the substrate 18. The light-receiving optical fiber 82 receives reflected light from the substrate 18 and transmits the received light to the photometer unit 34.

The pipe piece 170 serving as an outlet portion of the supply passage 44 comprises a cylindrical member extending from the inside of the rotatable table 12 to a position upward of the rotatable table 12 in a direction perpendicular to the polishing surface 90.

The pipe piece 170 is fixed to the supply passage 44. The pipe piece 170 has an outlet 172 positioned in the through hole 84. Specifically, the outlet 172 is positioned below the polishing surface 90.

The piezoelectric element 174 is connected to the light-emitting optical fiber 80 and the light-receiving optical fiber 82. The voltage generator 176 for applying voltage is connected to the piezoelectric element 174. The substrate polishing apparatus 10 also has a calculating unit 180 for calculating an amount of received light detected by the photometer unit 34. The calculating unit 180 is connected to the controller unit 30. The controller unit 30 sends a command signal to the voltage generator 176 based on the amount of the received light calculated by the calculating unit 180 so as to control the movement of the light-emitting optical fiber 80 and the light-receiving optical fiber 82.

In the substrate polishing apparatus 10, the piezoelectric element 174 is attached to the light-emitting optical fiber 80 and the light-receiving optical fiber 82. When voltage is applied to the piezoelectric element 174, the light-emitting optical fiber 80 and the light-receiving optical fiber 82 is moved along the supply passage 44, and hence the positions thereof can be changed. The controller unit 30 for controlling the voltage generator 176 which applies voltage to the piezoelectric element 174 is connected to the calculating unit 180 which calculates the amount of light received by the light-receiving optical fiber 82. The control unit 30 controls the piezoelectric element 174 based on the amount of the received light calculated by the calculating unit 180, so that the light-emitting optical fiber 80 and the light-receiving optical fiber 82 can be moved so as to increase the amount of the reflected light to be received.

The amount of the received light is calculated by the photometer unit 34 and the calculating unit 180, and the piezoelectric element 174 is controlled based on the amount of the received light. With this structure, the positions of the light-emitting optical fiber 80 and the light-receiving optical fiber 82 can be adjusted while the substrate 18 is polished. When the tip end portion 182 of the light-emitting optical fiber 80 and the tip end portion 184 of the light-receiving optical fiber 82 are close to the substrate 18, the amount of the reflected light to be received is increased. However, if the tip end portions 182, 184 are too close to the substrate 18, then the amount of the reflected light to be received is reduced. Therefore, when the polishing pad 16 is worn by polishing or dressing to cause the distances between the tip end portions 182, 184 and the substrate 18 to become small, the positions of the light-emitting optical fiber 80 and the light-receiving optical fiber 82 can be adjusted based on the amount of the received light, thereby increasing a rate at which the reflected light is received.

According to the fifth embodiment, since the outlet 172 of the pipe piece 170 is positioned in the through hole 84, the polishing abrasive can effectively be removed from the area where measurement light is applied, as with the first embodiment.

The light emission and reception device can be disposed in the through hole 84, and can be thus brought closely to the substrate 18 for thereby receiving the reflected light efficiently. Because the light emission and reception device is movable, the light emission and reception device can be accommodated in the rotatable table 12 when the polishing pad 16 is replaced, and thus does not obstruct the replacement of the polishing pad 16.

Figure 14:
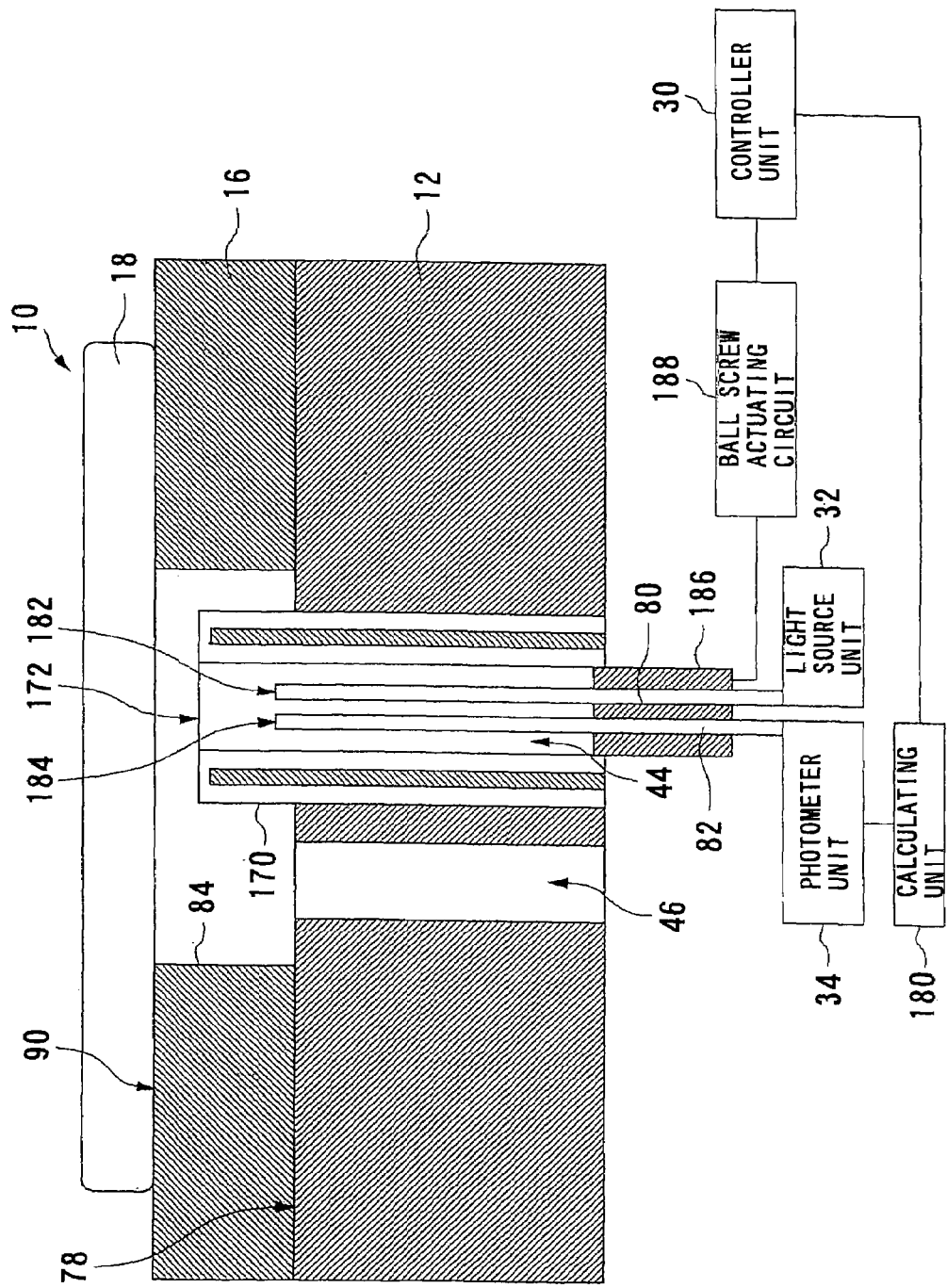
FIG. 14 is a view showing a modification of the substrate polishing apparatus according to the fifth embodiment of the present invention.

FIG. 14 is a view showing a modification of the substrate polishing apparatus according to the fifth embodiment. This modification is different in that a ball screw 186 is employed instead of the piezoelectric element 174 for moving the light-emitting optical fiber 80 and the light-receiving optical fiber 82. The ball screw 186 is mounted on the light-emitting optical fiber 80 and the light-receiving optical fiber 82. The ball screw 186 is connected to a ball screw actuating circuit 188. The calculating unit 180 for calculating an amount of received light detected by the photometer unit 34 is connected to the controller unit 30. The controller unit 30 sends a command signal to the ball screw actuating circuit 188 based on the amount of the received light calculated by the calculating unit 180 so as to control the movement of the light-emitting optical fiber 80 and the light-receiving optical fiber 82.

According to this modification, as with the above embodiment, the control unit 30 controls the ball screw 186 based on the amount of the received light calculated by the calculating unit 180, so that the light-emitting optical fiber 80 and the light-receiving optical fiber 82 can be moved so as to increase the amount of the reflected light to be received. The above modification is also applicable to the fourth embodiment. In this case, the outlet portion moving means is constituted by of the ball screw and the ball screw actuating circuit.

The light-emitting optical fiber 80 and the light-receiving optical fiber 82 may be vertically movable independently of each other. With this structure, the vertical positions of the tip end portions 182, 184 can be adjusted separately or only one of the vertical positions of the tip end portions 182, 184 can be adjusted in order to optimize the amount of light received by the light-receiving optical fiber 82.

Figure 15:
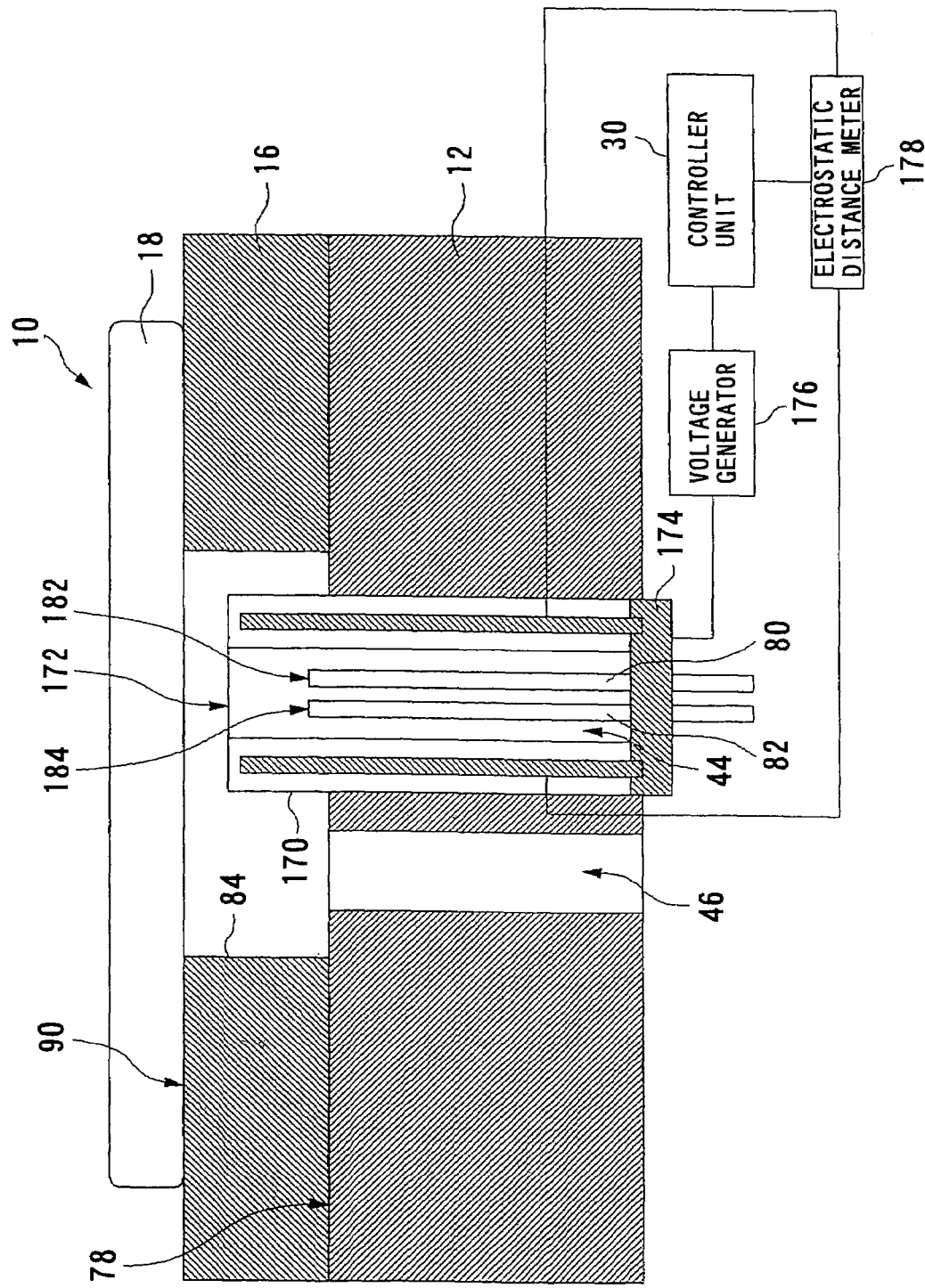
FIG. 15 is a view showing a structure of a substrate polishing apparatus according to a sixth embodiment of the present invention.

FIG. 15 is a view showing a substrate polishing apparatus 10 according to a sixth embodiment of the present invention, and showing a measuring area of the rotatable table 12 at an enlarged scale. The substrate polishing apparatus 10 according to the sixth embodiment has the same basic structure as the substrate polishing apparatus 10 according to the fourth embodiment (FIG. 12). However, while the pipe piece 170 is movable in the fourth embodiment, the light-emitting optical fiber 80 and the light-receiving optical fiber 82 together with the pipe piece 170 are movable in the fifth embodiment.

Specifically, in the sixth embodiment, the light-emitting optical fiber 80 and the light-receiving optical fiber 82 as well as the pipe piece 170 serving as the outlet portion are connected to the piezoelectric element 174. Thus, the light-emitting optical fiber 80 and the light-receiving optical fiber 82 together with the pipe piece 170 are vertically movable.

The light-emitting optical fiber 80 and the light-receiving optical fiber 82 are movable along the supply passage 44. Therefore, if the tip end portion 182 of the light-emitting optical fiber 80 and the tip end portion 184 of the light-receiving optical fiber 82 together with the pipe piece 170 are moved closely to the substrate 18 when polishing, the reflected light from the substrate 18 can efficiently be received. When replacing the polishing pad 16, the light-emitting optical fiber 80 and the light-receiving optical fiber 82 together with the pipe piece 170 are accommodated in the rotatable table 12 so as not to obstruct the replacement of the polishing pad 16.

According to the sixth embodiment, as with the fourth embodiment, the polishing abrasive can effectively be removed from the area where measurement light is applied by moving the pipe piece 170 so as to position the outlet 172 in the through hole 84 and bringing the outlet 172 closely to the substrate 18.

Since the light emission and reception device can be disposed in the through hole 84 so as to be positioned closely to the substrate 18, the reflected light can be received efficiently. Further, since the light emission and reception device is movable together with the outlet portion, the light emission and reception device can be accommodated in the rotatable table 12 when replacing the polishing pad 16. Therefore, the light emission and reception device does not obstruct the replacement of the polishing pad 16.

The process of measuring the distance between the pipe piece 170 or the optical fibers 80, 82 and the substrate 18, and the moving mechanism for the pipe piece 170, the optical fibers 80, 82, or the pipe piece 170 with the optical fibers 80, 82 have been described above with reference to FIGS. 11 through 14. However, the process of measuring the distance and the moving mechanism are not limited to the above embodiments, but combination thereof may be changed as needed. Further, other types of sensors and moving mechanisms may also be employed.

The light-emitting optical fiber 80, the light-receiving optical fiber 82, and the pipe piece 170 may be vertically movable independently of each other. With such a structure, the vertical positions of the light-emitting optical fiber 80, the light-receiving optical fiber 82, and the pipe piece 170 can be adjusted independently so as to optimize the amount of received light and a flow velocity of a measurement fluid which is ejected toward the substrate 18. It is desirable to control the pipe piece 170 and the optical fibers 80, 82 so that the distance between the pipe piece 170 and the substrate 18, and the distance between the optical fibers 80, 82 and the substrate 18 are kept constant, respectively. It is also desirable to move the pipe piece 170 and the optical fibers 80, 82 integrally and simultaneously. In these cases, it is possible to reduce an influence due to mixture of the slurry with the measurement fluid and change of the amount of light, and hence properties of the substrate 18 can be measured accurately.

In the present embodiment, the pipe piece 170, the light-emitting optical fiber 80, and the light-receiving optical fiber 82 are movable with use of the piezoelectric element 174. Alternatively, a ball screw can be employed instead of the piezoelectric element 174. In the embodiments shown in FIGS. 11 through 14, in order to prevent a fluid from leaking from a gap between the supply passage 44 and the polishing table 12, a seal mechanism such as a cover for covering the gap may be provided.

Figure 16:
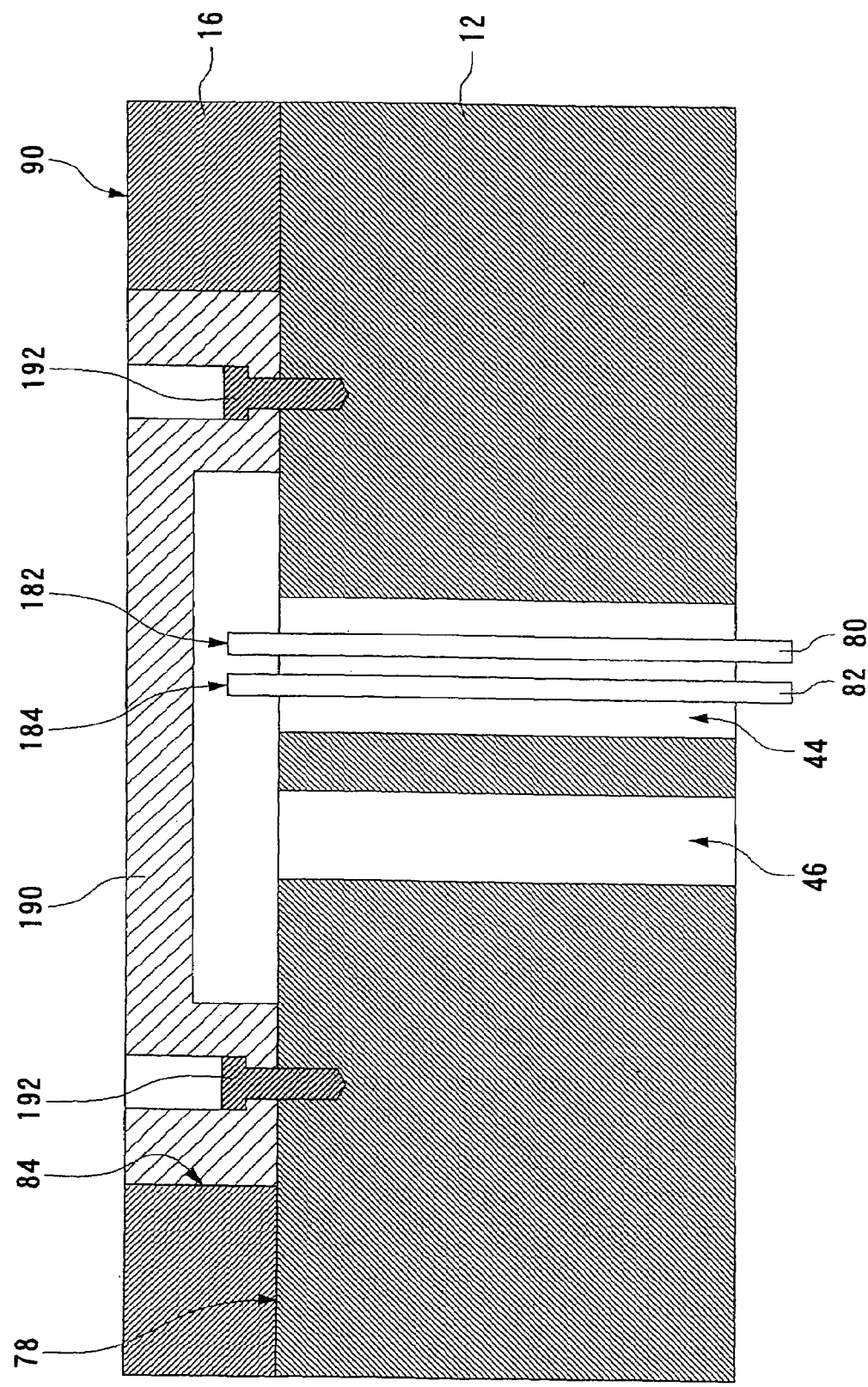
FIG. 16 is a view showing a structure of a substrate polishing apparatus when replacing a polishing pad according to a seventh embodiment of the present invention.

FIG. 16 is a view showing a substrate polishing apparatus 10 according to a seventh embodiment of the present invention, and showing a measuring area of the rotatable table 12 at an enlarged scale. As with the first embodiment described above, the polishing pad 16 is placed on the polishing pad mount surface 78 of the rotatable table 12. The rotatable table 12 incorporates therein the supply passage 44 and the discharge passage 46 extending in parallel to each other. The polishing pad 16 has the through hole 84 formed therein, and the supply passage 44 and the discharge passage 46 communicate with the through hole 84.

The light-emitting optical fiber 80 and the light-receiving optical fiber 82 are disposed in parallel to each other in the supply passage 44. The light-emitting optical fiber 80 and the light-receiving optical fiber 82 constitute a light emission and reception device. The light-emitting optical fiber 80 and the light-receiving optical fiber 82 project from the rotatable table 12, and the tip end portions 182, 184 thereof are positioned in the through hole 84.

The substrate polishing apparatus 10 has a protection cover 190 fitted in the through hole 84. The protection cover 190 is detachably mounted on the rotatable table 12 by bolts 192. As described below, the protection cover 190 is mounted when the polishing pad 16 is replaced.

An operation of replacing the polishing pad 16 in the present embodiment will be described below. When replacing the polishing pad 16, the protection cover 190 is fitted in the through hole 84, and is then fixed to the rotatable table 12 by the bolts 192. Then, the old polishing pad 16 is removed, and a new polishing pad 16 is attached. The polishing pad 16 is attached so that the protection cover 190 fixed to the rotatable table 12 is fitted into the through hole 84 of the polishing pad 16. After the polishing pad 16 is attached, the bolts 192 are removed, and then the protection cover 190 is removed from the rotatable table 12.

When the polishing pad 16 is replaced, the supply passage 44 and the discharge passage 46 are covered by the protection cover 190. Therefore, it is possible to protect the light-emitting optical fiber 80 and the light-receiving optical fiber 82 whose tip end portions 182, 184 project upwardly from the supply passage 44 and the rotatable table 12. Since the polishing pad 16 is attached in such a manner that the protection cover 190 is fitted into the through hole 84, the polishing pad 16 can be easily positioned. Consequently, the polishing pad 16 can be easily replaced.

The tip end portions of the light-emitting optical fiber 80 and the light-receiving optical fiber 82 are positioned above the rotatable table 12. Therefore, the tip end portions 182, 184 of the light-emitting optical fiber 80 and the light-receiving optical fiber 82 are positioned closely to the substrate 18, and hence the reflected light from the substrate 18 can be received efficiently.

According to the seventh embodiment, since the protection cover 190 is received in the through hole 84 of the polishing pad 16, the polishing pad 16 can be replaced while the protection cover 190 is mounted. The protection cover 190 covers an opening, serving as the supply passage 44, of the rotatable table 12. Therefore, even if the outlet portion of the supply passage 44 and the light emission and reception device project from the polishing pad mount surface 78, for example, the polishing pad 16 can be replaced while the supply passage 44 is protected by the protection cover 190.

Figure 17:
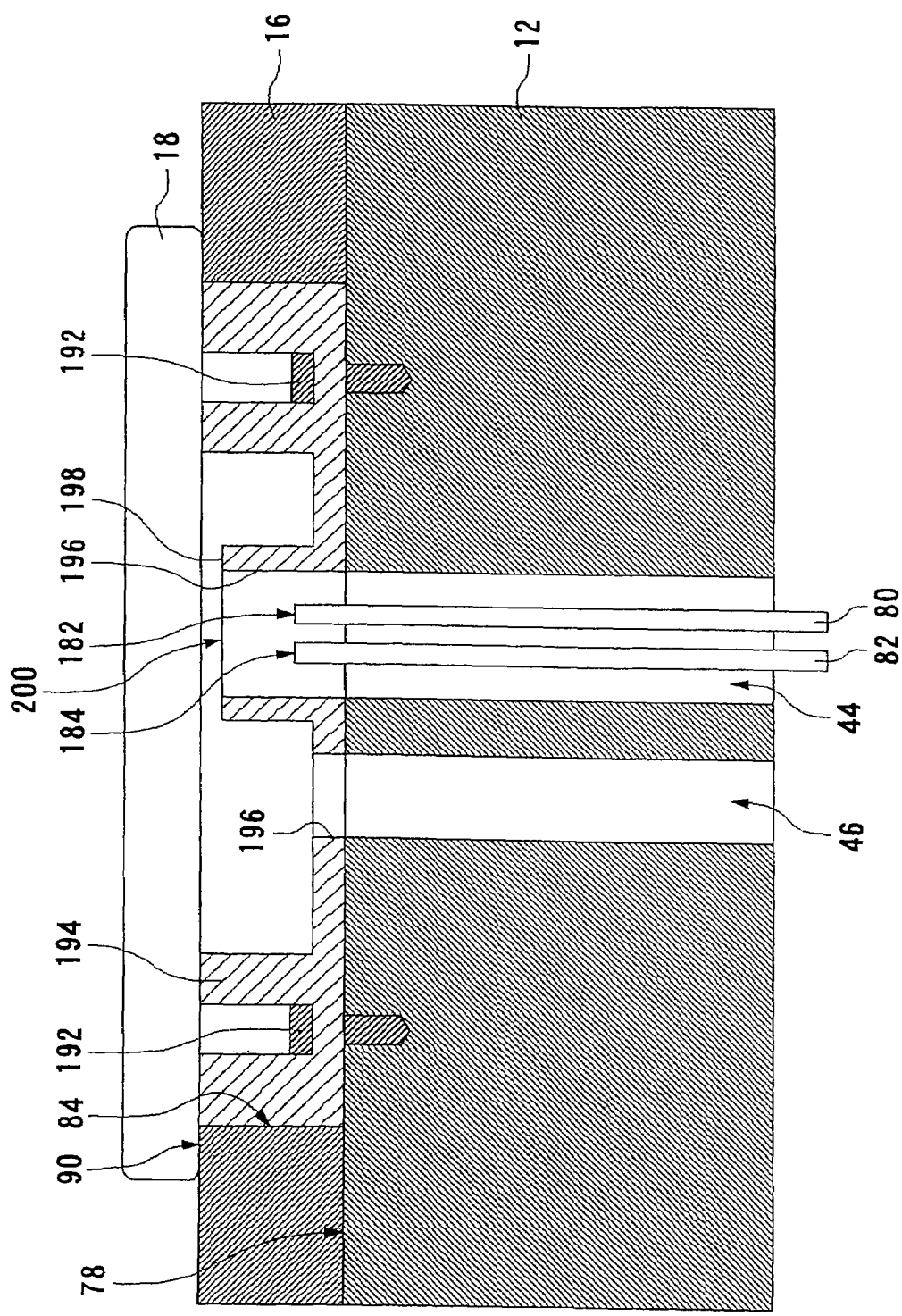
FIG. 17 is a view showing a structure of the substrate polishing apparatus when polishing a substrate according to the seventh embodiment of the present invention.

FIG. 17 is a view showing an example of the substrate polishing apparatus 10 in a state of polishing the substrate 18 and measuring a film on the substrate 18. A patch piece 194 is mounted instead of the protection cover 190. The patch piece 194 has holes 196 formed therein for allowing the supply passage 44 and the discharge passage 46 to communicate with the through hole 84. The patch piece 194 also has a tube portion 198 for allowing the supply passage 44 to extend into the through hole 84. The tube portion 198 serves as the outlet portion of the supply passage 44, and has an outlet 200 positioned in the through hole 84.

The outlet 200 is positioned in the through hole 84 by providing the patch piece 194. Accordingly, as with the first embodiment, the polishing abrasive can effectively be removed from the area where measurement light is applied.

Figure 18:
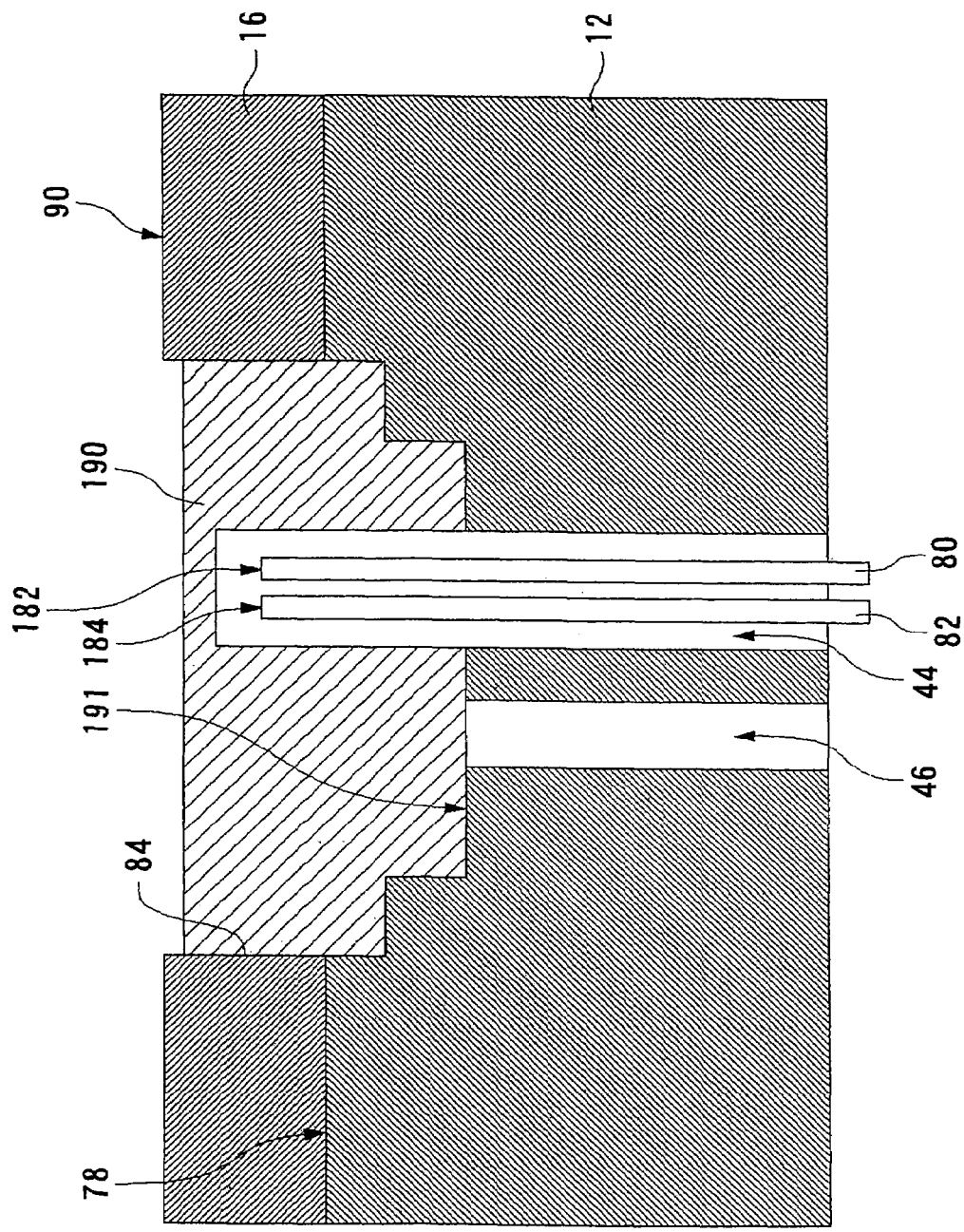
FIG. 18 is a view showing a modification of the seventh embodiment.

FIG. 18 is a view showing a modification of the above embodiment, and showing a measuring area of the rotatable table 12 at an enlarged scale. In this modification, the rotatable table 12 has a recess 191 in which the protection cover 190 is fitted. The protection cover 190 is mounted by being fitted in the recess 191 of the rotatable table 12. With this structure, the protection cover 190 can be easily mounted on and removed from the rotatable table 12.

FIG. 19 is a view showing a modification of the substrate polishing apparatus 10 in a state of polishing the substrate 18 and measuring a film on the substrate 18. A patch piece 194 is mounted instead of the protection cover 190 on the rotatable table 12. The patch piece 194 is mounted by being fitted in the recess 191 of the rotatable table 12. The patch piece 194 has a tube portion 198 for effectively removing the polishing abrasive from the area where measurement light is applied, as with the first embodiment. The patch piece 194 may not necessarily have the tube portion 198.

FIG. 20 is a view showing a modification of the substrate polishing apparatus 10 in a state of polishing the substrate 18 and performing an end point detection. As shown in FIG. 20, a patch piece 194 employed in this modification does not have a tube portion, and an outlet 200 of the supply passage 44 is positioned on the polishing pad mount surface 78. Such a patch piece 194 can be employed in the substrate polishing apparatus 10.

Figure 21A:
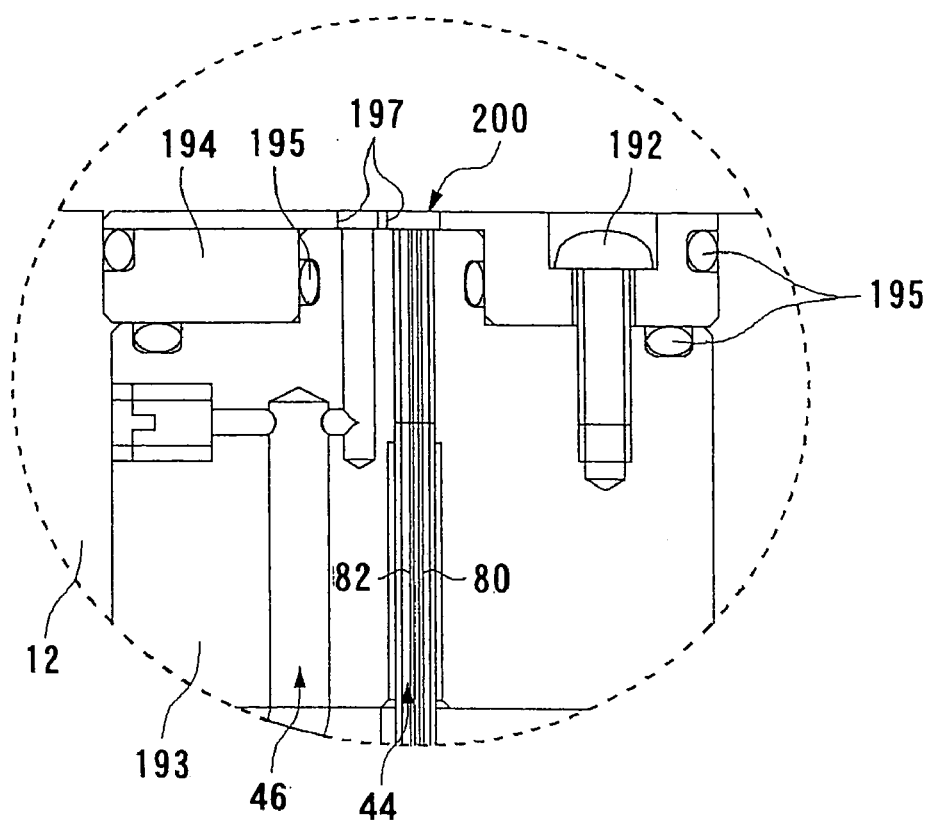
FIG. 21A is an enlarged view showing a mount portion for a patch piece in detail.
Figure 21B:
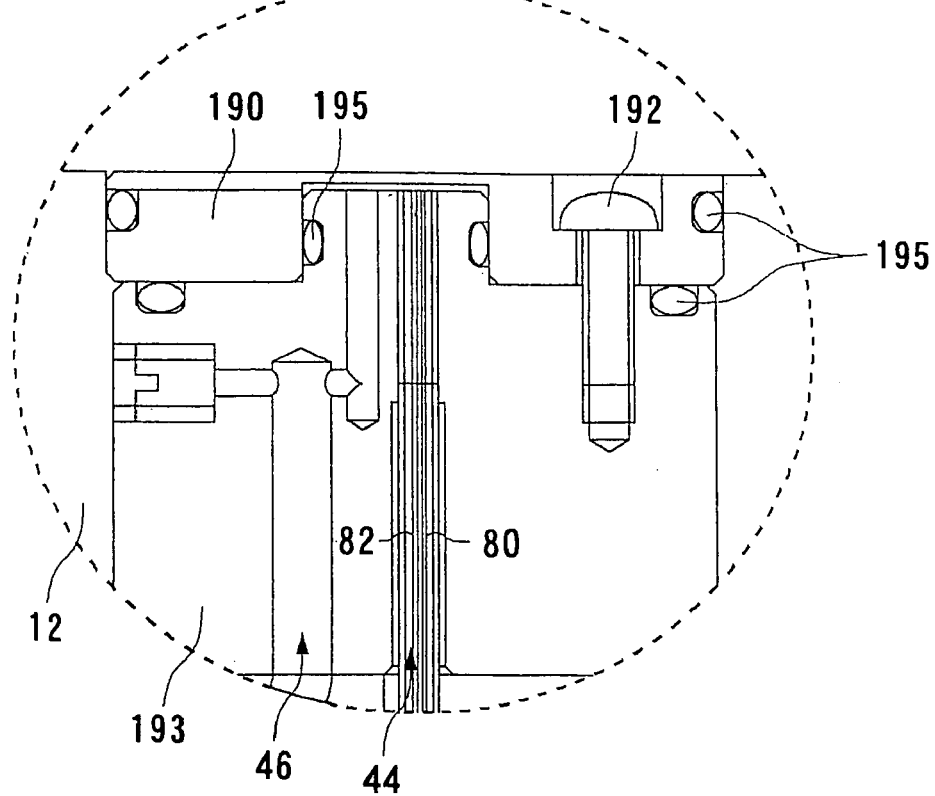
FIG. 21B is a view showing a structure in which a protection cover is mounted on the mount portion.

FIG. 21A is an enlarged view showing in detail a mount area R for the patch piece 194 shown in FIG. 20, and FIG. 21B is a view showing in detail a structure in which the protection cover 190 is mounted on the mount area R. As shown in FIG. 21A, a mounting block 193 is installed in the rotatable table 12. The block 193 has the supply passage 44 and the discharge passage 46 formed therein. The patch piece 194 is fitted on the mounting block 193. Openings 197 are formed in the patch piece 194, and pure water is supplied from the supply passage 44 to the through hole 84 through the opening 197 and discharged from the discharge passage 46 through the opening 197. O-rings 195 are attached to the mounting block 193 and the patch piece 194, respectively, in order to prevent the pure water supplied to the through hole 84 from leaking into the rotatable table 12.

As shown in FIG. 21B, the protection cover 190 has substantially the same shape as the patch piece 194 shown in FIG. 21A. However, the protection cover 190 does not have openings for allowing the supply passage 44 and the discharge passage 46 to communicate with the through hole 84.

Figure 22:
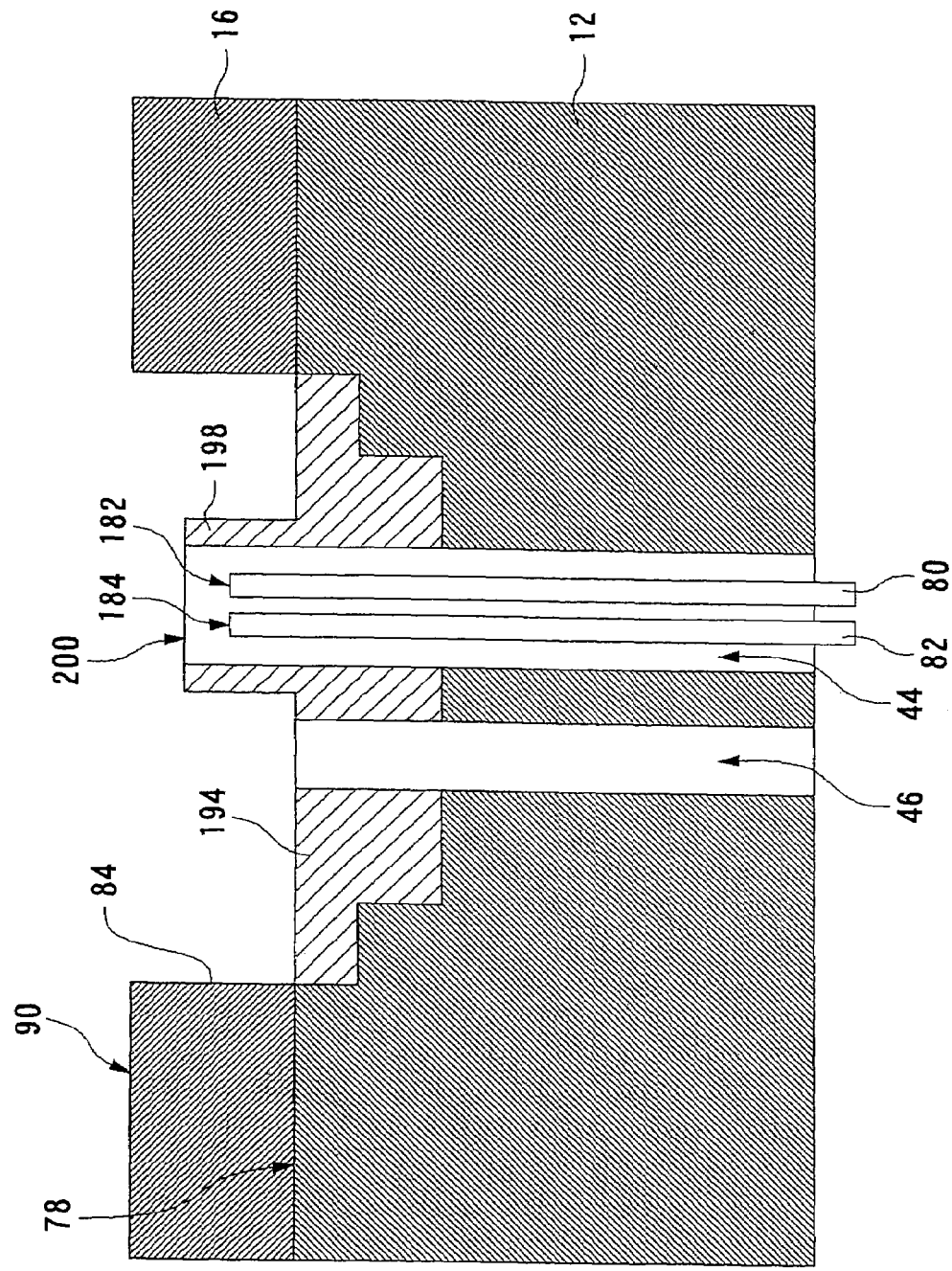
FIG. 22 is a view showing a structure of a modification of the substrate polishing apparatus when polishing a substrate according to the seventh embodiment of the present invention.

FIG. 22 is a view showing another modification of the substrate polishing apparatus 10 in a state of polishing the substrate 18 and measuring a film on the substrate 18. In this modification, a diameter of the through hole 84 formed in the polishing pad 16 is equal to a diameter of the patch piece 194. Accordingly, after the polishing pad 16 and the protection cover 190 attached thereto are replaced, the protection cover 190 can be replaced with the patch piece 194. With this structure, the polishing pad 16 can be easily positioned by the protection cover 190 when the polishing pad 16 is attached.

Figure 23:
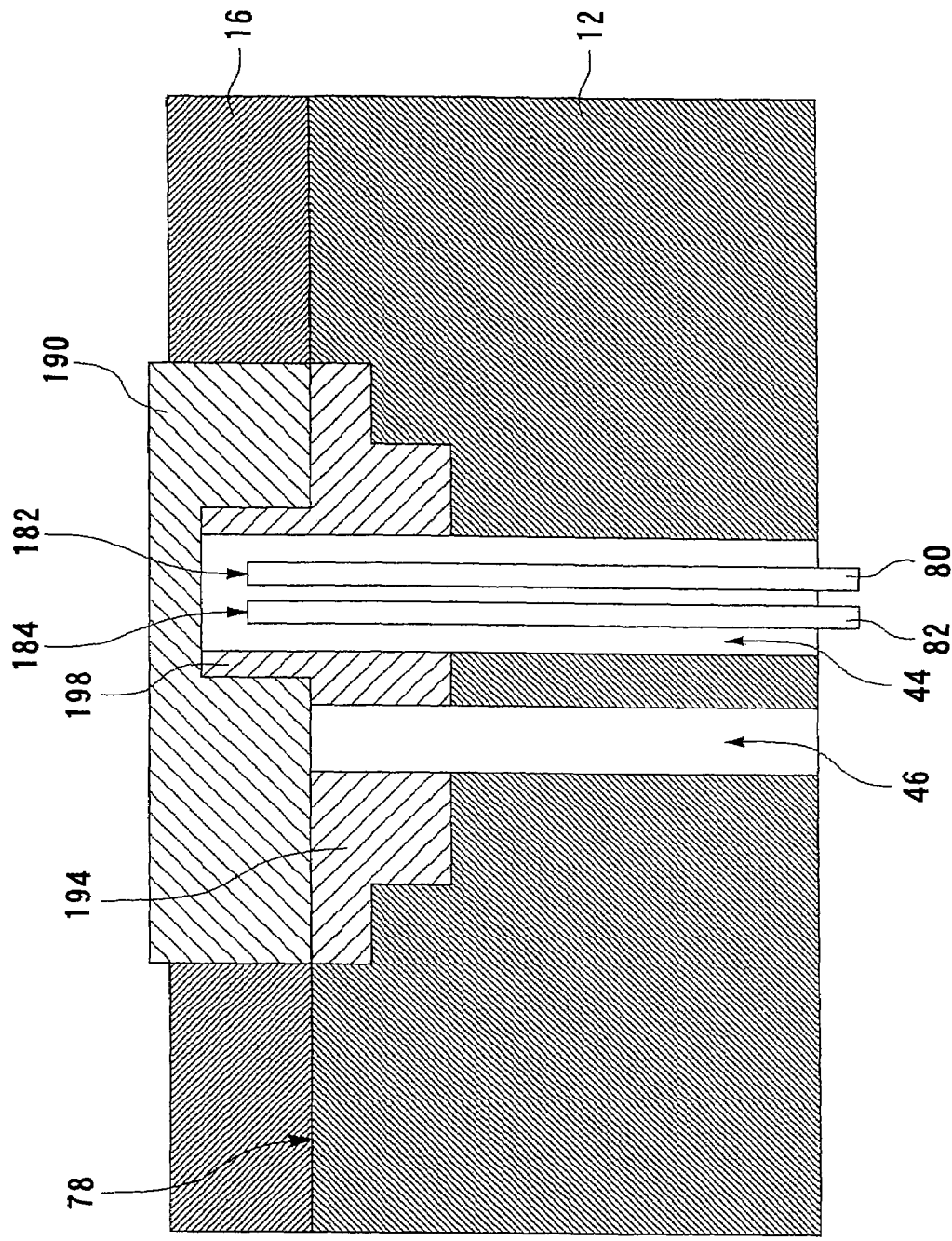
FIG. 23 is a view illustrating the substrate polishing apparatus having a protection cover of another structure.

FIG. 23 is a view showing the substrate polishing apparatus 10 having a protection cover of another structure. A protection cover 190 has a recess in which the tube portion 198 of the patch piece 194 is fitted. The protection cover 190 is mounted on the rotatable table 12 by fitting the tube portion 198 into the recess.

With this structure, the polishing pad 16 is attached to the rotatable table 12 in the following manner. First, the tube portion 198 is fitted into the recess of the protection cover 190, 50 that the protection cover 190 is mounted on the rotatable table 12. The position of the protection cover 190 on the rotatable table 12 is thus determined. Then, the polishing pad 16 is attached such that the protection cover 190 is fitted into the through hole 84. In this manner, the polishing pad 16 is positioned and attached to the rotatable table 12.

With this modification, the protection cover 190 has a function for protecting the light-emitting optical fiber 80 and the light-receiving optical fiber 82 disposed in the tube portion 198 and the supply passage 44, and also has a function for positioning the polishing pad 16 with respect to the rotatable table 12. Further, when the mounting operation of the polishing pad 16 is completed, the patch piece 194 having the tube portion 198 has been mounted. Therefore, when the protection cover 190 is removed, a film on the substrate 18 can be measured immediately.

Figure 24:
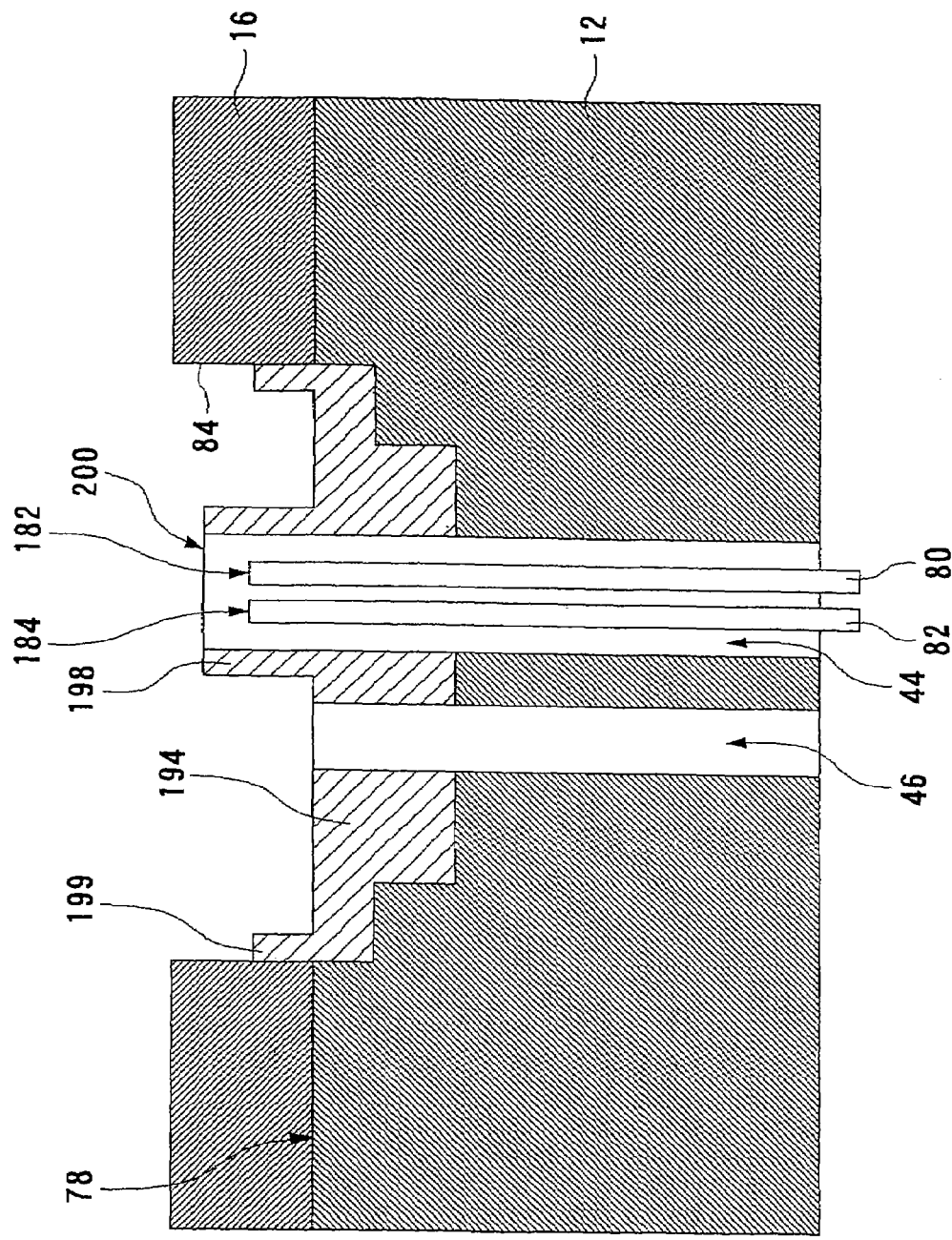
FIG. 24 is a view illustrating the substrate polishing apparatus having a patch piece of another structure.

FIG. 24 is a view showing the substrate polishing apparatus 10 having a patch piece 194 capable of positioning the polishing pad 16. As shown in FIG. 24, the patch piece 194 has a guide protrusion 199 for guiding the through hole 84. The guide protrusion 199 projects from the rotatable table 12 and an outer circumferential surface of the guide protrusion 199 is held in contact with the inner circumferential surface of the through hole 84.

With this structure, the polishing pad 16 can be positioned by installing the polishing pad 16 such that the guide protrusion 199 is fitted in the through hole 84.

When the substrate 18 is polished in the above embodiment, the patch piece 194 may not necessarily be mounted on a portion from which the protection cover 190 has been removed. For example, the cylindrical pipe piece 86 in the first embodiment described above may be employed. The protection cover 190 according to the present embodiment may be used when the polishing pad 16 is replaced in any of the substrate polishing apparatus 10 according to the other embodiments.

FIGS. 25A and 25B are views showing a substrate polishing apparatus 10 according to an eighth embodiment of the present invention. FIG. 25B shows a measuring area of the rotatable table 12 at an enlarged scale, and FIG. 25A shows the measuring area shown in FIG. 25B as viewed from above.

The discharge passage 46, the supply passage 44, and an auxiliary supply passage 202 are disposed in parallel to each other in the rotatable table 12. The polishing pad 16 has the through hole 84 formed therein, and the discharge passage 46, the supply passage 44, and the auxiliary supply passage 202 communicate with the through hole 84. The supply passage 44 accommodates therein the light-emitting optical fiber 80 and the light-receiving optical fiber 82 extending in parallel to each other. The auxiliary supply passage 202 is positioned at a forward of the supply passage 44 in the rotating direction of the rotatable table 12. The rotating direction of the rotatable table 12 is indicated by the arrow R. The auxiliary supply passage 202 is formed by branching the supply passage 44 at a position between the parallel section 52 and the sensor 26 shown in FIG. 1. Supply and stop of pure water to the supply passage 44 and the auxiliary supply passage 202 are controlled by the supply control valves 58, 60 at the same timing as each other.

In the substrate polishing apparatus 10, the measurement fluid such as pure water is supplied through the supply passage 44 and the auxiliary supply passage 202 into the through hole 84, and is discharged through the discharge passage 46. The through hole 84 is filled with the pure water for measurement, thus preventing the polishing slurry from entering the through hole 84.

The function of the auxiliary supply passage 202 will be described below. When the rotatable table 12 is rotated, the slurry on the polishing pad 16 moves relatively in a direction opposite to the rotating direction of the rotatable table 12. Specifically, the slurry moves in the direction indicated by the arrow S in FIG. 25B. Therefore, the slurry tends to flow into the through hole 84 from the forward in the rotating direction of the rotatable table 12. Since the auxiliary supply passage 202 is positioned at the forward of the supply passage 44 in the rotating direction of the rotatable table 12, the slurry flowing into the through hole 84 from the forward in the rotating direction is primarily diluted by the pure water supplied from the auxiliary supply passage 202. The primarily diluted slurry flows backward in the rotating direction of the rotatable table 12, and is then secondarily diluted by the pure water supplied from the supply passage 44. The supply passage 44 accommodates therein the light-emitting optical fiber 80 and the light-receiving optical fiber 82, and the measuring area is located above the supply passage 44. When the slurry reaches the measuring area, the slurry is diluted by the pure water supplied from the auxiliary supply passage 202, and is further diluted by the pure water supplied from the supply passage 44. As a result, the transparency of the pure water in the measuring area can be increased, and hence a film can be measured with increased accuracy.

Figures 26A, 26B:
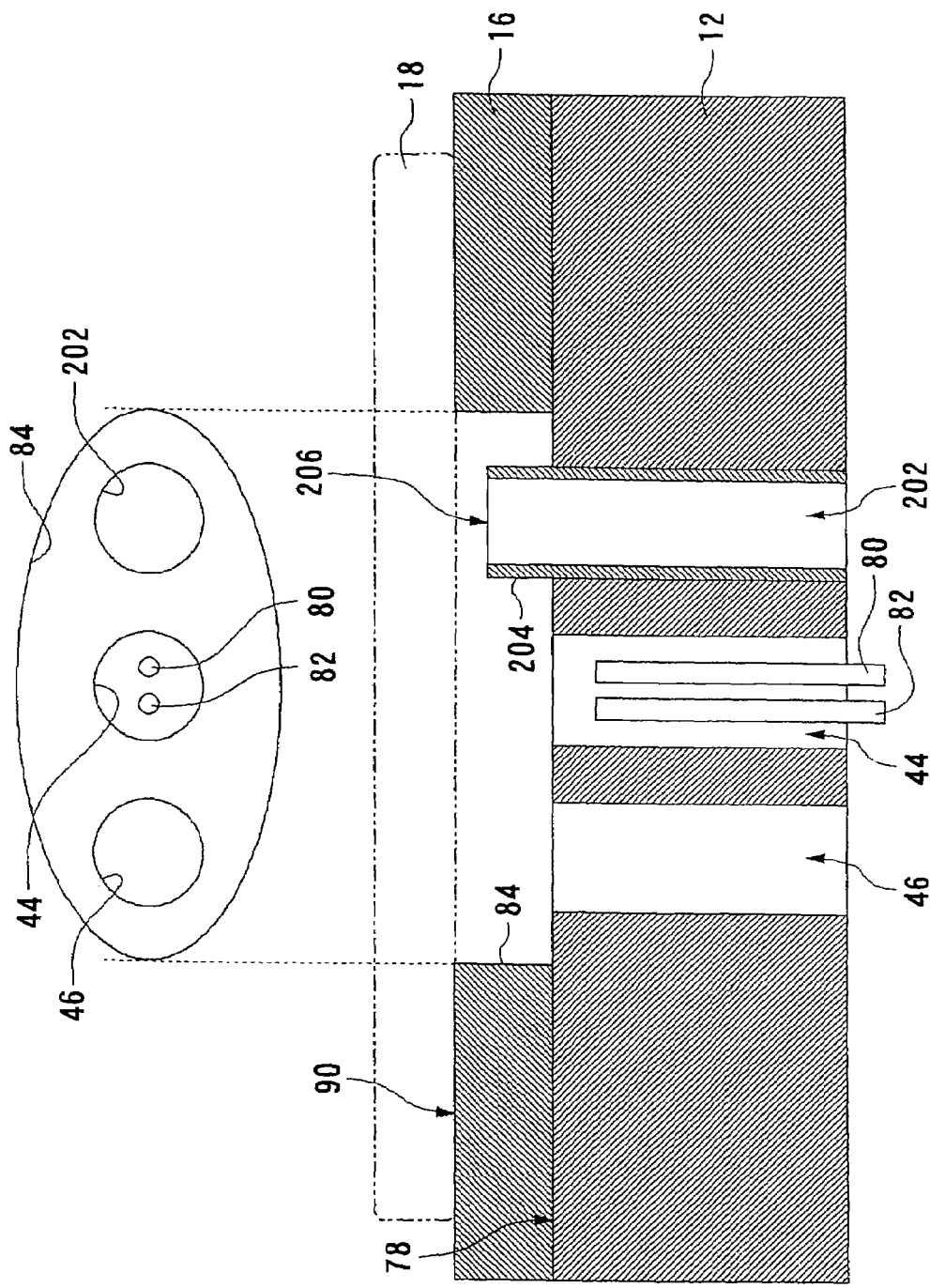
FIGS. 26A and 26B are views showing a first modification of the substrate polishing apparatus according to the eighth embodiment of the present invention.

FIGS. 26A and 26B are views showing a first modification of the above embodiment. The first modification has the same basic structure as the above embodiment, but is different in that a pipe piece 204 is disposed in the auxiliary supply passage 202. The pipe piece 204 comprises a cylindrical member extending along the auxiliary supply passage 202, and extends from the inside of the rotatable table 12 to a position upward of the rotatable table 12. The pipe piece 204 has an outlet 206 positioned in the through hole 84. Therefore, a flow velocity of pure water supplied from the auxiliary supply passage 202 is increased at the outlet 206, and hence the pure water is vigorously ejected from the gap between the substrate 18 and the outlet 206 toward the outside of the auxiliary supply passage 202, thus forming a flow of pure water along the substrate 18. The flow of the pure water can restrict the entry of the slurry from the forward in the rotating direction of the rotatable table 12, and can also dilute the slurry effectively.

Figure 27A:
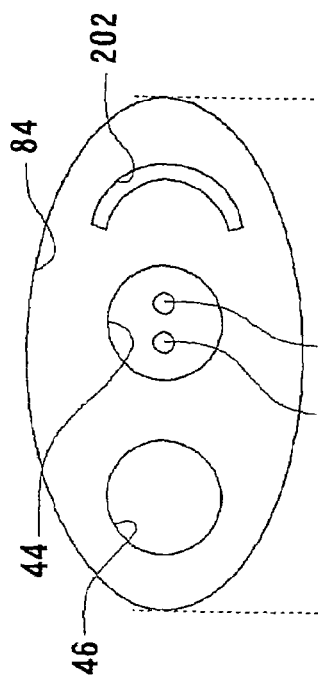
FIGS. 27A and 27B are views showing a second modification of the substrate polishing apparatus according to the eighth embodiment of the present invention.
Figure 27B:
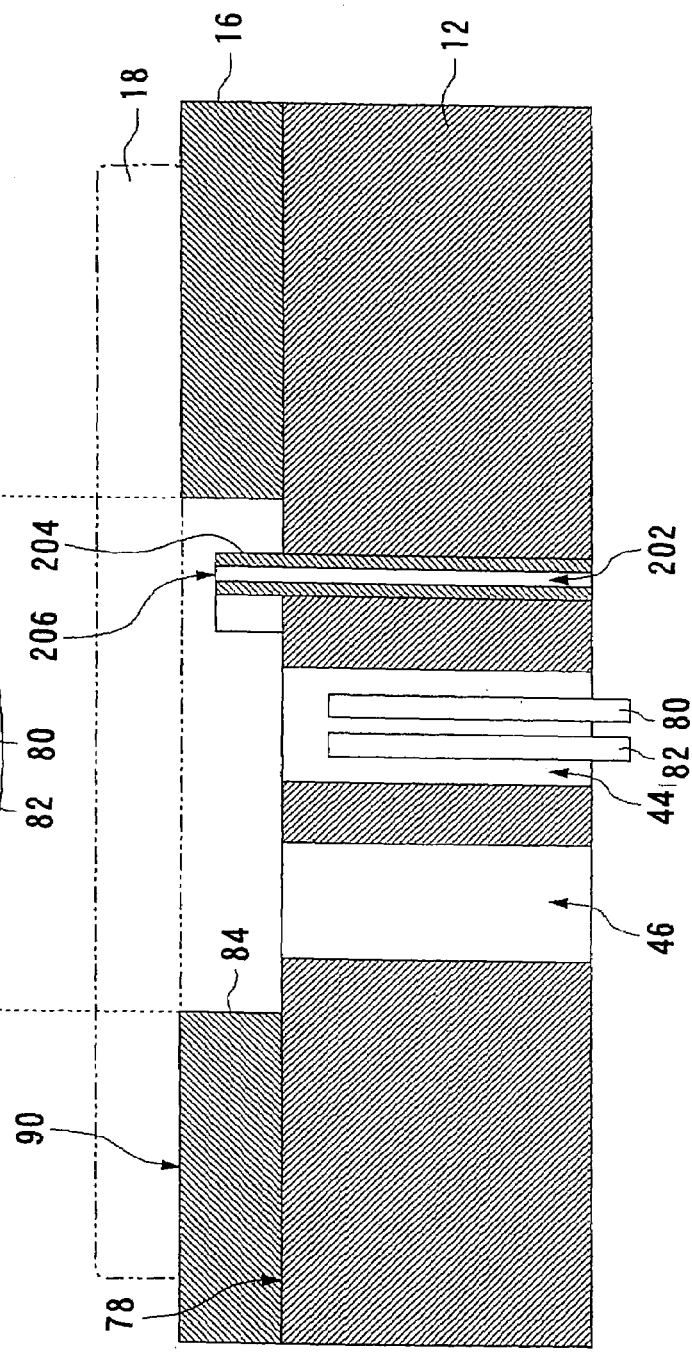

FIGS. 27A and 27B are views showing a second modification of the above embodiment. In the second modification, the auxiliary supply passage 202 has an arcuate shape surrounding the supply passage 44. As with the first modification, the pipe piece 204 extends along the auxiliary supply passage 202, and the outlet 206 of the auxiliary supply passage 202 is positioned in the through hole 84. According to the second modification, since the auxiliary supply passage 202 has a shape surrounding the supply passage 44, the slurry flowing into the through hole 84 from the forward in the rotating direction toward the supply passage 44 can be primarily diluted. In addition thereto, the slurry flowing into the through hole 84 obliquely from the forward in the rotating direction of the rotatable table 12 can also be primarily diluted, thus increasing the transparency of the pure water in the measuring area.

FIGS. 28A and 28B are views showing a third modification of the above embodiment. The third modification has the same basic structure as the first modification, but is different in that the auxiliary supply passage 202 is smaller in size than the supply passage 44. The light-emitting optical fiber 80 and the light-receiving optical fiber 82 are not disposed in the auxiliary supply passage 202, and hence the auxiliary supply passage 202 can be small in size. Since the auxiliary supply passage 202 is small in size, a flow velocity of pure water supplied from the auxiliary supply passage 202 can be increased. The pure water flowing out of the auxiliary supply passage 202 forms a flow of the pure water along the substrate 18. The flow of the pure water can restrict the entry of the slurry from the forward in the rotating direction, and can also dilute the slurry effectively.

Figures 29A, 29B:
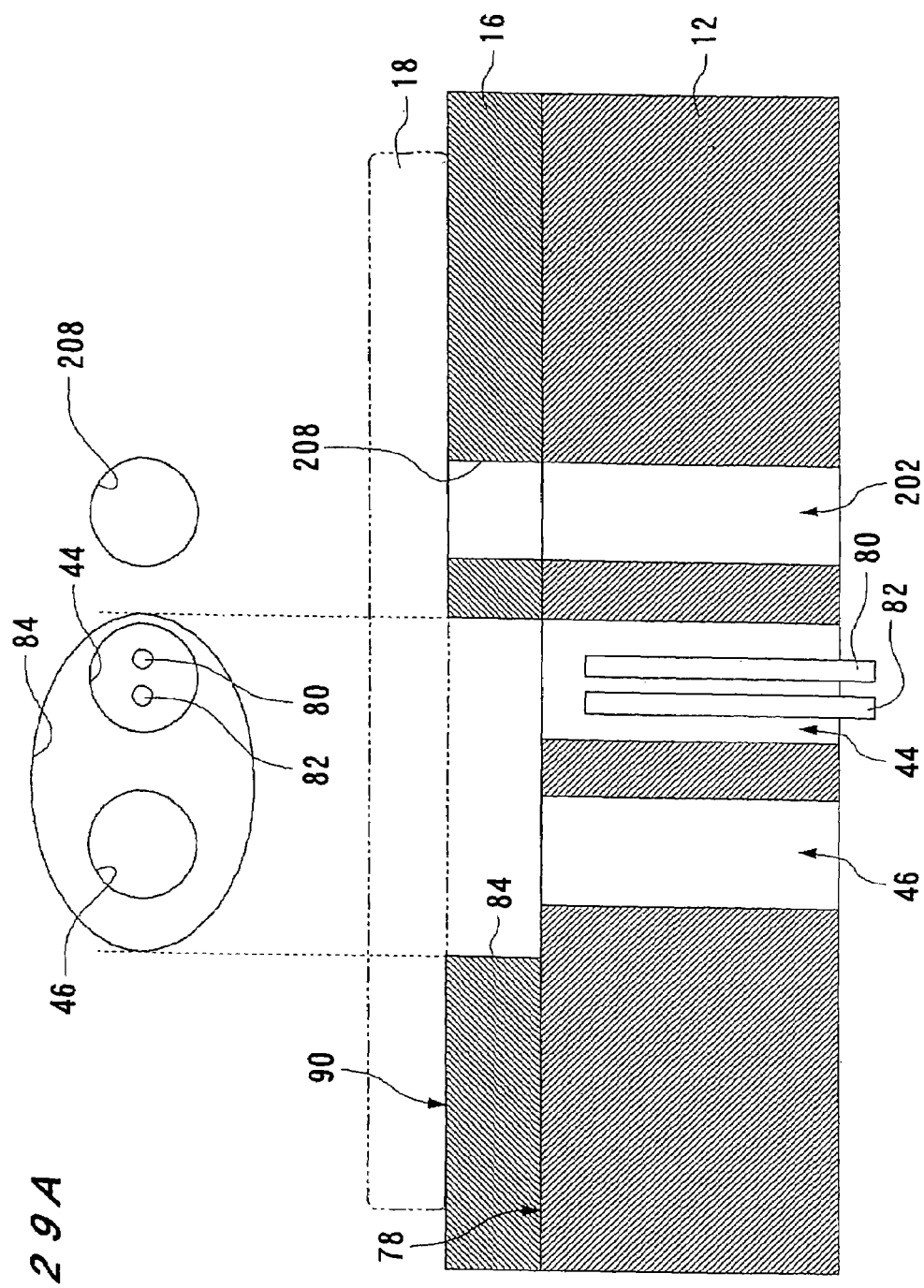
FIGS. 29A and 29B are views showing a fourth modification of the substrate polishing apparatus according to the eighth embodiment of the present invention.

FIGS. 29A and 29B are views showing a fourth modification of the above embodiment. The fourth modification has the same basic structure as the present embodiment, but is different in that the polishing pad 16 has a second through hole 208. The second through hole 208 is formed in a position aligned with the auxiliary supply passage 202, and pure water supplied from the auxiliary supply passage 202 flows into the second through hole 208. In this manner, even though the auxiliary supply passage 202 is aligned with the second through hole 208 which is different from the through hole 84, it is possible to effectively restrict the entry of the slurry from the forward in the rotating direction, and dilute the slurry effectively, as with the above embodiment.

Figures 30A, 30B:
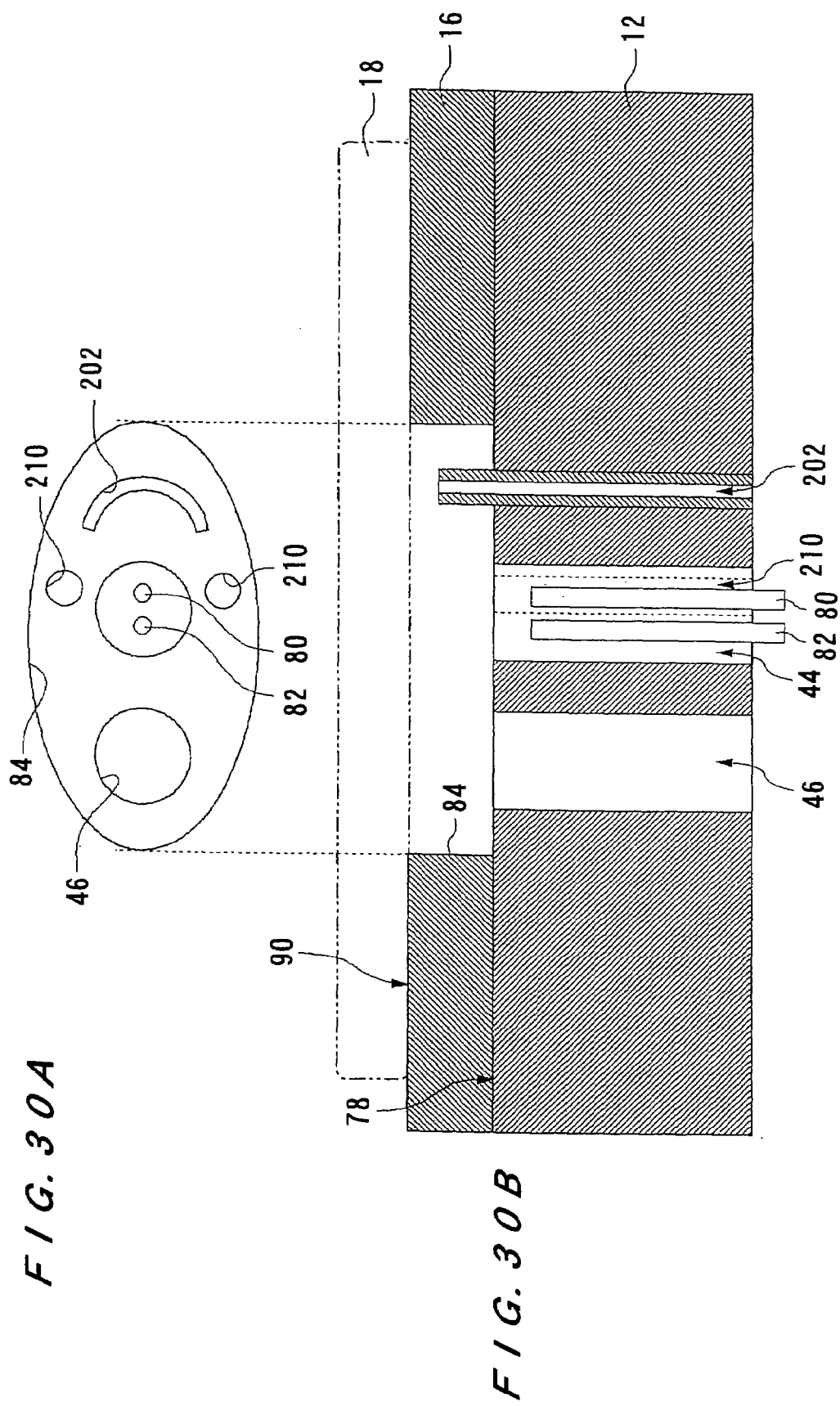
FIGS. 30A and 30B are views showing a fifth modification of the substrate polishing apparatus according to the eighth embodiment of the present invention.

FIGS. 30A and 30B are views showing a fifth modification of the above embodiment. The fifth modification has the same basic structure as the second modification, but is different in that the rotatable table 12 has two discharge passages 210 on each side of the supply passage 44, in addition to the structure of the second modification. With this structure, the slurry that has been diluted by the pure water from the auxiliary supply passage 202 can be discharged through the discharge passages 210, and hence the transparency of the pure water in the measuring area can be increased. The discharge passage 210 may be a groove or a hole formed in the surface of the polishing pad 16.

Although various modifications of the above embodiment have been described above, other modifications than those shown in FIGS. 26 through 30 may be made. For example, a pipe piece may be provided in the supply passage 44 for thereby bringing the outlet of the supply passage 44 closely to the substrate 18 so as to effectively remove the polishing abrasive from the area where measurement light is applied, as with the first embodiment. The polishing pad 16 may have an arcuate through hole 84 in alignment with the arcuate auxiliary supply passage 202 described in the second modification. The number, shape, and size of the auxiliary supply passages 202 may be changed as desired.

Figure 32:
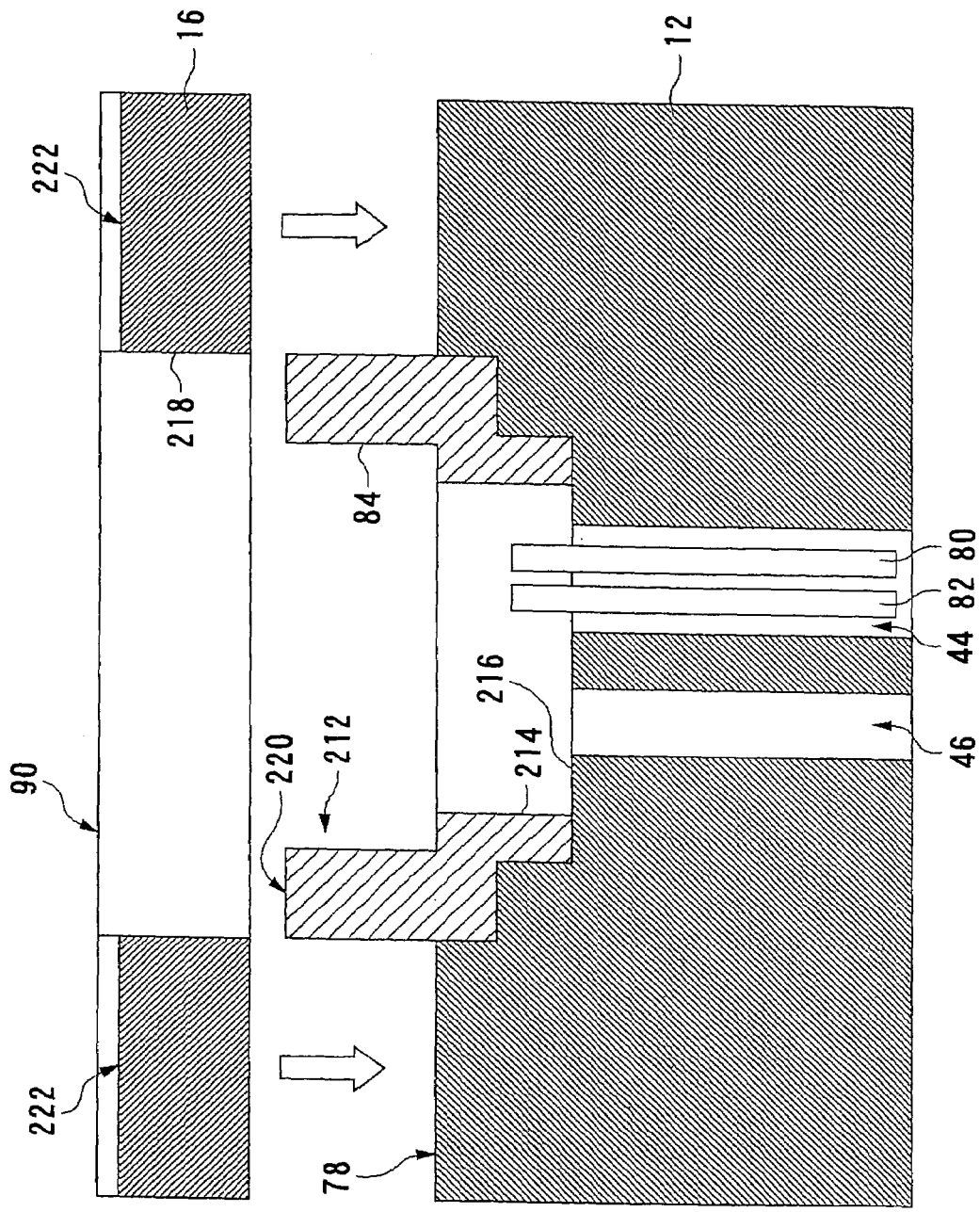
FIG. 32 is a view showing the manner of attaching the polishing pad which is incorporated in the substrate polishing apparatus according to the ninth embodiment of the present invention.

FIG. 31 is a perspective view showing a polishing pad 16 for use in a substrate polishing apparatus 10 according to a ninth embodiment, and FIG. 32 is a view showing a measuring area of the rotatable table 12 at an enlarged scale.

As shown in FIG. 31, the polishing pad 16 attached to the rotatable table 12 comprises a circular thin plate and is made of polyurethane or the like. A polishing pad piece 212 serving as part of the polishing pad 16 is fitted in the polishing pad 16.

The polishing pad piece 212 has a surface connected smoothly continuously to the surface of the polishing pad 16, and has a through hole 84 formed therein. The surface of the polishing pad piece 212 is flat. Specifically, the polishing pad piece 212 does not have a groove and a dimple, which are formed on the polishing pad 16. The polishing pad piece 212 is made of the same material as the polishing pad 16.

As shown in FIG. 32, the polishing pad piece 212 has a mounting protrusion 214 facing the rotatable table 12. The rotatable table 12 has a hole 216 for receiving the mounting protrusion 214 of the polishing pad piece 212 therein. The mounting protrusion 214 and the hole 216 of the rotatable table 12 constitute a fixing means for securing the polishing pad piece 212. With this structure, the polishing pad piece 212 can be easily attached as a cartridge to the rotatable table 12.

Figure 33:
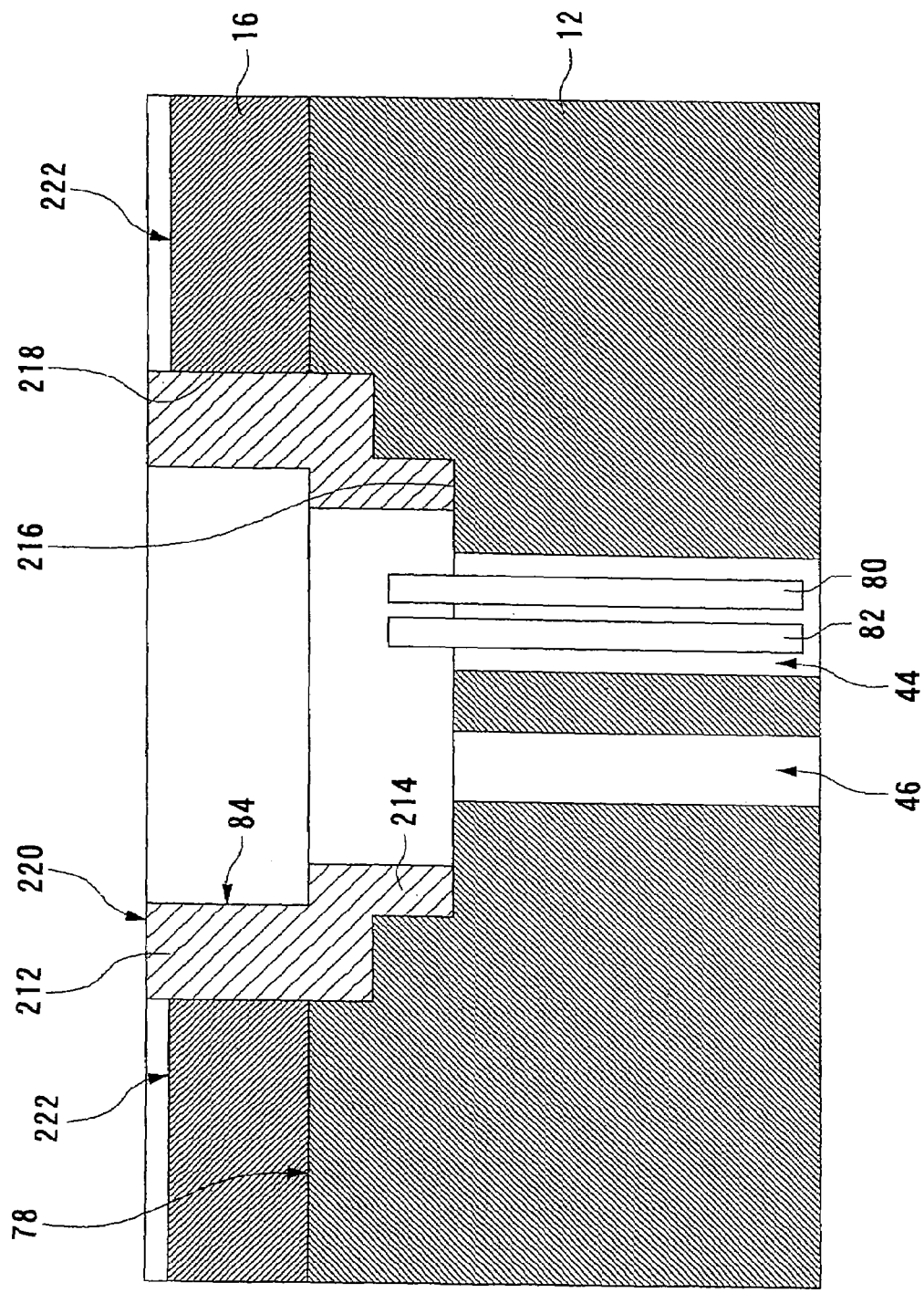
FIG. 33 is a view showing a structure of the substrate polishing apparatus according to the ninth embodiment of the present invention.

FIG. 33 is a view showing the state in which the polishing pad 16 is attached to the rotatable table 12. An operation of attaching the polishing pad 16 in the present embodiment will be described below with reference to FIGS. 31 and 32. As shown in FIG. 32, in order to attach the polishing pad 16 to the rotatable table 12, first, the polishing pad piece 212 is mounted on the rotatable table 12. The mounting protrusion 214 of the polishing pad piece 212 is fitted in the hole 216 formed in the rotatable table 12, so that the polishing pad piece 212 is mounted on the rotatable table 12. Then, as shown in FIG. 33, the polishing pad 16 is attached to the rotatable table 12 so that the polishing pad piece 212 is fitted into an opening 218 of the polishing pad 16.

Since the polishing pad piece 212 has a flat surface 220 having no groove and dimple, it is possible to restrict the entry of the slurry into the through hole 84. Specifically, as shown in FIG. 32, the polishing surface 90 of the polishing pad 16 has grooves 222 formed thereon for allowing the slurry and scraped particles to be washed out smoothly from the polishing surface 90. The slurry may flow through the grooves 222 into the through hole 84. The surface 220 of the polishing pad piece 212 having the through hole 84 is flat and does not have a groove which may serve as a passage for the slurry, and hence the slurry can hardly flow on the surface 220. Since the polishing pad piece 212 is made of the same material as the polishing pad 16, the polishing pad piece 212 does not cause damage to the substrate 18. Further, since the polishing pad piece 212 is worn at the same rate as the polishing pad 16, no step is formed between the polishing pad 16 and the polishing pad piece 212.

Furthermore, the polishing pad 16 can be easily positioned when attaching the polishing pad 16 by mounting the polishing pad piece 212 on the rotatable table 12 in advance.

According to the ninth embodiment, since the polishing pad piece 212 does not have a groove and a dimple which may serve as a passage for allowing the polishing abrasive to flow into the through hole 84, the amount of the slurry flowing into the through hole 84 can be reduced.

In the above embodiment, the polishing pad piece 212 is made of the same material as the polishing pad 16. Alternatively, the polishing pad piece 212 may be made of other material which is worn more easily than the polishing pad 16. The polishing pad piece 212 may not have a polishing function.

Figure 34:
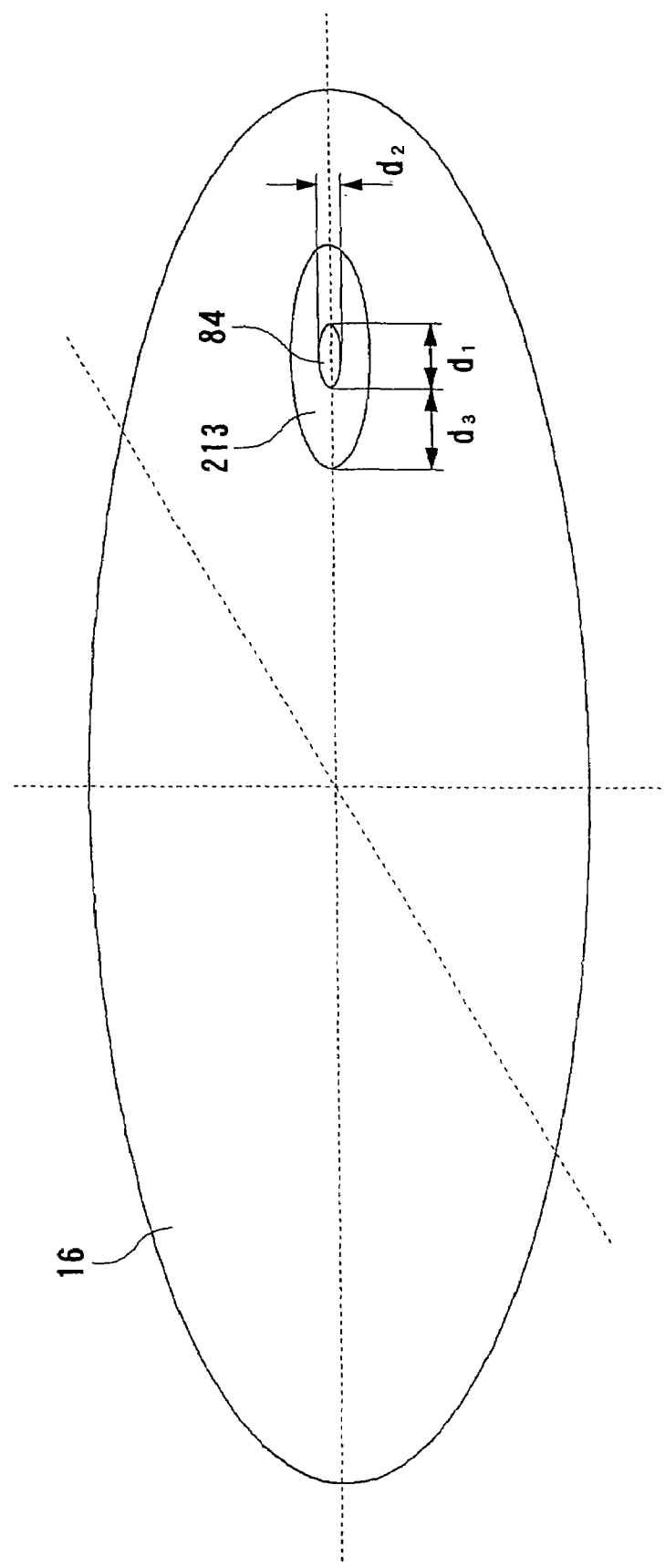
FIG. 34 is a view showing a polishing pad used in a substrate polishing apparatus according to a tenth embodiment of the present invention.

FIG. 34 is a view showing a polishing pad 16 for use in a substrate polishing apparatus 10 according to a tenth embodiment. The polishing pad 16 has a portion as a flat surface 213 having no groove and dimple thereon, and a through hole 84 is formed in the flat surface 213. The size of the flat surface 213 and the size of the through hole 84 are determined in consideration of a processing condition which includes a type of slurry, a flow rate of the slurry, a rotational speed of the rotatable table, a processing pressure, a supply flow rate of the measurement fluid, a discharge flow rate of the measurement fluid, the number of the through holes 84, and an arrangement of the through holes 84. In this embodiment, the through hole 84 having an elliptical shape is formed in the flat surface 213. The through hole 84 has a major axis d1 ranging from 2 to 10 mm and a minor axis d2 ranging from 1 to 5 mm. A distance d3 between an outer circumferential edge of the through hole 84 and an outer circumferential edge of the flat surface 213 is 30 mm or less. Preferably, the major axis d1 of the through hole 84 ranges from 3 to 8 mm, the minor axis d2 of the through hole 84 ranges from 2 to 4 mm, and the distance d3 between the outer circumferential edge of the through hole 84 and the outer circumferential edge of the flat surface 213 is 10 mm or less. More preferably, the major axis d1 of the through hole 84 ranges from 4 to 6 mm, the minor axis d2 of the through hole 84 ranges from 2.5 to 3.5 mm, and the distance d3 between the outer circumferential edge of the through hole 84 and the outer circumferential edge of the flat surface 213 is 3 mm or less.

Figure 35A:
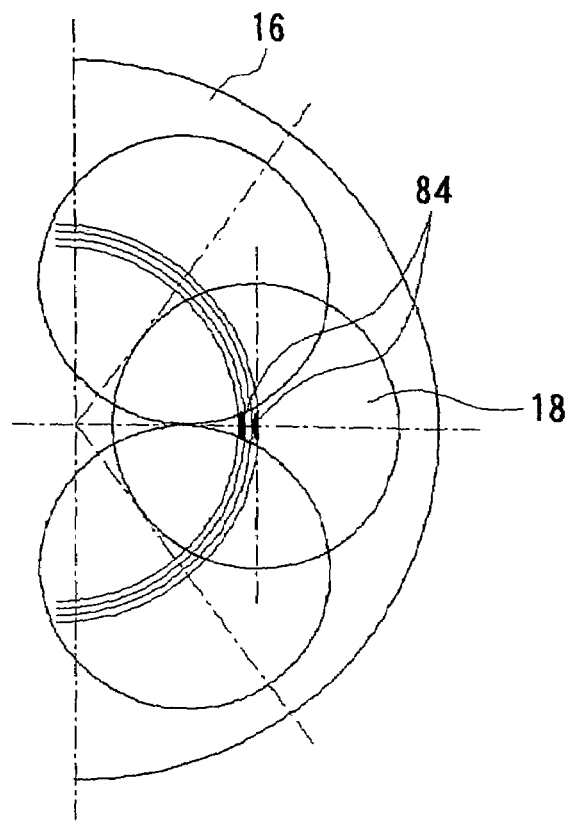
FIG. 35A is a view showing orbits of a through hole traced with the rotation of a rotatable table and positions of a substrate.
Figure 35B:
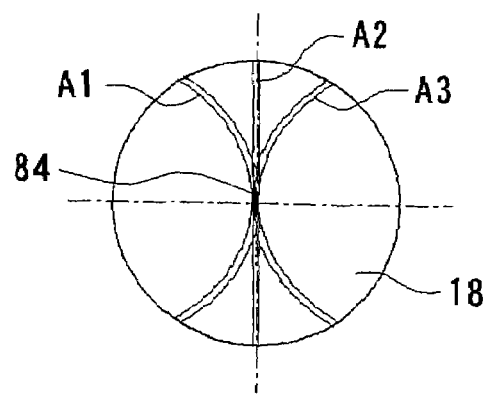
FIG. 35B is a view showing orbits of the through hole when rotational speeds of the rotatable table and the substrate are changed.
Figure 35C:
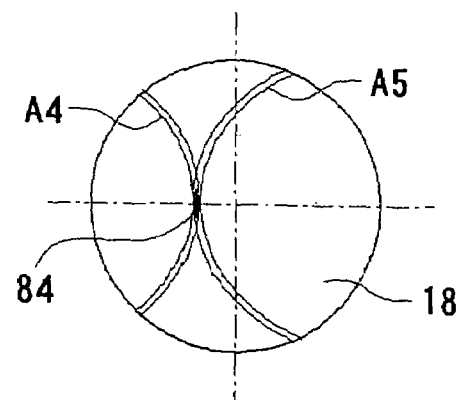
FIG. 35C is a view showing orbits of the through hole according to the present embodiment.

The through hole 84 is disposed in such a position that the through hole 84 is not aligned with the center of rotation of the substrate 18 when the rotatable table 12 is rotated. FIG. 35A is a view showing the substrate 18 and orbits of the through hole 84 traced by the rotation of the rotatable table 12. FIG. 35B is a view showing orbits of the through hole 84 traced on the substrate 18 when rotational speeds of the rotatable table 12 and the substrate 18 are changed. FIG. 35C is a view showing orbits of the through hole 84 traced on the substrate 18 in the present embodiment. FIGS. 35B and 35C show the cases on the assumption that a distance from a center of rotation of the substrate 18 to a center of the rotatable table 12 is substantially equal to a radius of the substrate 18.

First, there will be described the manner in which the orbit of the through hole 84 traced on the substrate 18 is changed depending on the rotational speed of the rotatable table 12 and the rotational speed of the substrate 18 with reference to FIG. 35B. When the substrate 18 is not rotated, the through hole 84 traces an orbit A1. When the substrate 18 is rotated at the rotational speed which is one-half of the rotational speed of the rotatable table 12, the through hole 84 traces an orbit A2. When the rotational speeds of the substrate 18 and the rotatable table 12 are equal to each other, the through hole 84 traces an orbit A3. In this manner, the orbit of the through hole 84 traced on the substrate 18 varies depending on the rotational speeds. Under a general polishing condition, since the rotational speeds of the substrate 18 and the rotatable table 12 are equal to each other, the through hole 84 traces the orbit A3. In this case, a profile of the right half of the substrate can be obtained, but a profile of the left half of the substrate cannot be obtained.

As shown in FIG. 35B, if the orbit of the through hole 84 and the center of rotation of the substrate 18 overlap each other, then polishing irregularities are liable to occur in the vicinity of the center of rotation of the substrate 18. Consequently, it is preferable to set the position of the through hole 84 such that the orbit of the through hole 84 and the center of rotation of the substrate 18 are deviated from each other. The degree in which the through hole 82 is deviated from the center of rotation of the substrate 18 is determined based on the processing condition. It is possible to reduce the polishing irregularities by setting the rotational speed of the rotatable table 12 and the rotational speed of the substrate 18 to different values.

In the present embodiment, the through hole 84 is disposed at a position closer to the rotatable table 12 than to the center of rotation of the substrate 18. Accordingly, as shown in FIG. 35C, when the substrate 18 is not rotated, the through hole 84 traces an orbit A4 on the substrate 18, and when the substrate 18 is rotated at the same rotational speed as the rotatable table 12, the through hole 84 traces an orbit A5. Under the general polishing condition, since the through hole 84 traces the orbit A5, it is possible to obtain not only a profile of the right half of the substrate 18, but also a profile of the left half of the substrate 18. The position where the through hole 84 is disposed has been described above.

In the present embodiment, an area around the through hole 84 comprises the flat surface 213 which does not have a groove and a dimple which may serve as a passage for the slurry. Thus, the flat surface 213 can prevent the slurry from flowing into the through hole 84, and hence a film on the substrate 18 can be measured highly accurately with use of measurement light. The polishing pad 16 has grooves or dimples on an area other than the area around the through hole 84, thereby allowing the slurry to be supplied and discharged efficiently.

Because the center of rotation of the substrate 18 is deviated from the circular orbit of the through hole 84 traced by the rotation of the rotatable table 12, it is possible to reduce the polishing irregularities formed on the polished substrate 18. Further, since the through hole 84 is deviated from the center of rotation of the substrate 18 toward the center of the rotatable table 12, it is possible to increase an area where the profile can be obtained under the general polishing condition.

Figure 36:
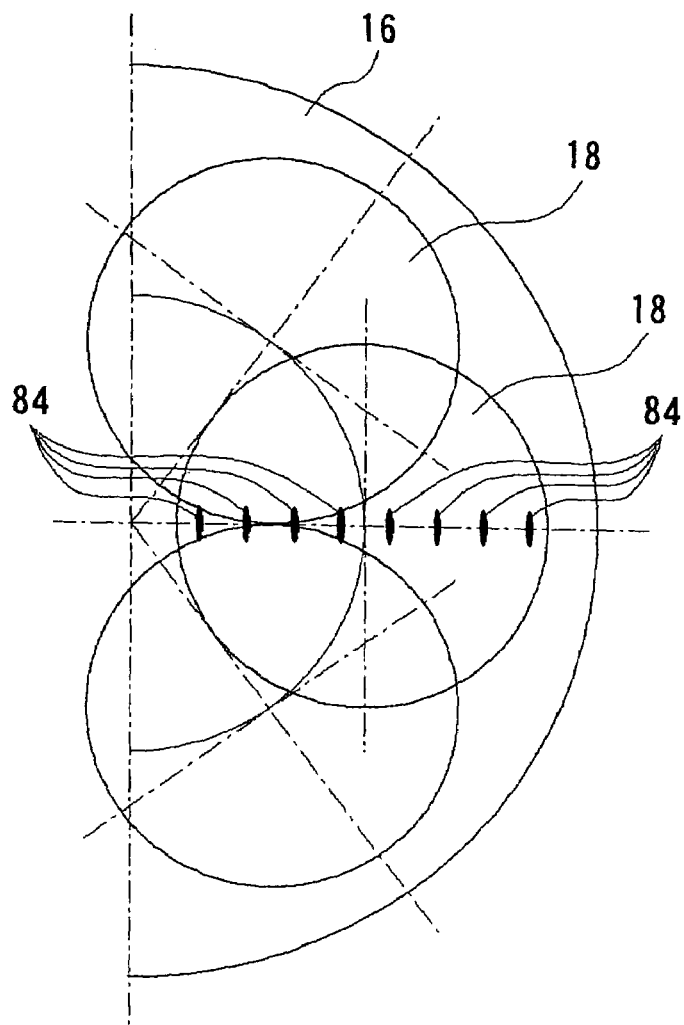
FIG. 36 is a view showing a modification of the tenth embodiment of the present invention.

FIG. 36 is a view showing a modification of the tenth embodiment. In this modification, a plurality of through holes 84 are formed in one flat surface 213. Specifically, eight through holes 84 are disposed at equal intervals in the radial direction of the substrate 18 across the center of rotation of the substrate 18.

With this structure, a profile along the radial direction of the substrate 18 can be measured by applying measurement light to the substrate 18 through each of the through holes 84 so as to measure the film on the substrate 18. Since the through holes 84 are disposed across the center of rotation, the polishing irregularities can be reduced.

In the case where an odd number of the through holes 84 are provided in the polishing pad 16, it is preferable to dispose the through holes 84 at positions including the center of rotation at equal intervals in view of measuring a profile of the substrate 18.

A substrate polishing apparatus 10 according to an eleventh embodiment of the present invention has the same structure as the substrate polishing apparatus 10 (see FIG. 4) according to the first embodiment, but is different in that an inner circumferential surface of the polishing pad 16 has a water repellency.

Figure 37:
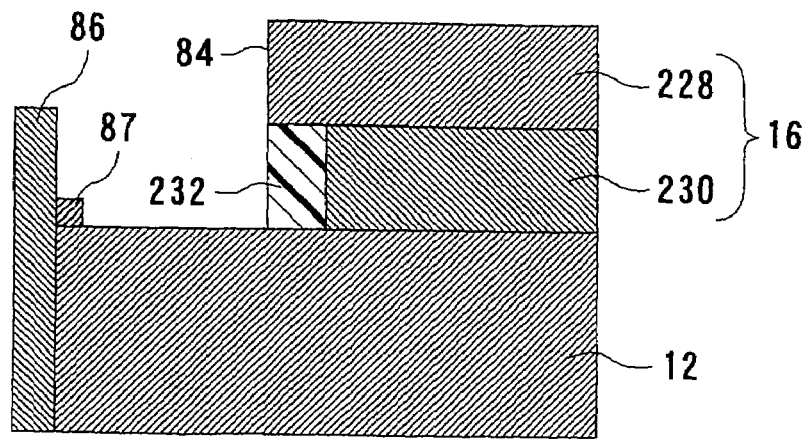
FIG. 37 is a view showing a polishing pad used in a substrate polishing apparatus according to an eleventh embodiment of the present invention.

FIG. 37 is a view showing the polishing pad 16 near a through hole 84 at an enlarged scale in the eleventh embodiment. The polishing pad 16 has a two-layer structure comprising a surface layer pad 228 and a lower layer pad 230. The surface layer pad 228 is made of a closed-cell resin having a water repellency, e.g., IC1000 (trade name) manufactured by Rodel, Inc. The lower layer pad 230 is made of a non-woven fabric material having water absorption, e.g., SUBA400 (trade name) manufactured by Rodel, Inc. A portion of the lower layer pad 230 which is exposed in the through hole 84 is covered by a resin coating 232 for repelling water.

With this structure, the pure water supplied to the through hole 84 hardly seeps into the polishing pad 16, thereby suppressing the property change of the polishing pad 16 to reduce the change in the polishing characteristics of the polishing pad 16.

Figure 38:
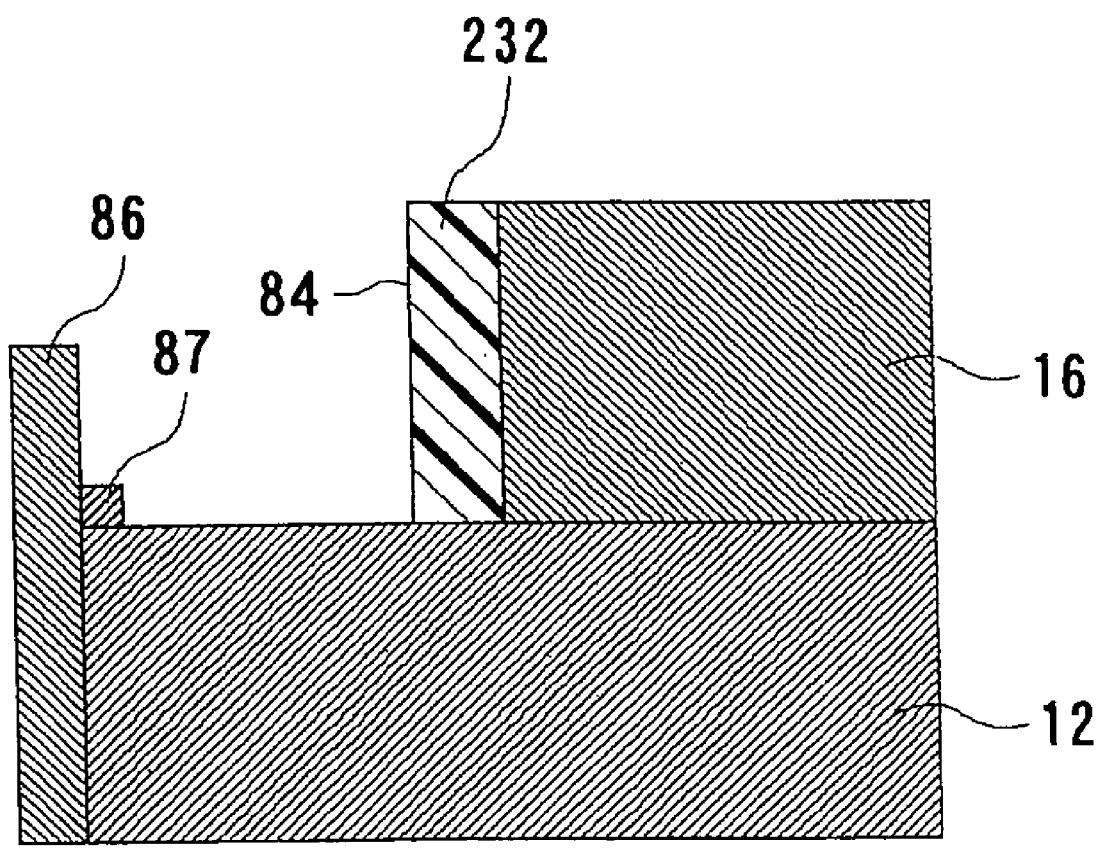
FIG. 38 is a view showing a polishing pad used in a modification of the substrate polishing apparatus according to the eleventh embodiment of the present invention.

FIG. 38 is a view showing the polishing pad 16 near the through hole 84 at an enlarged scale according to a modification of the eleventh embodiment. The polishing pad 16 is a single-layer pad and is made of a water-absorbent material, e.g., SUBA400 (trade name) or SUBA800 (trade name) manufactured by Rodel, Inc. The inner circumferential surface of the through hole 84 is covered by a resin coating 232 for repelling water.

With this structure, the pure water supplied to the through hole 84 hardly seeps into the polishing pad 16, thereby reducing the change in the polishing characteristics of the polishing pad 16, as with the eleventh embodiment.

In the present embodiment, the inner circumferential surface of the through hole 84 has the resin coating 232 for allowing the inner surface of the through hole 84 to be water repellent. However, insofar as the inner circumferential surface of the through hole 84 has a water repellency, a means for producing a water repellency is not limited to the resin coating in the present invention. For example, the polishing pad 16 may be made of a water-repellent material. Alternatively, a collar made of a water-repellent material may be mounted in the through hole 84.

In the present embodiment, although the inner circumferential surface of the through hole 84 has a water repellency, it is preferable that the outer circumferential surface of the polishing pad 16 also has a water repellency for the following reasons:

The slurry supplied as a polishing abrasive to the polishing pad 16 flows outwardly on the polishing pad 16, and further flows on the outer circumferential surface and then drops from the polishing pad 16. Generally, the polishing pad 16 has a surface layer made of a highly water-repellent material so as to prevent the slurry from seeping into the polishing pad 16. However, the polishing pad 16 may have a water-absorbent material exposed on the outer circumferential surface thereof. For example, the two-layer polishing pad has a surface layer pad made of a highly water-repellent material and a lower layer pad made of a water-absorbent material. With the two-layer polishing pad, the lower layer pad which is water-absorbent is exposed on the outer circumferential surface thereof. If the slurry seeps into the water-absorbent material on the outer circumferential surface, the polishing characteristics of the polishing pad 16 tend to change. In order to prevent such a trouble, it is preferable to make the outer circumferential surface water repellent. The slurry is thus prevented from seeping into the outer circumferential surface of the polishing pad 16, thereby reducing the property change of the polishing pad 16.

A substrate polishing apparatus 10 according to a twelfth embodiment of the present invention has the same structure as the substrate polishing apparatus 10 according to the first embodiment, but is different in that the pipe piece 86 is made of a soft material whose softness is substantially the same as or higher than that of the polishing pad 16.

Since the pipe piece 86 is made of a soft material whose softness is substantially the same as or higher than that of the polishing pad 16, the substrate 18 is not damaged even when the pipe piece 86 is brought into contact with the substrate 18. Therefore, the outlet portion can be positioned closer to the substrate 18, and the outlet 88 can be positioned substantially in the same plane as the polishing surface 90. The pipe piece 86 and the polishing pad 16 may be dressed together, and the pipe piece 86 may be adjusted in vertical position together with the polishing pad 16 for thereby easily positioning the outlet 88 substantially in the same plane as the polishing surface 90.

FIG. 39 is a view showing a modification of the twelfth embodiment. In this modification, a cap 224 made of a soft material whose softness is substantially the same as or higher than that of the polishing pad 16 is mounted on the pipe piece 86. The cap 224 serves as an outlet portion, and an outlet 226 as an end portion of the cap 224 serves as a supply port of the measurement fluid to be supplied through the supply passage 44 into the through hole 84. The substrate 18 is not damaged even when the cap 224 made of a soft material is brought into contact with the substrate 18. The cap 224 allows the outlet 226 to be positioned closer to the substrate 18, thus increasing the ability to remove the polishing abrasive from the area where measurement light is applied, which is located in front of the outlet portion.

In the twelfth embodiment, the pipe piece 86 may be made of the same material as the polishing pad 16. With this structure, since the substrate 18 is not damaged even when the pipe piece 86 is brought into contact with the substrate 18, as with the twelfth embodiment, the outlet portion may be positioned much closer to the substrate 18.

A substrate polishing apparatus 10 according to a thirteenth embodiment of the present invention has the same structure as the substrate polishing apparatus 10 according to the first embodiment, but is different in that the pipe piece 86 serving as the outlet portion is made of a material whose elastic modulus is larger than that of the polishing pad 16.

With this structure, the vertical position of the outlet portion can be adjusted by setting a dressing pressure to be higher than a polishing pressure as described below. Specifically, the substrate polishing apparatus 10 dresses the outlet portion together with the polishing pad 16. Since the elastic modulus of the outlet portion is larger than the elastic modulus of the polishing pad 16, when the dressing process is finished and the pressure applied during the dressing process is released, the polishing pad 16 extends such that the expansion of the polishing pad 16 is greater than that of the outlet portion. Therefore, when the dressing process is finished, the outlet portion is retracted into the through hole 84 of the polishing pad 16. In the substrate polishing apparatus 10, the polishing pressure is set to be smaller than the dressing pressure. Consequently, when the substrate 18 is polished, the outlet portion does not project from the polishing surface 90. Specifically, the outlet portion is positioned in the through hole 84 of the polishing pad 16 and does not obstruct the polishing process.

A substrate polishing apparatus 10 according to a fourteenth embodiment of the present invention has the same structure as the substrate polishing apparatus 10 according to the first embodiment, but is different in that the supply passage 44 has a mirror inner surface. Although the supply passage 44 may have the mirror inner surface throughout its entire length, it is preferable that the supply passage 44 has the mirror inner surface only in the vicinity of the outlet 88 of the supply passage 44. For example, the pipe piece 86 serving as the outlet portion may have the mirror inner surface. The mirror inner surface is effective to suppress the absorption of light in the supply passage 44, and hence the attenuation of measurement light and reflected light can be reduced. Accordingly, the amount of the reflected light that is received is increased, thus increasing the S/N ratio.

A substrate polishing apparatus 10 according to a fifteenth embodiment of the present invention has the same structure as the substrate polishing apparatus 10 according to the first embodiment, but is different in that the supply passage 44 has a nonreflective inner surface. Although the supply passage 44 may have the nonreflective inner surface throughout its entire length, it is preferable that the supply passage 44 has the nonreflective inner surface only in the vicinity of the outlet 88 of the supply passage 44. For example, the pipe piece 86 serving as the outlet portion may have the nonreflective inner surface. The nonreflective inner surface is effective to suppress the reflection of light in the supply passage 44, and hence wavelength shift due to reflection on the inner surface of the supply passage 44 can be reduced. Accordingly, in the case where a film on the substrate 18 is measured based on the wavelength shift, the nonreflective inner surface can increase the S/N ratio.

Although several embodiments of the substrate polishing apparatus according to the present invention have been described above in detail, the present invention is not limited to the above embodiments.

According to the present invention, since the outlet portion of the supply passage is positioned in the through hole of the polishing pad, the outlet portion of the supply passage is close to the substrate. Therefore, the flow velocity of the fluid supplied from the supply passage is increased at the outlet portion, and the fluid is vigorously ejected from the gap between the substrate and the outlet portion toward the outside of the supply passage, thus forming a flow along the substrate. The flow of the fluid can effectively remove the polishing abrasive from the area where measurement light is applied, which is located in front of the outlet portion.

The entire structures of the substrate polishing apparatus 10 according to the embodiments have been described above together with the structure of the sensor 26. Features of the embodiments will be described below.

In the substrate polishing apparatus 10 shown in FIG. 1, the light source component of the light source unit 32 is an expendable component. In the present embodiment, the light source component comprises a lamp. If the light source unit 32 comprises a halogen lamp, then the lamp has a service life of about four months. However, the service life of the lamp differs depending on the type thereof and condition under which the lamp is used. Within the scope of the present invention, the lamp is not limited to a halogen lamp. For example, a xenon flash lamp may be used. Within the scope of the present invention, the light source component is not limited to a lamp. For example, an LED or a laser light source may be used.

In the present embodiment, the supply control valves 58, 60 and the discharge control valve 62 comprise an electromagnetic valve which is also expendable component. If the electromagnetic valve is made of stainless steel, then the electromagnetic valve has a service life of about six months (15,000,000 cycles of operation). If the electromagnetic valve is made of resin, then the electromagnetic valve has a service life of about four months (10,000,000 cycles of operation). However, the service life of the electromagnetic valve differs depending on the type thereof and condition under which the electromagnetic valve is used.

Heretofore, these expendable components are mounted on the lower surface of the polishing table 12, and cannot easily be replaced. In view of such a drawback, the present embodiment is arranged to allow the expendable components to be replaced easily. A structure for replacing a lamp will be described below. However, the same structure can be applied for replacing an electromagnetic valve.

Figure 40A:
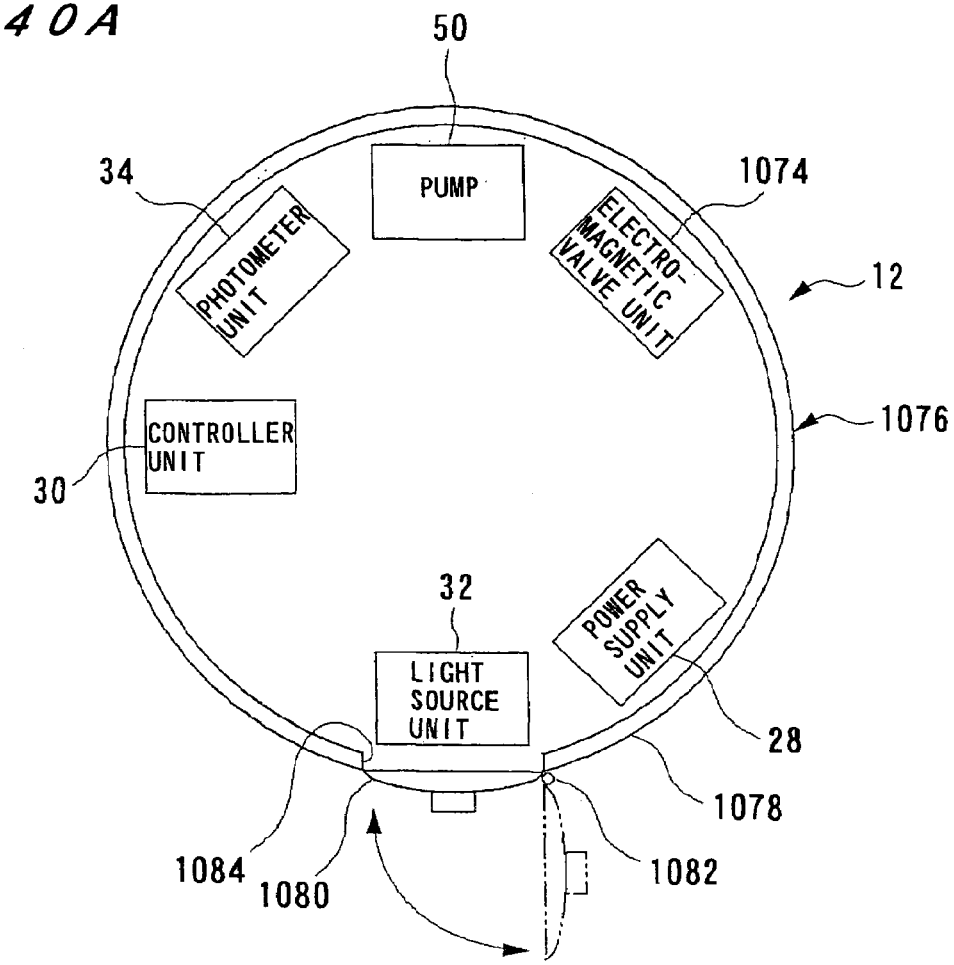
FIGS. 40A and 40B are views showing an expendable component replacement door provided on a polishing table of the substrate polishing apparatus shown in FIG. 1, FIG. 40A being a plane view and FIG. 40B being a side view.
Figure 40B:
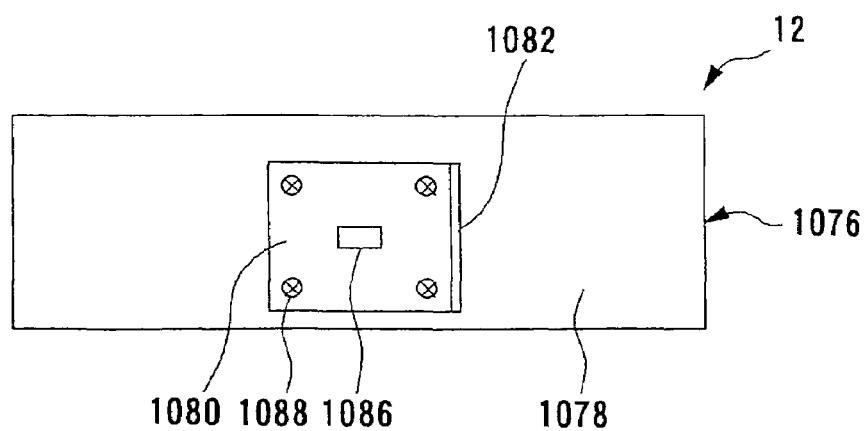

FIGS. 40A and 40B are views showing an expendable component replacement door provided on the polishing table of the substrate polishing apparatus shown in FIG. 1. FIG. 40A is a plan view and FIG. 40B is a side view. As shown in FIGS. 40A and 40B, the power supply unit 28, the controller unit 30, the light source unit 32, the photometer unit 34, the pump 50, and an electromagnetic valve unit 1074 are arranged along the outer edge of the polishing table 12 and are disposed inwardly of a skirt 1076. The skirt 1076 has an outer circumferential surface serving as a side surface 1078 of the polishing table 12.

As to a feature of the present embodiment, an expendable component replacement door 1080 is provided on the side surface 1078 of the polishing table 12. The expendable component replacement door 1080 is attached to the side surface 1078 by a hinge 1082. When the expendable component replacement door 1080 is closed, a replacement mouth 1084 is covered by the expendable component replacement door 1080. The expendable component replacement door 1080 is disposed outwardly of the light source unit 32. The replacement mouth 1084 has a shape that allows the light source unit 32 to be taken in and out through the replacement mouth 1084. A grip 1086 is attached to a central portion of the expendable component replacement door 1080, and bolts 1088 are mounted on respective four corners of the expendable component replacement door 1080. When a maintenance operation is not performed, the expendable component replacement door 1080 is fastened to the polishing table 12 by the bolts 1088. Although not shown, a seal such as an O-ring is provided on the expendable component replacement door 1080 so as to prevent the polishing slurry and the pure water for measurement from entering. In order to achieve a reliable seal, three or more bolts are preferably provided. Therefore, in the present embodiment, the four bolts 1088 are provided.

An operation of replacing the lamp will be described below. When replacing the lamp, the operator removes the bolts 1088 from the four corners of the expendable component replacement door 1080. Then, the operator holds the grip 1086 and opens the expendable component replacement door 1080. The operator puts a hand through the replacement mouth 1084 and removes the light source unit 32 from the polishing table 12. The light source unit 32 is removed through the replacement mouth 1084. The operator replaces the lamp of the light source unit 32. The light source unit 32 is inserted through the replacement mouth 1084, and installed on the polishing table 12 in a predetermined position. Then, the expendable component replacement door 1080 is closed and the bolts 1088 are tightened. The replacement of the lamp is thus finished.

As shown in FIG. 3, the substrate processing apparatus 66 has working windows 74 provided on a chamber in which the substrate polishing apparatus 10 is installed. The working windows 74 are originally used to replace the polishing pad. In the present embodiment, the working windows 74 are also used to replace a lamp. Working areas 1100 inside of the working windows 74 are used to replace the lamp. The operator opens the doors of the working windows 74 and manually turns the polishing table 12 so as to position the expendable component replacement door 1080 in the working area 1100. Then, the operator replaces the lamp according to a process described above.

Preferably, the position where the polishing table 12 is stopped is automatically controlled for maintenance. For example, when the operator inputs an instruction of maintenance with an operation panel, the polishing table 12 is rotated. The polishing table 12 is then stopped such that the expendable component replacement door 1080 is positioned in the working area 1100 of the substrate processing apparatus 66. Thus, the replacing process is further facilitated. The stop control for the polishing table is performed in response to an input operation made by the operator. However, the stop control for the polishing table may be automatically performed at a timing when a certain period of time has passed after starting of using the expendable component. The same stop control may be performed simultaneously with an alarm signal outputted when failure occurs.

The substrate polishing apparatus according to the present embodiment has been described in detail above. As described above, the expendable components can be easily replaced by providing the expendable component replacement door.

In the above embodiment, the structure for replacing a lamp has been described. However, the same structure can be used to replace an electromagnetic valve. In this case, the expendable component replacement door is disposed in the vicinity of the electromagnetic valve unit. The electromagnetic valve unit is removed, so that the electromagnetic valve of the electromagnetic valve unit is replaced. This feature is also applicable to other embodiments to be described below.

Within the scope of the present invention, the expendable components are not limited to the lamp and the electromagnetic valve. As described above, the expendable component may be a light source component other than the lamp, e.g., an LED or a laser light source. Within the scope of the present invention, the expendable component may be replaced together with other component disposed near the expendable component. For example, an entire unit including the expendable component may be replaced. Such an operation is also included in the expendable component replacing operation. Within the scope of the present invention, further, a process of determining whether a film is present or not may be included in the process of measuring a film thickness. Furthermore, a process of measuring a film is not limited to the process of measuring a film thickness.

Within the scope of the present invention, the measurement fluid is not limited to a liquid, and may be a gas, e.g., air. Within the scope of the present invention, the substrate measuring device is not limited to the optical-type device as described above. The substrate measuring device may be an eddy-current-type device, for example. The eddy-current-type device may be used to determine an end point. In this case also, the replacement of an expendable component can be facilitated.

Figure 41A:
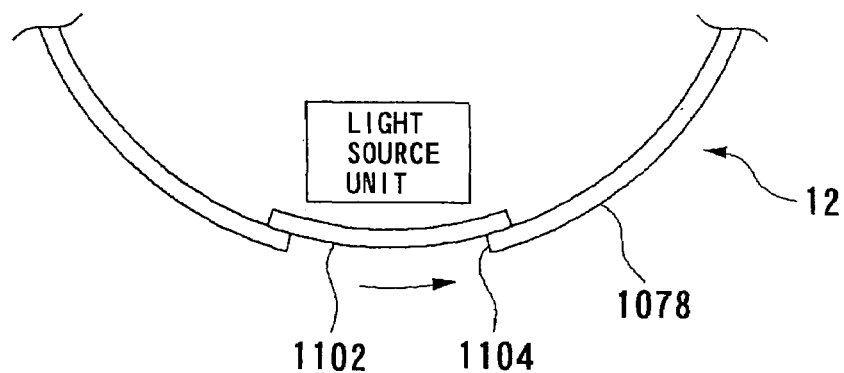
FIGS. 41A and 41B are views showing a modification of the expendable component replacement door, FIG. 41A being a plane view and FIG. 41B being a side view.
Figure 41B:
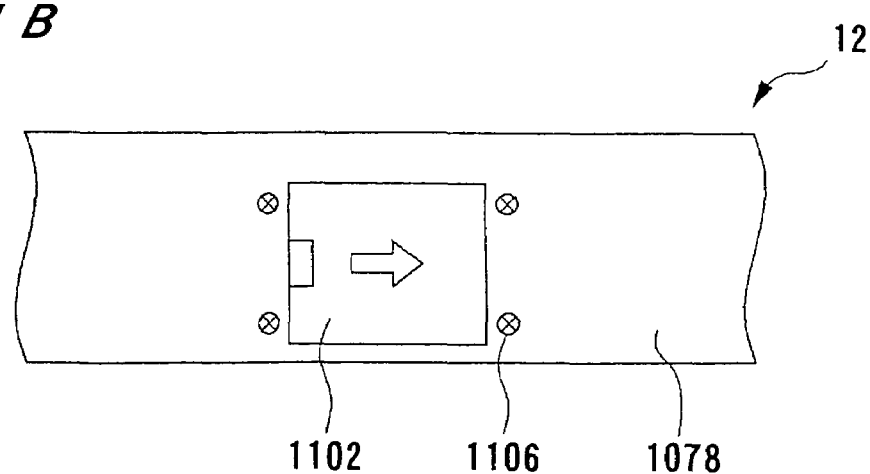

FIGS. 41A and 41B show a modification of the above embodiment. FIG. 41A is a plan view and FIG. 41B is a side view. In this modification, an expendable component replacement door 1102 is slidable along the side surface 1078 of the polishing table 12. Thus, the expendable component replacement door 1102 is opened and closed in a sliding motion. When the expendable component replacement door 1102 is opened, an expendable component is taken in or out through a replacement mouth 1104. The expendable component replacement door 1102 has four corners which are fastened to the polishing table 12 by bolts 1106. The bolts 1106 are removed when the replacement operation is performed.

Figure 42A:
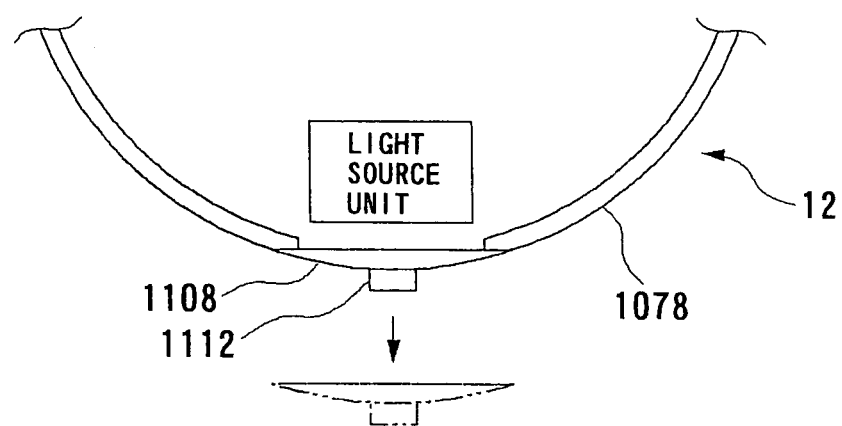
FIGS. 42A and 42B are views showing a modification of the expendable component replacement door, FIG. 42A being a plane view and FIG. 42B being a side view.
Figure 42B:
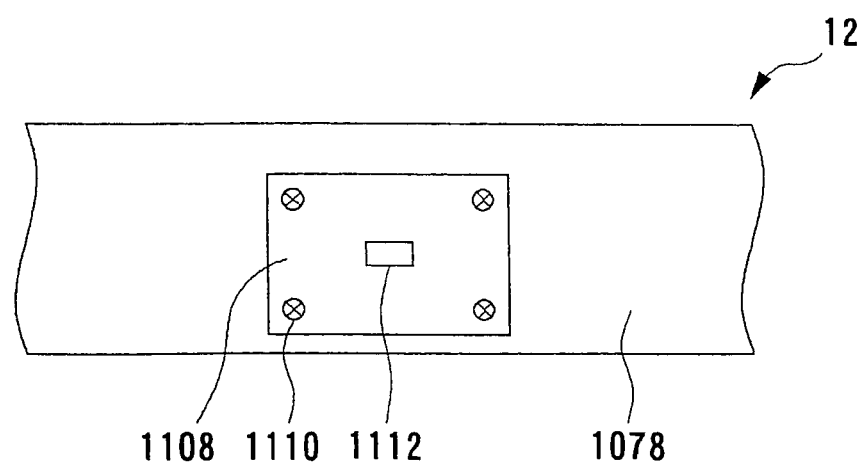

FIGS. 42A and 42B show another modification of the above embodiment. FIG. 42A is a plan view and FIG. 42B is a side view. In this modification, an expendable component replacement door 1108 comprises a cover which can be removed from the polishing table 12. The cover is also included in the expendable component replacement door according to the present invention. The expendable component replacement door 1108 is fastened to the polishing table 12 by bolts 1110 at respective four corners. A grip 1112 is attached to the expendable component replacement door 1108.

Preferably, retaining rings are combined with the bolts 1110 so as to prevent the bolts 1110 from being completely detached from the four corners of the expendable component replacement door 1108. With this structure, when the bolts 1110 are loosened, the bolts 1110 stay in positions in such a state that the bolts 1110 project from the expendable component replacement door 1108. The bolts 1110 can be thus used as a grip for removing and installing the expendable component replacement door 1108. Therefore, it is possible to dispense with the grip 1112.

FIGS. 43A and 43B show still another modification. FIG. 43A is a plan view and FIG. 43B is a side view. In this modification, the light source unit 32 is mounted on a drawer member 1116. In the present embodiment, the drawer member 1116 comprises a plate with the light source unit 32 mounted thereon. A guide mechanism 1118 is provided for allowing the drawer member 1116 to slide outwardly of the polishing table 12. An expendable component replacement door 1120 is attached to the drawer member 1116.

In an operation for replacing the expendable component, the operator pulls a grip 1122 of the expendable component replacement door 1120 so as to pull the light source unit 32 together with the drawer member 1116 out of the polishing table 12. Then, the operator replaces the lamp of the light source unit 32. This structure can further facilitate the replacement of the expendable component.

The above drawer mechanism is also applicable to the structures shown in FIGS. 40A and 40B, or FIGS. 41A and 41B. In these cases, the drawer member and the expendable component replacement door may be separate from each other.

Figure 44:
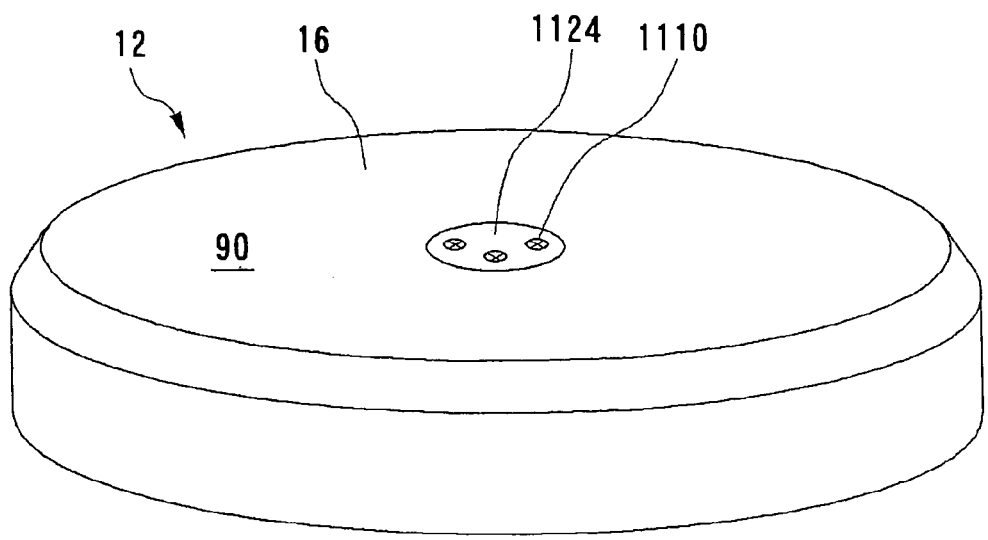
FIG. 44 is a view showing a modification of the expendable component replacement door.

FIG. 44 shows still another modification. In this modification, the expendable component replacement door is mounted on the surface of the polishing table 12 against which the substrate is pressed. Specifically, as shown in FIG. 44, an expendable component replacement door 1124 is mounted on the polishing surface 90 of the polishing table 12. More specifically, the expendable component replacement door 1124 is mounted on a table surface (rotational surface) below the polishing pad 16 which has the polishing surface 90. In order to illustrate in an easy-to-understand way, the expendable component replacement door 1124 is indicated by the solid line in FIG. 44. Actually, the expendable component replacement door 1124 is concealed below the polishing pad 16 in FIG. 44. The expendable component replacement door 1124 is disposed downwardly of a central region of the polishing surface 90, and is thus deviated from the orbit of the substrate.

The expendable component replacement door 1124 is constructed to provide a flat surface in cooperation with the table surface surrounding the expendable component replacement door 1124. Thus, defect due to a step on the polishing surface 90 is prevented from occurring.

Another embodiment of the present invention will be described below. This embodiment is provided for facilitating the replacing operation of an expendable component by switching a plurality of expendable components.

Figure 45:
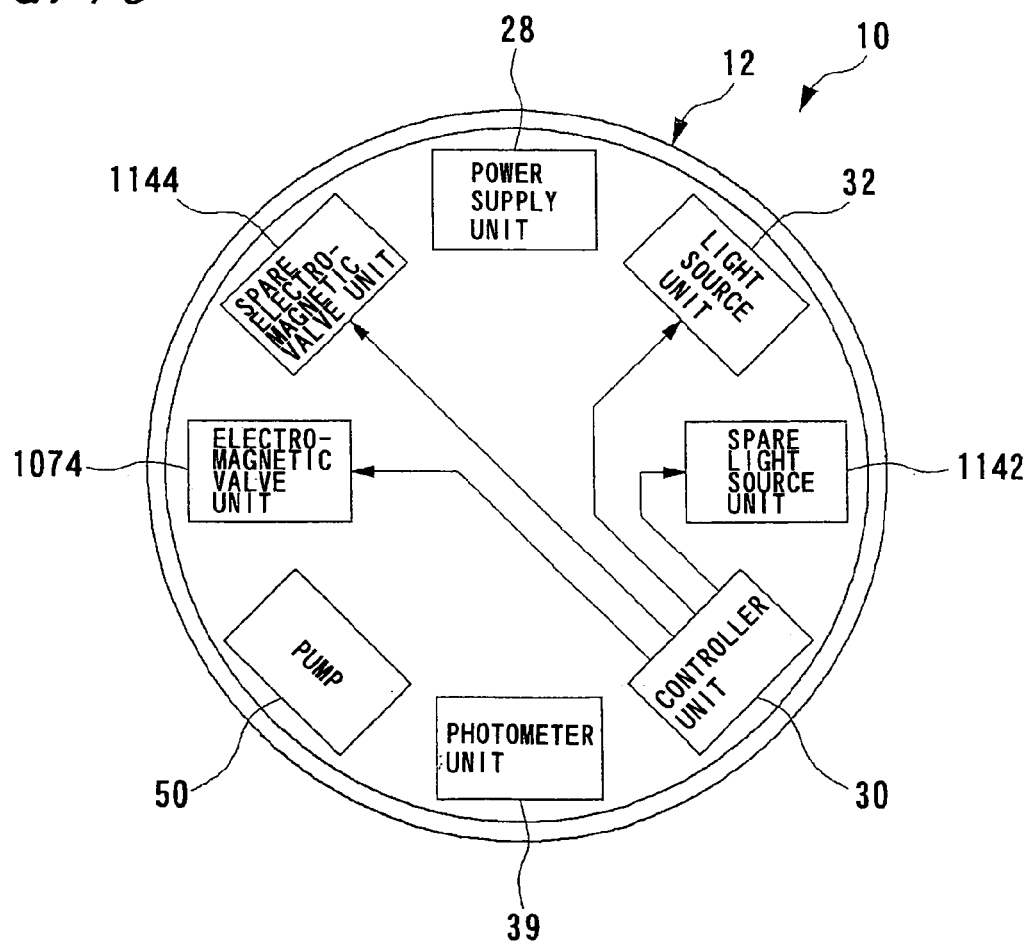
FIG. 45 is a view showing a substrate polishing apparatus according to another embodiment of the present invention.

Referring to FIG. 45, the polishing table 12 of the substrate polishing apparatus 10 according to the present embodiment has the power supply unit 28, the controller unit 30, the light source unit 32, the photometer unit 34, the electromagnetic valve unit 1074, and the pump 50, as with the above embodiment. The light source unit 32 has a lamp, and the electromagnetic valve unit 1074 has an electromagnetic valve disposed in the supply passage and the discharge passage for the measurement fluid.

The polishing table 12 has a spare light source unit 1142 and a spare electromagnetic valve unit 1144. The spare light source unit 1142 has the same structure as the light source unit 32, and is capable of supplying measurement light to the sensor, as with the light source unit 32. The spare electromagnetic valve unit 1144 has the same structure as the electromagnetic valve unit 1074, and is disposed in the supply passage and the discharge passage for the measurement fluid, as with the electromagnetic valve unit 1074.

The controller unit 30 functions as an expendable component switching means according to the present invention in the following manner. First, a function for switching from the light source unit 32 to the spare light source unit 1142 will be described below.

The controller unit 30 monitors a usage situation of the light source unit 32, and functions as a usage situation monitoring mechanism or detector. In the present embodiment, a usage period is monitored as the usage situation. The controller unit 30 stores a lamp switching criterion period that has been set in accordance with the service life of the lamp of the light source unit 32. The lamp switching criterion period is four months, for example. The controller unit 30 determines whether or not the usage period of the light source unit 32 has reached the lamp switching criterion period.

If the usage period has reached the lamp switching criterion period, then the controller unit 30 instructs the light source unit 32 to be turned off, and instructs the spare light source unit 1142 to be turned on. In a subsequent measuring process, the light source unit 32 is not turned on, but the spare light source unit 1142 is turned on.

An operation of switching from the electromagnetic valve unit 1074 to the spare electromagnetic valve unit 1144 will be described below. The controller unit 30 also monitors a usage period as a usage situation of the electromagnetic valve unit 1074. The controller 30 stores a valve switching criterion period that has been set in accordance with the service life of the electromagnetic valve of the electromagnetic valve unit 1074. The valve switching criterion period is six months, for example. The controller unit 30 determines whether or not the usage period of the electromagnetic valve unit 1074 has reached the valve switching criterion period.

When the usage period has reached the valve switching criterion period, the controller unit 30 stops instructing the electromagnetic valve unit 1074 to open and close the valve thereof, and instructs the spare electromagnetic valve unit 1144 to open and close the valve thereof. In a subsequent measuring process, the electromagnetic valve unit 1074 does not function for measurement, but alternatively, the spare electromagnetic valve unit 1144 functions for measurement.

As described above, in the present embodiment, the plurality of expendable components having the same function are provided. The expendable component, of those expendable components, which functions for measuring a film is switched to other component. Therefore, it is possible to reduce the number of times the expendable component is replaced, thus reducing the burden on the operator.

In the present embodiment, the expendable component is automatically switched based on the usage situation of the expendable component which functions for measuring a film. Consequently, it is possible to reduce a work that the operator has to perform, thus further reducing the burden on the operator.

In the present embodiment, when the expendable component is consumed or breaks down, it is not necessary to shut off the substrate polishing apparatus immediately to perform the replacing operation. The expendable component may be replaced during other maintenance operation such as replacing the polishing pad. Therefore, an operating rate of the substrate polishing apparatus can be increased.

In the present embodiment, first, the expendable component is continuously used, and thereafter the spare expendable component is used. However, the present invention is not limited to such a manner. A plurality of the expendable components may be used alternately. In this case, a switching period may be set to be shorter than the service life of the expendable component.

In the present embodiment, the usage period is monitored as the usage situation. However, the present invention is not limited to such an example. A diagnostic device for diagnosing a failure or a service life of the expendable component may be provided. A sensor signal for diagnosis is processed in the controller unit or the like, and then a diagnostic result is obtained. The expendable component is automatically switched based on the diagnostic result. A failure or the like is indicated by an alarm so as to prompt the operator to replace the expendable component.

The present embodiment may be combined with the embodiment shown in FIGS. 40A and 40B. In this case, the expendable component replacement door is disposed on the polishing table, and a plurality of the expendable components having the same function are disposed in the polishing table. These expendable components are switched or replaced through the expendable component replacement door. Thus, the number of times the expendable components are replaced is reduced, and the operation for replacing the expendable components is facilitated. As a result, the entire replacing operation is further facilitated.

Still another embodiment of the present invention will be described below. In this embodiment, the expendable component is disposed outside of the polishing table so as to facilitate the replacing operation, as described below.

Figure 46:
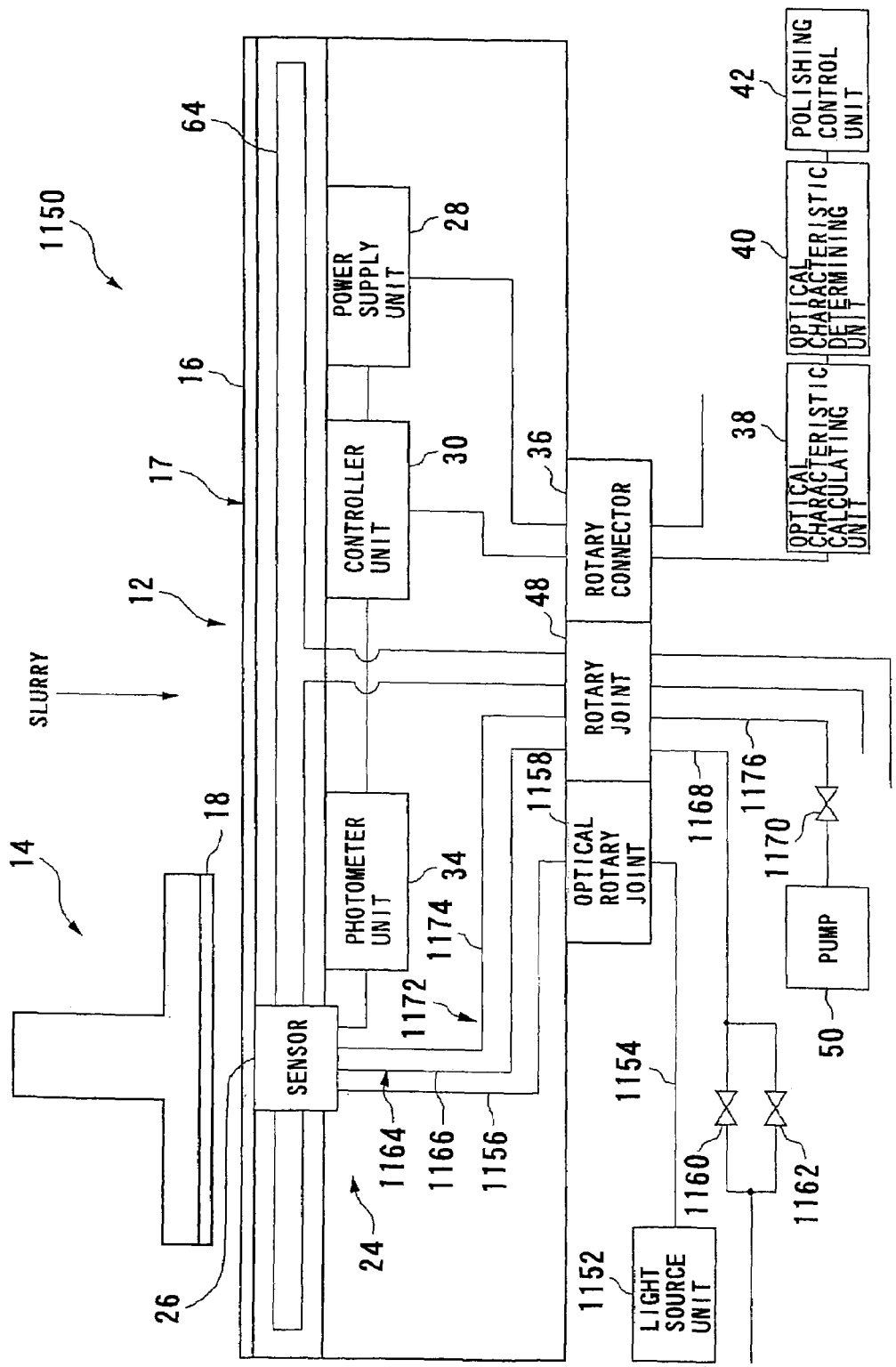
FIG. 46 is a view showing a substrate polishing apparatus according to another embodiment of the present invention.

FIG. 46 shows a substrate polishing apparatus having the expendable component disposed outside of the polishing table. A substrate polishing apparatus 1150 shown in FIG. 46 differs from the substrate polishing apparatus 10 shown in FIG. 1 in that a light source unit is not mounted on the polishing table 12. Alternatively, a light source unit 1152 is disposed outside of the polishing table 12. In the present embodiment, an area outside of the polishing table 12 is an area outside of a space occupied by the polishing table 12, i.e., a space occupied by the polishing table 12 and the mounted components. More specifically, the area outside of the polishing table 12 is an area outside of a space defined by the upper surface and the side surface (skirt) of the polishing table 12. The light source unit 1152 is disposed in a suitable location where the lamp can be easily replaced.

In order to guide light emitted by the lamp of the light source unit 1152 to the sensor 26, a fixed-side light guide 1154 is disposed outside of the polishing table 12, and a rotary-side light guide 1156 is disposed in the polishing table 12. The rotary-side light guide 1156 is connected to the sensor 26. Each of the fixed-side light guide 1154 and the rotary-side light guide 1156 comprises an optical fiber.

The fixed-side light guide 1154 and the rotary-side light guide 1156 are connected to each other by an optical rotary joint 1158. The optical rotary joint 1158, the electric rotary connector 36, and the fluid rotary joint 48 are mounted on a shaft of the polishing table 12 for thereby transmitting light from the fixed-side light guide 1154 to the rotary-side light guide 1156. The optical rotary joint 1158, the electric rotary connector 36, and the fluid rotary joint 48 may alternatively be disposed in a location other than the shaft of the polishing table 12, e.g., on the outer circumferential surface of the polishing table 12 or on the lower portion of the polishing table 12.

The substrate polishing apparatus 1150 is different from the substrate polishing apparatus 10 shown in FIG. 1 in that a supply control valve is not provided in the polishing table 12. Alternatively, the substrate polishing apparatus 1150 has supply control valves 1160, 1162 disposed outside of the polishing table 12. As already described, the supply control valves 1160, 1162 are used to switch ejection of the measurement fluid and low-flow-rate supply of the measurement fluid.

More specifically, a supply passage 1164 for the measurement fluid comprises a rotary-side supply passage 1166 and a fixed-side supply passage 1168. The rotary-side supply passage 1166 is disposed in the polishing table 12, and the fixed-side supply passage 1168 is disposed outside of the polishing table 12. The rotary-side supply passage 1166 and the fixed-side supply passage 1168 are connected to each other by the rotary joint 48.

The substrate polishing apparatus 1150 also has the same mechanism for discharging the measurement fluid. Specifically, unlike the substrate polishing apparatus 10 shown in FIG. 1, the substrate polishing apparatus 1150 does not have a discharge control valve in the polishing table 12. Alternatively, a discharge control valve 1170 is provided outside of the polishing table 12.

In order to allow the discharge control valve 1170 to be positioned outside of the polishing table 12, a discharge passage 1172 extends outwardly from the polishing table 12. The discharge passage 1172 comprises a rotary discharge passage 1174 disposed in the polishing table 12 and a fixed discharge passage 1176 disposed outside of the polishing table 12. The rotary discharge passage 1174 and the fixed discharge passage 1176 are connected to each other by the rotary joint 48. The discharge control valve 1170 is disposed in the fixed discharge passage 1176. The pump 50 for forcibly discharging the measurement fluid is also disposed outside of the polishing table 12 and is connected to the fixed discharge passage 1176.

The above supply control valves 1160, 1162 and the discharge control valve 1170 constitute an electromagnetic valve unit. The electromagnetic valve unit is disposed outside of the polishing table 12 in the same manner as described above. The electromagnetic valve unit is disposed in a suitable location where the valves can be easily replaced.

An operation of replacing the expendable components according to the present embodiment will be described below. The expendable components are a lamp and electromagnetic valves. At the time of replacement, the operator opens a working door provided on the wall of the substrate processing apparatus. The operator puts a hand through the door and replaces the expendable components.

According to the present embodiment, as described above, since the expendable components are disposed outside of the polishing table 12, the expendable components can be replaced easily.

Figure 47:
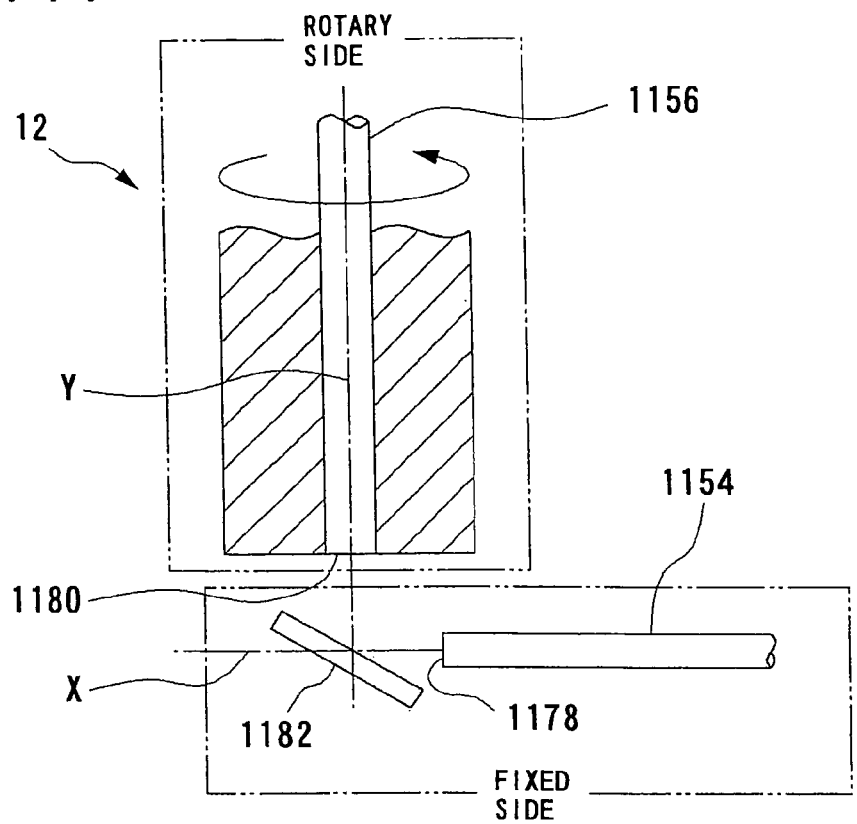
FIG. 47 is a view showing an example of an optical rotary joint.

FIG. 47 shows an example of the optical rotary joint 1158 incorporated in the substrate polishing apparatus 1150 shown in FIG. 46.

In FIG. 47, each of the fixed-side light guide 1154 and the rotary-side light guide 1156 comprises an optical fiber. The rotary-side light guide 1156 extends along a rotational axis Y of the polishing table 12. The fixed-side light guide 1154 extends perpendicularly to the rotational axis Y, and an extension X of the rotary-side light guide 1156 crosses the rotational axis Y. In FIG. 47, an end portion of the fixed-side light guide 1154 constitutes a fixed-side end portion 1178, and an end portion of the rotary-side light guide 1156 constitutes a rotary-side end portion 1180 which is positioned at a lower end of the polishing table 12.

A mirror 1182 is disposed on the rotational axis Y. As shown in FIG. 47, the mirror 1182 is disposed such that the rotary-side end portion 1180 and the fixed-side end portion 1178 face each other through the mirror 1182. With this arrangement, light is emitted from the fixed-side light guide 1154, reflected by the mirror 1182, enters the rotary-side light guide 1156, and is transmitted to the non-illustrated sensor.

With the arrangement shown in FIG. 47, the light is continuously transmitted from the fixed side to the rotary side during the polishing table 12 is rotated. The mirror 1182 may be a plane mirror or a concave mirror. As a modification of FIG. 47, the fixed-side light guide 1154 may be bent instead of providing the mirror 1182. Specifically, the optical fiber constituting the fixed-side light guide 1154 may be bent upwardly so as to allow the fixed-side end portion 1178 to face the rotary-side end portion 1180. This modified structure also allows light to be transmitted appropriately.

Figure 48:
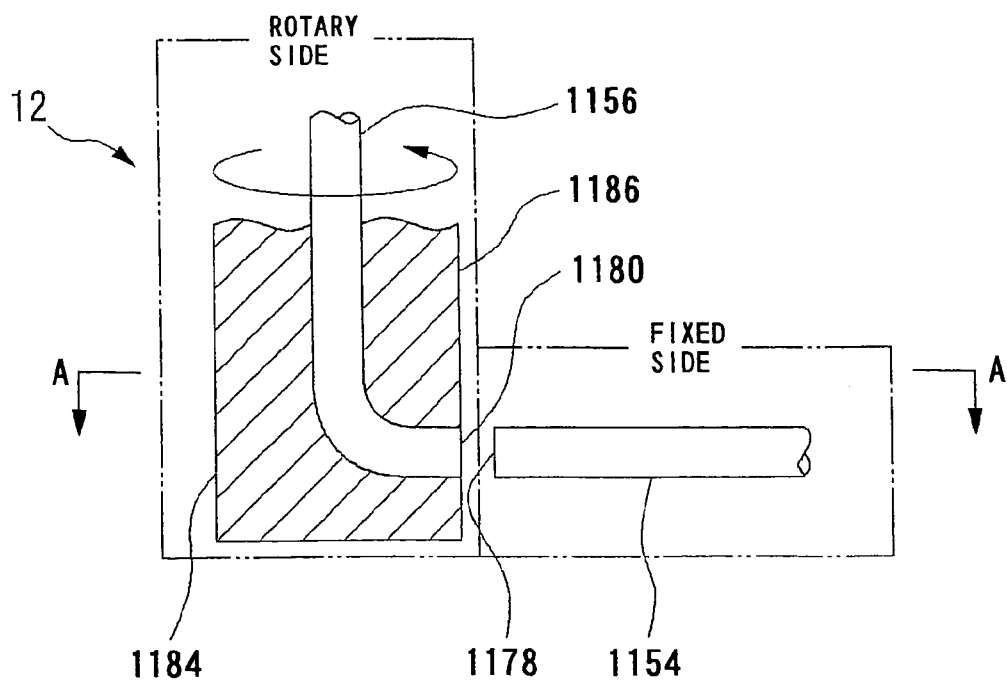
FIG. 48 is a view showing an example of the optical rotary joint.

FIG. 48 shows another example of the optical rotary joint. In FIG. 48, the rotary-side light guide 1156 is bent at a right angle in the polishing table 12. The rotary-side end portion 1180 is thus positioned at a side surface 1186 of a shaft 1184 of the polishing table 12. The fixed-side light guide 1154 is disposed such that the rotary-side end portion 1180 and the fixed-side end portion 1178 face each other.

FIGS. 49A and 49B are cross-sectional views taken along line A—A of FIG. 48. As indicated by the illustrated arrow, since the polishing table 21 is rotated, the rotary-side end portion 1180 and the fixed-side end portion 1178 face each other in a predetermined light guiding region extending in the rotating direction of the polishing table 12. The light guiding region ranges from a position where the fixed-side end portion 1178 and the rotary-side end portion 1180 start facing each other to a position where such facing ends.

Figure 50A:
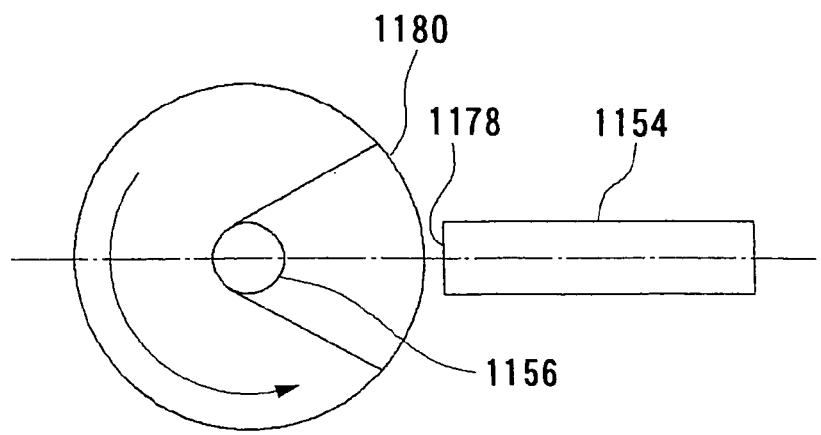
FIGS. 50A through 50C are views each showing an example of the optical rotary joint.
Figure 50B:
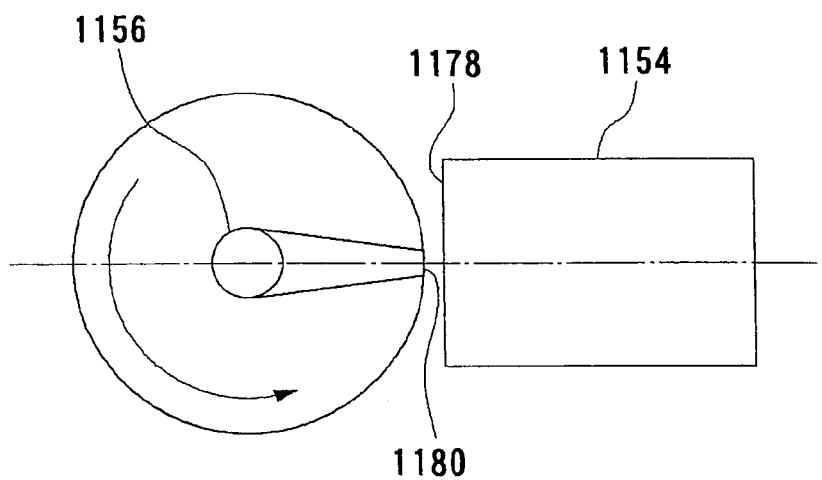
Figure 50C:
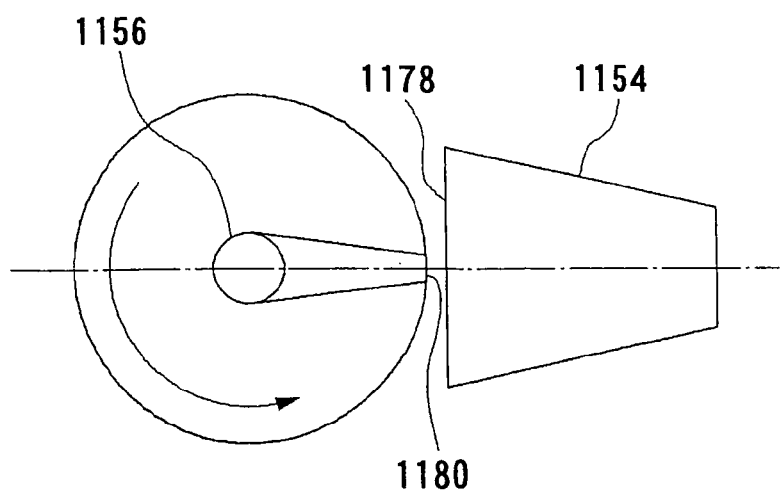

FIGS. 50A, 50B, and 50C show modifications of FIGS. 49A and 49B in which the light guiding region is increased. In FIG. 50A, the rotary-side end portion 1180 is widened in the circumferential direction. In FIGS. 50B and 50C, the fixed-side end portion 1178 is widened. With these structures, the fixed-side end portion 1178 and the rotary-side end portion 1180 can face each other in an increased range.

The above light guiding region is preferably set so as to include an angular position of the polishing table where the substrate is in the measurement position. It is appropriate to measure the substrate at several times while the substrate passes over the sensor on the polished surface. In this case, the light guiding region is set to allow the fixed-side end portion 1178 and the rotary-side end portion 1180 to face each other while all the measuring points of the substrate pass over the sensor. The light guiding region may be set to allow the fixed-side end portion 1178 and the rotary-side end portion 1180 to face each other throughout the entire period of time when the substrate passes over the sensor.

The preferred optical rotary joints according to the present embodiments have been described above. With the above structures, since the end portions of the rotary-side and fixed-side light guides are not required to communicate with each other at all times, the structure for transmitting light becomes simple. For example, it is possible to dispense with the mirror unlike the structure shown in FIG. 47, and the end portions of the light guide can be positioned more freely.

A preferred example of the rotary joint 48 which is used to supply the measurement fluid and incorporated in the substrate polishing apparatus 1150 shown in FIG. 46 will be described below.

Figure 51A:
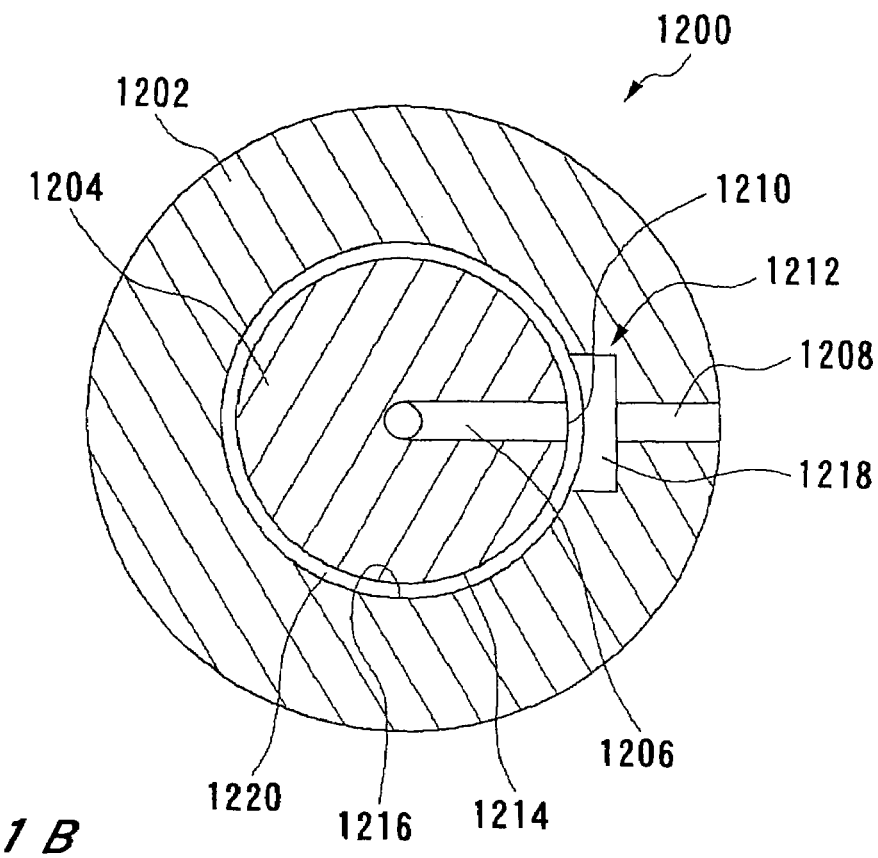
FIGS. 51A and 51B are views showing an example of a rotary joint for a measurement fluid.
Figure 51B:
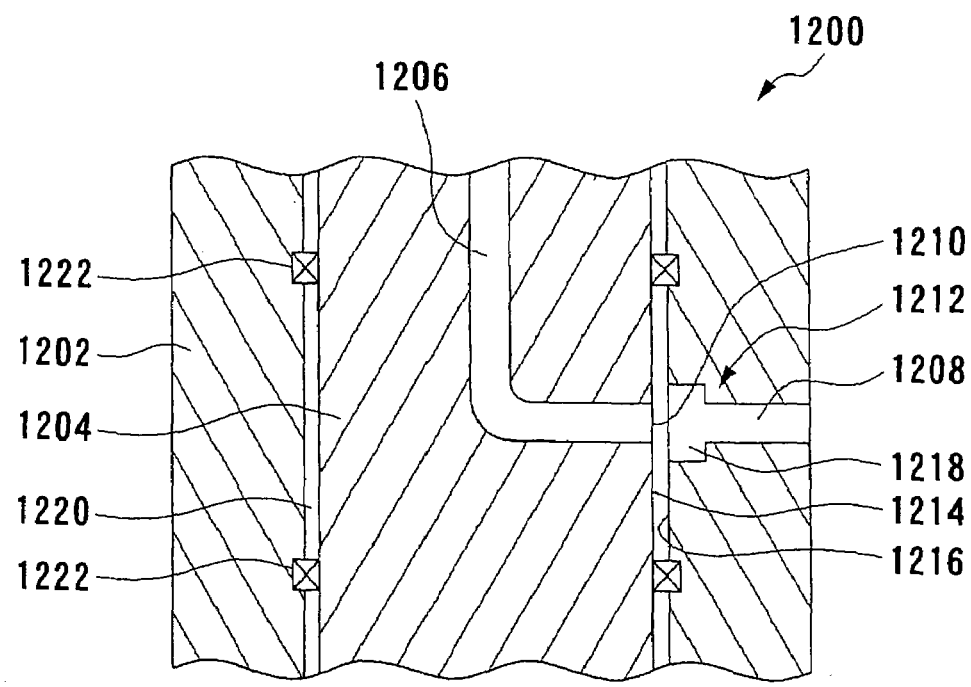

FIGS. 51A and 51B show a rotary joint 1200 according to the present embodiment. The rotary joint 1200 is used to supply the measurement fluid such as pure water.

The rotary joint 1200 has a cylindrical housing 1202, and a rotor 1204 is housed the housing 1202. The rotor 1204 is mounted on the polishing table (not shown) of the substrate polishing apparatus, and is rotatable about the rotational axis of the polishing table. Since such an element is mounted on the polishing table and is rotated with the polishing table, the rotor 1204 constitutes the polishing table in the present invention.

The rotor 1204 has a rotary-side supply passage 1206 formed therein, and the housing 1202 has a fixed-side supply passage 1208 formed therein. The rotary-side supply passage 1206 and the fixed-side supply passage 1208 have a circular cross section and have the same cross sectional area as each other. The rotary-side supply passage 1206 extends along the rotational axis of the rotor 1204 to the sensor at the polishing surface of the polishing table. A lower portion of the rotary-side supply passage 1206 is bent at a right angle.

An end portion of the rotary-side supply passage 1206 constitutes a rotary-side end portion 1210, and an end portion of the fixed-side supply passage 1208 constitutes a fixed-side end portion 1212. The rotary-side end portion 1210 is positioned at an outer circumferential surface 1214 of the rotor 1204, and the fixed-side end portion 1212 is positioned at an inner circumferential surface 1216 of the housing 1202. As shown in the drawing, the fixed-side end portion 1212 comprises a supply groove 1218 extending in the circumferential direction. A position and a shape of the supply groove 1218 are set such that the fixed-side end portion 1212 and the rotary-side end portion 1210 face each other in a suitable range.

The inner circumferential surface 1216 of the housing 1202 is disposed closely to the outer circumferential surface 1214 of the rotor 1204 in a region where the fixed-side end portion 1212 is not provided. An orifice gap 1220 is formed between the outer circumferential surface 1214 of the rotor 1204 and the inner circumferential surface 1216 of the housing 1202. The housing 1202 and the inner circumferential surface 1216 thereof correspond to an orifice forming member and an orifice forming surface, respectively, according to the present invention.

Seals 1222 for preventing the measurement fluid from leaking are disposed between the inner circumferential surface 1216 of the housing 1202 and the outer circumferential surface 1214 of the rotor 1204. The rotary-side supply passage 1206 and the fixed-side supply passage 1208 are disposed between the two seals 1222.

FIG. 52 is a view illustrating an appropriate position and shape of the supply groove 1218 of the fixed-side end portion 212. When the polishing table 12 is rotated, the substrate 18 moves relatively to the polishing table 12. At this time, the substrate 18 traces a circular orbit on the polishing table 12. When an angular position of the polishing table 12 in the rotating direction is in an overlapping region 1224, the substrate 18 is positioned above the sensor 26 provided on the polishing surface for a certain period. Such a period is set as a predetermined conduction period in the present embodiment. The shape of the supply groove 1218 is formed so as to allow the rotary-side end portion 1210 and the fixed-side end portion 1212 to face each other in the conduction period.

More specifically, a start point 1226 and an end point 1228 of the supply groove 1218 are set to correspond to respective positions (points C, D) of the rotary-side end portion 1210 where the substrate 18 reaches the sensor 26 and leaves the sensor 26.

An operation of the rotary joint 1200 shown in FIGS. 51A and 51B will be described below. When the rotary joint 1200 is rotated, the fixed-side end portion 1212 of the fixed-side supply passage 1208 and the rotary-side end portion 1210 of the rotary-side supply passage 1206 face each other to form a relatively large opening during the above conduction period, i.e., a period in which the sensor 26 is covered by the substrate 18. Therefore, a large amount of the measurement fluid is supplied to the sensor 26 and is ejected in the sensor 26.

On the other hand, in a period other than the conduction period, the fixed-side end portion 1212 and the rotary-side end portion 1210 do not face each other. The fixed-side end portion 1212 and the rotary-side end portion 1210 are connected to each other through the orifice gap 1220. Since the flow passage is narrow, the measurement fluid is supplied to the sensor 26 at a low flow rate. Therefore, when the sensor 26 is not covered by the substrate 18, a large amount of the measurement fluid is prevented from being ejected to the polishing table 12, thus preventing the slurry on the polishing table 12 from being diluted.

According to the present embodiment, as described above, the measurement fluid can be delivered with a relatively simple structure. Further, since the orifice gap is provided, a small amount of the measurement fluid is delivered when the end portions of the fluid passages do not face each other.

According to the present embodiment, as described above, a switching control of the flow rate of the measurement fluid can be realized by a simple structure of a fluid delivering mechanism. Thus, it is possible to dispense with the electromagnetic valve for controlling the flow rate of the measurement fluid. Even if the electromagnetic valve remains installed, the service life of the electromagnetic valve is greatly increased because the electromagnetic valve do not have to be operated frequently during the measurement. It is thus possible to eliminate the operation of replacing the electromagnetic valve.

The structure of the fluid supply side has been described above. However, the same structure may be applied to the fluid discharge side. When discharging the measurement fluid, a compulsory discharge may be switched by the rotary joint. In this case, a gap between the rotor of the rotary joint and the housing may be very small to substantially eliminate the orifice gap. In this manner, the present invention is applicable to both the fluid supply side and the fluid discharge side.

Figure 53:
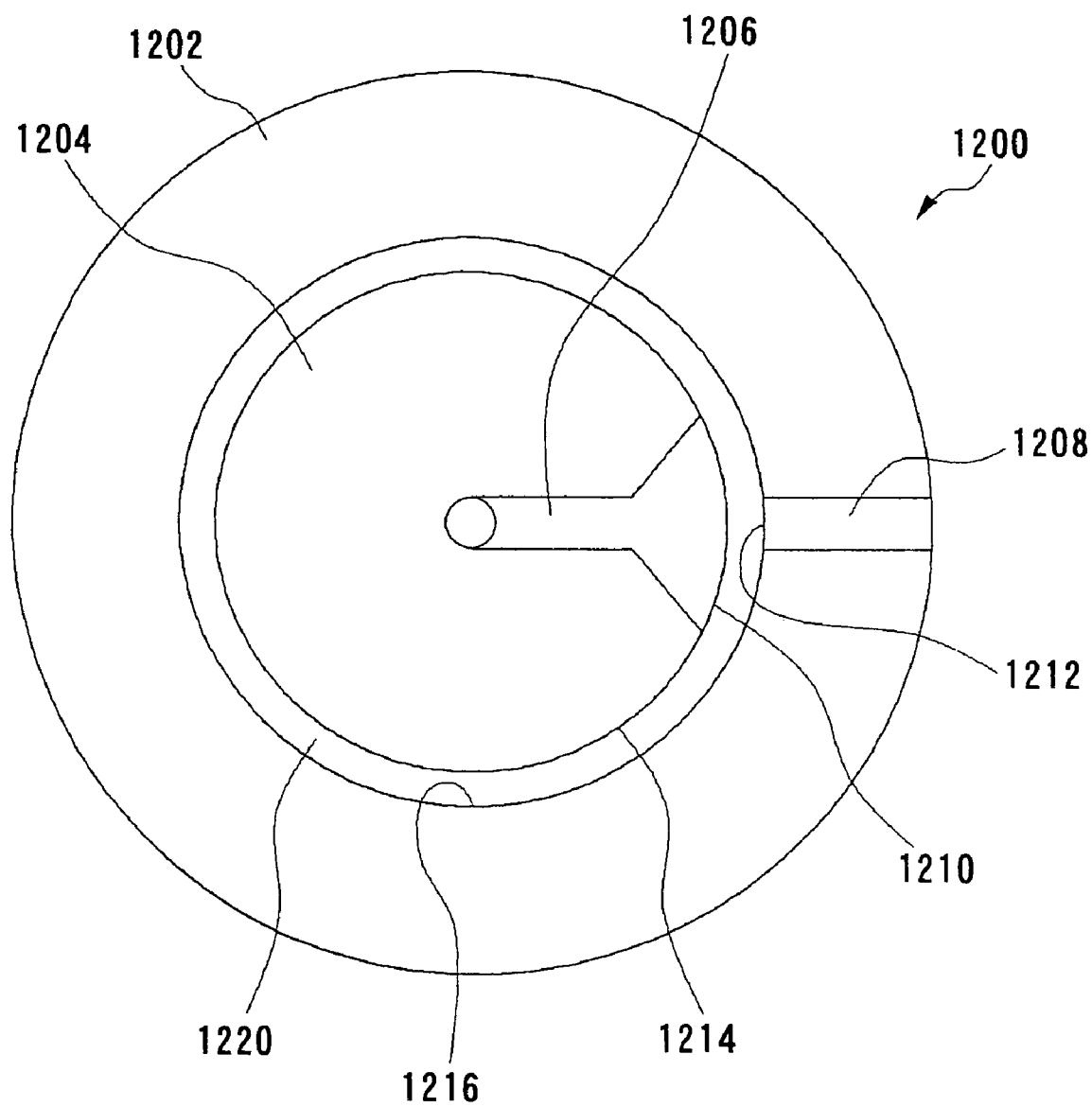
FIG. 53 is a view showing an example of the rotary joint for a measurement fluid.

FIG. 53 shows a modification of the present embodiment. In the embodiment shown in FIGS. 51A and 51B, the supply groove 1218 is formed in the fixed-side end portion 1212 of the fixed-side supply passage 1208. In FIG. 53, the rotary-side end portion 1210 of the rotary-side supply passage 1206 is widened. This structure can perform the same function as the above supply groove.

Figure 54A:
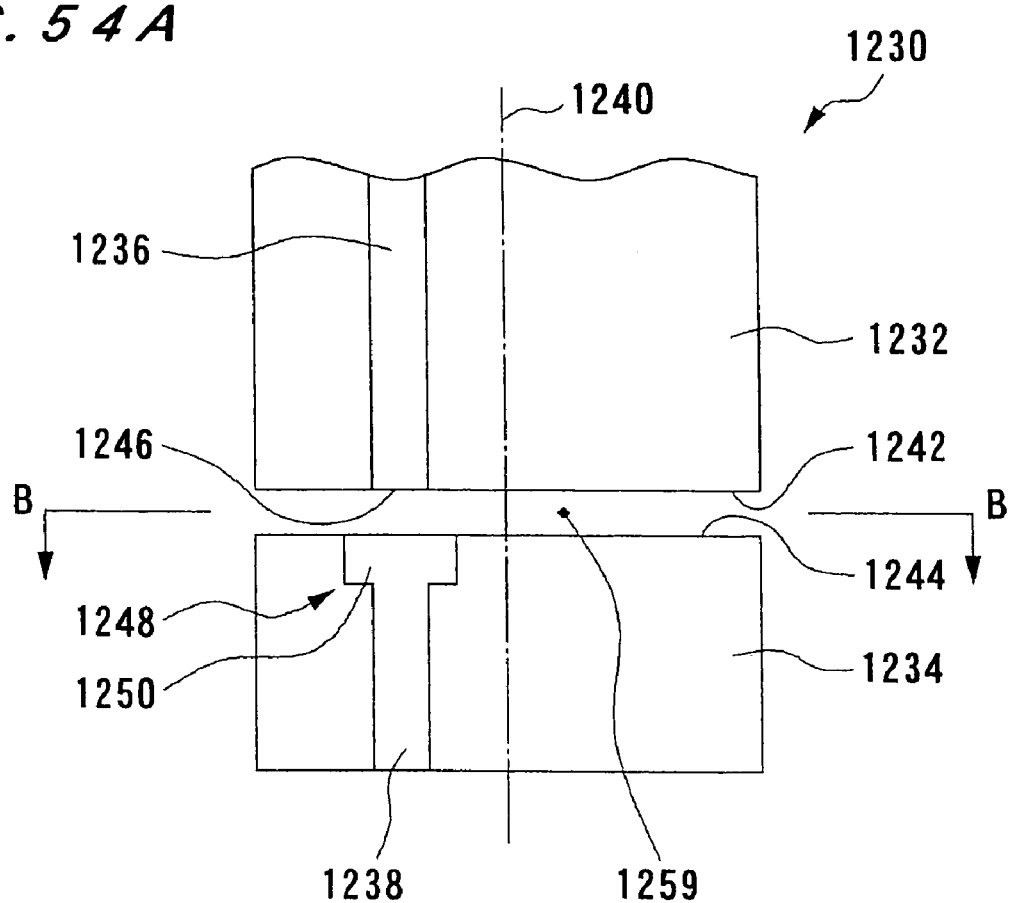
FIGS. 54A and 54B are views showing an example of the rotary joint for a measurement fluid.
Figure 54B:
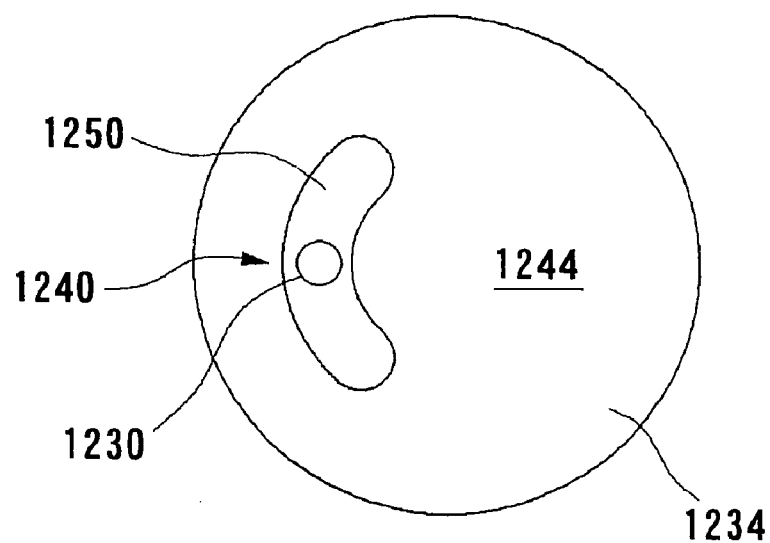

FIGS. 54A and 54B show another embodiment. A rotary joint 1230 has a rotor 1232 and a base 1234. The rotor 1232 and the base 1234 have a rotary-side supply passage 1236 and a fixed-side supply passage 1238, respectively.

The rotor 1232 and the base 1234 have respective delivering surfaces 1242, 1244 perpendicular to a rotational axis 1240 of the rotor 1232. The rotary-side supply passage 1236 and the fixed-side supply passage 1238 have a rotary-side end portion 1246 and a fixed-side end portion 1248, respectively, which are positioned at the delivering surfaces 1242, 1244, respectively. An orifice gap 1259 is formed between the delivering surfaces 1242, 1244. Although the orifice gap 1259 is shown exaggeratedly in order to illustrate in an easy-to-understand way, the orifice gap 1259 is actually very small. The fixed-side end portion 1248 has a supply groove 1250 formed on the delivering surface 1244 of the base 1234. The supply groove 1250 extends along an arc whose center is positioned on the rotational axis 1240. Although not shown, a housing having a leakage-prevention seal mechanism is disposed on outer circumferential surfaces of the rotor 1232 and the base 1234.

When the rotor 1232 is rotated, the rotary-side end portion 1246 of the rotary-side supply passage 1236 and the fixed-side end portion 1248 of the fixed-side supply passage 1238 face each other to increase the flow rate during a period in which the rotary-side end portion 1246 passes over the supply groove 1250. In the other period, the orifice gap 1259 is formed between the fixed-side supply passage 1238 and the rotary-side supply passage 1236, thus lowering the flow rate. Therefore, with this structure, the same function as the above embodiment can be obtained. In this manner, within the scope of the present invention, the fluid may not be delivered through the cylindrical surfaces. The above supply groove may be formed in the rotor.

Although preferred embodiments of the present invention have been described above, the embodiments may be modified by those skilled in the art within the scope of the present invention. For example, the expendable components are not limited to the light source component and the control valve, as already described.

According to the present invention, the expendable component can be taken in and out through the expendable component replacement door, and hence the expendable component can be replaced easily.

According to the present invention, a plurality of the expendable components are provided and switched for reducing the number of times the expendable components are replaced.

According to the present invention, the expendable components are disposed outside of the polishing table, and hence the expendable components can be replaced easily.

According to the present invention, because the structure for delivering the fluid to the polishing table allows the flow rate to be adjusted and controlled, a valve unit for adjusting the flow rate can be eliminated.

Structural feature of the present embodiment will be described below. In the embodiment, a fluid container 2100 (FIG. 1) stores a solvent of the slurry as the measurement fluid. The solvent of the slurry is preferably a main component solvent which is of the same type and has the same concentration as the slurry. The solvent is delivered by a supply pump 2102 and supplied to the sensor 26 through the supply passage 44.

Figure 55:
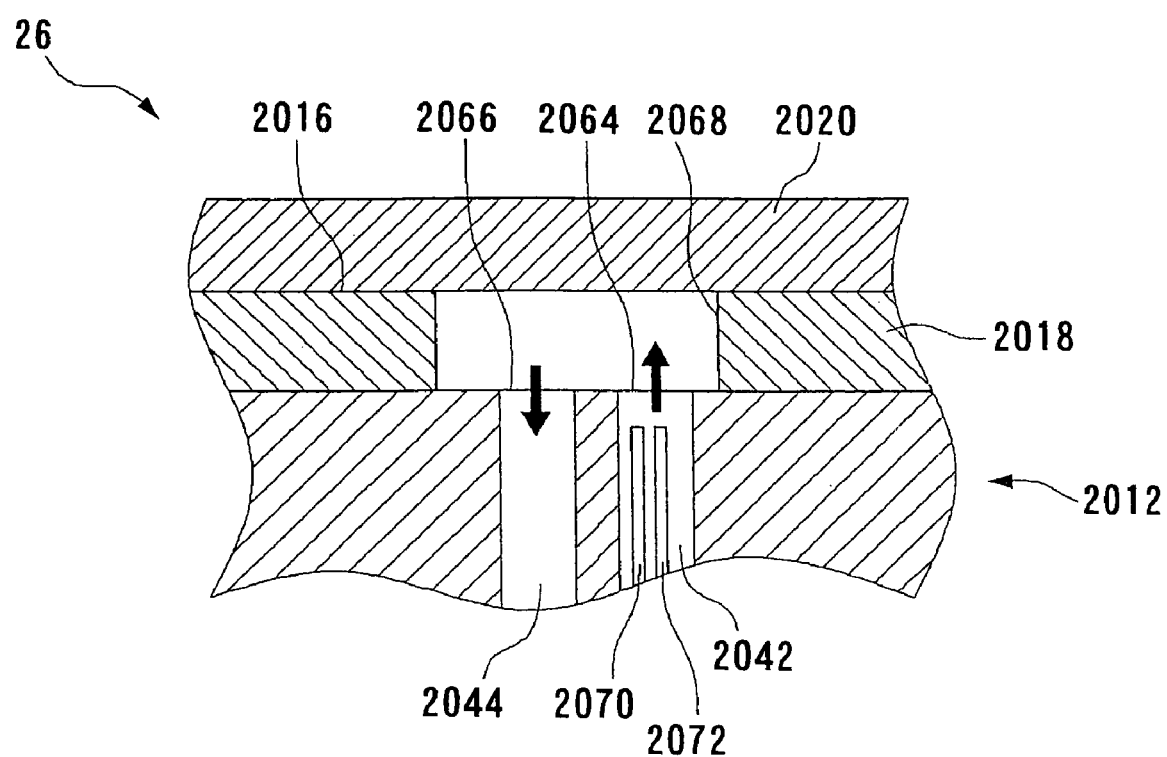
FIG. 55 is a view showing an example of a sensor incorporated in the substrate polishing apparatus shown in FIG. 1.

FIG. 55 is a view showing an example of the sensor incorporated in the substrate polishing apparatus shown in FIG. 1.

As shown in FIG. 55, the solvent is ejected into a through hole 2068 formed in a polishing pad 2018. The solvent serves to dilute the slurry that flows from a gap between a polishing table 2012 and a substrate 2020 into the through hole 2068. The solvent also serves to clean the slurry attached to the substrate 2020. In this manner, the influence that the slurry has on measurement is reduced, thus achieving a required measuring capability.

When a large amount of the solvent serving as a measurement fluid is supplied to the through hole 2068, the solvent tends to flow out from the through hole 2068 into the gap between the substrate 2020 and the polishing table 2012.

However, even if the solvent flows out from the through hole 2068, since the solvent is used as the measurement fluid in the present embodiment, an adverse influence on the polishing capability is small, as described below. Specifically, when the solvent flows out, the solvent of the slurry is increased, and the concentration of the abrasive particles serving as a solute is decreased. However, even if the solvent is increased, the adverse influence on the polishing capability is small. In particular, the adverse influence that the increased solvent has on the polishing capability is much smaller than the case where the slurry is diluted by water.

According to the present embodiment, since the solvent of the slurry is supplied as the measurement fluid, even if the measurement fluid flows out onto the polishing table and is mixed with the slurry, the influence that the diluted slurry has on the polishing capability can be reduced. The present embodiment is based on the fact that even if the slurry has a low transparency, the transparency of the slurry solvent which does not contain abrasive particles is relatively high. The measuring capability is maintained by using the solvent of the slurry, and the influence that the measurement fluid has on the polishing capability is reduced.

An example of suitable combination of the slurry and the solvent will be described below. In this example, a silica slurry is supplied from a slurry container to polish a silicon oxide film ($SiO_2$). This kind of silica slurry contains an alkaline solvent (pH 10–11) for securing a removal rate. Therefore, the alkaline solvent is used as a measurement fluid. Accordingly, the influence that the measurement fluid has on the removal rate when the measurement fluid flows out can be reduced. The alkaline solvent comprises KOH or $NH_4OH$, for example.

According to another example, a ceria slurry is supplied to polish a silicon oxide film ($SiO_2$) or an STI wafer. The ceria slurry contains a surface-active agent solution as a solvent for keeping a low removal rate and securing step characteristics. Therefore, the surface-active agent solution is used as the measurement fluid. Accordingly, the removal rate is prevented from being increased and the step characteristics are prevented from being lowered, thus reducing the influence on the polishing capability.

The surface-active agent is preferably a cationic surface-active agent. Ceria particles (ceria abrasive particles) of the ceria slurry have a property such that the ceria particles easily absorb light. From the viewpoint of zeta potential, since the ceria particles have an equipotential point of about pH 7, the ceria particles are liable to be electrically attracted to the substrate surface ($SiO_2$) in pure water. However, if a cationic surface-active agent of less than pH 7 is ejected to the substrate surface, then the cationic surface-active agent is attracted to the ceria particles and the substrate surface, and hence they are electrically repelled from each other. Therefore, the ceria particles tend to be removed from the substrate surface. In this manner, since the ceria particles on the substrate surface are reduced, more reflected light is received. Therefore, the S/N ratio of the emitted and received light is improved, and hence the measuring capability can be increased.

The slurry and the solvent according to the present invention are not limited to those described above. For example, in the case where a slurry for polishing a metal film is used, a solvent which is of the same type and has the same concentration as a solvent contained in such a slurry is used. The solvent mainly contains an oxidizing agent, a chelating agent, and an anticorrosive agent.

In the present embodiment, within the scope of the present invention, the solvent supplied from the supply container does not required to be strictly the same as the solvent contained in the slurry supplied from the slurry container. Specifically, the solvent of the slurry used as the measurement fluid is not required to be completely the same as the slurry used for polishing the substrate. Insofar as the influence on the polishing capability or the like is prevented from occurring, the solvent may have a slightly different concentration, and a solvent of a suitably different type may be employed.

In the present embodiment, it is preferable to apply the following structure: A member constituting the supply passage 2042 is made of a highly chemical-resistant material. A member constituting the discharge passage 2044 is also made of the same material. For example, these members are made of a resin or a ceramic. The supply passage may be coated with a highly chemical-resistant material, and this structure is included in the above structure. With this structure, the supply passage member is prevented from being damaged by the solvent which is used as the measurement fluid. Further, the substrate is prevented from being contaminated by impurity which has been eluted from the supply passage member due to the effect of the solvent. It is preferable that the optical fiber for guiding measurement light and reflected light has the same structure.

Another embodiment of the present invention will be described below. A substrate polishing apparatus according to this embodiment has the same structure as the embodiments shown in FIGS. 1 through 54. However, the present embodiment differs from those embodiments in measurement fluid.

In the present embodiment, the fluid container 2100 contains a highly viscous fluid which is more viscous than the polishing slurry. The highly viscous fluid is delivered by the supply pump 2102 and supplied to the sensor 26 through the supply passage 2042.

The highly viscous fluid is ejected into the through hole 2068 (see FIG. 55) in the polishing pad 2018, so that the through hole 2068 is filled with the highly viscous fluid. The highly viscous fluid serves to dilute the slurry that flows into the through hole 2068 from a gap between the polishing table 12 and the substrate 2020. The highly viscous fluid also serves to clean the slurry attached to the substrate 2020. In this manner, the influence that the slurry has on measurement is reduced, thus achieving a required measuring capability.

A diffusion of the slurry flowing into the through hole is reduced by using the highly viscous fluid which is more viscous than the slurry. Therefore, the influence that the slurry has on film measurement is reduced, thus increasing the measuring capability.

In the present embodiment, since the highly viscous fluid is used as the measurement fluid, an amount of the measurement fluid that flows into the gap between the polishing table 2012 and the substrate 2020 can be reduced. Further, because the above diffusion reducing advantage can be obtained, the same measuring capability can be obtained even if an amount of the highly viscous fluid to be supplied is smaller than that of water which has been usually used. Thus, the amount of the measurement fluid flowing out can be reduced. Since the amount of the measurement fluid flowing out is reduced, the influence that the measurement fluid has on the polishing capability can be reduced. In the present embodiment also, therefore, the measuring capability is maintained and the influence that the measurement fluid has on the polishing capability is reduced.

The highly viscous fluid that is applicable to the present embodiment is ethylene glycol, for example. Whereas the slurry generally has a viscosity of about 2 cp, ethylene glycol has a viscosity of 23.5 cp at 20 degrees Celsius. That is, the viscosity of ethylene glycol is higher than that of the slurry. In particular, ethylene glycol has a refractive index similar to glass, and is suitable for optical measurement in the present embodiment. The highly viscous fluid may alternatively be glycerin. Glycerin has a viscosity of 1499 cp at 20 degrees Celsius. Further alternatively, the highly viscous fluid may be a thickener such as propylene glycol.

The highly viscous fluid may be a solution of the solvent diluted by pure water. The highly viscous fluid is not limited to liquid, but may be sol or the like. In the present invention, gel may be included in the highly viscous fluid.

According to the present embodiment, as described above, since the highly viscous fluid is supplied, the amount of the fluid that flows out is small. Therefore, it may be possible to dispense with a structure for discharging the fluid. Depending on the type of highly viscous fluid, the compulsory discharge with use of the discharge pump may not be performed, and the discharge passage may be eliminated.

Still another embodiment of the present invention will be described below. The substrate polishing apparatus according to this embodiment is different from the above embodiment in a measurement fluid.

In the present embodiment, the supply passage 2042 serving as a fluid supply device forcibly supplies a gas as a measurement fluid. The measurement gas comprises air, nitrogen, or a noble gas, for example. The gas may be supplied from a pipe provided in the substrate processing apparatus through the rotary joint 48 to the supply passage 2042. In this case, the fluid container 2100 and the supply pump 2102 shown in FIG. 1 are eliminated, and a tank and a pump of the substrate processing apparatus are employed. However, the fluid container 2100 and the supply pump 2102 shown in FIG. 1 may be disposed in the vicinity of the substrate polishing apparatus. In this case, a container and a pump for the gas are provided. It may also be possible to dispense with the pump 50 for discharging. The supply and discharge sections are not limited to the above structure, but may suitably be arranged according to the type of gas. The gas to be supplied in the present embodiment is a gas whose humidity, pressure, and contamination are managed.

As already described, in the proposed conventional stream-type measuring device, a liquid is forcibly supplied as a measurement fluid, and usually comprises pure water (DIW). The liquid removes the slurry to reduce the influence that the slurry has on measurement. However, since the slurry and the liquid are mixed with each other to a certain extent, the influence that the slurry has on measurement still exists, thus causing the measurement accuracy to be lowered.

In the present embodiment, it is proposed to use the gas as the measurement fluid, unlike the above prior art. The supplied gas blows the slurry from the measuring area and substantially removes the slurry, thus allowing highly accurate measurement to be performed.

According to the present embodiment, even when the gas flows out, the gas does not dilute the slurry, thereby reducing the influence on the polishing capability. From the viewpoint of this, in the present embodiment, the measuring capability is maintained and the influence that the measurement fluid has on the polishing capability is also reduced.

In the present embodiment, the measurement fluid is not a liquid. Therefore, the measurement accuracy may be adversely affected by the slurry attached to the light-emitting member and the light-receiving member. However, the present embodiment can prevent the slurry from being attached with use of the following structure:

In the present embodiment, preferably, a water repellent optical fiber is used as a light-emitting optical fiber 2070 and a light-receiving optical fiber 2072 (FIG. 55), respectively. The light-emitting optical fiber 2070 and the light-receiving optical fiber 2072 are thus made of a water-repellent material. At least tip end portion of the optical fiber, particularly a portion positioned in the supply passage 2042, may be water repellent.

The light-emitting optical fiber 2070 is an optical fiber for emitting measurement light, and the light-receiving optical fiber 2072 is an optical fiber for receiving reflected light. Since these optical fibers have a water repellency, any slurry that is attached thereto can be easily removed.

The supply passage 2042, the discharge passage 2044, or inner surfaces thereof may be made of a water-repellent material or may be coated with a water-repellent material so as to prevent the slurry from being attached thereto and also prevent the supply passage 2042 and the discharge passage 2044 from being clogged by the slurry. The secondary attachment of the slurry from the supply passage 2042 or the like to the light-emitting optical fiber 2070 and the light-receiving optical fiber 2072 is also prevented from occurring.

In the substrate polishing apparatus according to the present embodiment, the supply of the fluid may be controlled in the manner described below. The supply of the fluid is controlled before the polishing process is started.

Pure water is supplied as a cleaning fluid intermittently or continuously from the supply passage 2042 to the discharge passage 2044 after a preceding substrate is polished or the polishing pad is dressed and just before a next substrate is polished. As described in the above embodiment, a gas is supplied as the measurement fluid during the polishing process. A supply of the cleaning fluid may be started at a suitable time before or after the preceding substrate is polished, or before or after the dressing process is finished. The cleaning fluid may be supplied until several seconds have passed from the start of the polishing process. Specifically, the cleaning fluid should be supplied from the fluid supply device by utilizing a period of time before the polishing process is performed.

Since the fluid is supplied in the above manner, an area around the sensor 26 (FIG. 1) can be kept highly clean before measurement is performed during the polishing process. When a gas is supplied as the measurement fluid during the polishing process, an excellent measuring capability can be maintained, and the influence that the measurement fluid has on the polishing capability can be small. The above control is particularly effective in the polishing process after the dressing process because a foreign substance that is produced by the dressing process can be removed effectively.

In the above fluid control, a combination of the cleaning fluid and the measurement fluid may be changed. The cleaning fluid may be pure water or any of various fluids mentioned in the above embodiments, i.e., the slurry solvent, the highly viscous fluid, or the gas. The measurement fluid may also be the slurry solvent, the highly viscous fluid, or the gas. The cleaning fluid and the measurement fluid may be the same as each other or may be different from each other. In order to supply the fluid to be used, equipment such as pipe suitable for the fluid is provided in the polishing table. As described above, even if the combination of the cleaning fluid and the measurement fluid is changed, the same advantage can be obtained.

In the various embodiments described above, the polishing pad 2018 may be made of foamed urethane, or may be a non-woven-type or suede-type polishing cloth. A fixed abrasive comprising abrasive particles fixed together by a binder such as epoxy may also be employed.

In all the above embodiments, the measurement fluid is preferably a fluid having a high degree of cleanness and purity, so that a surface to be measured (surface to be irradiated) of the substrate 2020, the light-emitting optical fiber 2070, the light-receiving optical fiber 2072, the supply passage 2042, and the discharge passage 2044 can be cleaned effectively. The measurement fluid may be filtered by a filter disposed in the fluid passage.

Although the preferred embodiments of the present invention have been described above, the embodiments may be modified by those skilled in the art within the scope of the present invention.

According to the present invention, since the solvent of the slurry is supplied as the measurement fluid, even if the measurement fluid flows out onto the polishing table and is mixed with the slurry, the influence that the diluted slurry has on the polishing capability can be reduced. Thus, the influence that the measurement fluid has on the polishing capability is reduced while maintaining the measuring capability.

Further, according to the present invention, since the highly viscous fluid is supplied as the measurement fluid, the diffusion of the slurry flowing into the measuring area can be reduced. Therefore, the influence that the slurry has on film measurement can be reduced, thus increasing the measuring capability. Since the amount of the measurement fluid that flows out can be reduced, the influence that the measurement fluid has on the polishing capability is reduced while maintaining the measuring capability.

Furthermore, according to the present invention, since the gas is used as the measurement fluid, the slurry can efficiently be removed from the measuring area, and hence the excellent measuring capability can be obtained. Even if the gas flows out, the slurry is not diluted. Therefore, the influence that the measurement fluid has on the polishing capability can be reduced. Accordingly, the influence that the measurement fluid has on the polishing capability can be reduced while maintaining the measuring capability.

What is claimed is:

1. A substrate polishing apparatus comprising:
    a polishing table;
    a polishing pad mounted on said polishing table for polishing a semiconductor substrate, said polishing pad having a through hole formed therein;
    a light emission and reception device having an emitter for emitting measurement light through said through hole formed in said polishing pad to the semiconductor substrate and a receiver for receiving reflected light from the semiconductor substrate so as to measure a film on the semiconductor substrate, said light emission and reception device being disposed in said polishing table;
    a supply passage for supplying a fluid to a path of the measurement light so as to produce a flow of the fluid from said light emission and reception device to the semiconductor substrate;
    a discharge passage for discharging the fluid in the path of the measurement light, said discharge passage being provided in said polishing table and having a fluid connection with said supply passage; and
    a protection cover mounted on said polishing table and fitted into said through hole for positioning a new polishing pad when said new polishing pad is attached to said polishing table, wherein
    said supply passage has an outlet portion, and
    a portion of said emitter and a portion of said receiver are located within said outlet portion.

2. A substrate polishing apparatus according to claim 1, wherein said outlet portion is detachably mounted on said polishing table and comprises a pipe unit which has a pipe piece.

3. A substrate polishing apparatus according to claim 2, wherein said emitter comprises a light-emitting optical fiber.

4. A substrate polishing apparatus according to claim 2, wherein said receiver comprises a light-receiving optical fiber.

5. A substrate polishing apparatus according to claim 1, wherein the fluid comprises pure water.

6. A polishing apparatus according to claim 1, further comprising a pump connected to said discharge passage for compulsorily discharging the fluid in the path of the measurement light.

7. A polishing apparatus according to claim 1, wherein said outlet portion is detachably mounted on said polishing table, and the polishing apparatus further comprises an outlet portion moving means for vertically moving said outlet portion.

8. A polishing apparatus comprising:
    a polishing table having a polishing pad for polishing a workpiece, said polishing pad having a hole;
    an optical measurement device disposed in said polishing table having an emitter for emitting measurement light to the workpiece through said hole and a receiver for receiving reflected light from the workpiece so as to measure a film on the workpiece;
    a supply passage disposed in said polishing table for supplying a fluid to a path of the measurement light so as to produce a flow of the fluid from said optical measurement device to the workpiece;
    a discharge passage for discharging the fluid in the path of the measurement light, said discharge passage being provided in said polishing table and having a fluid connection with said supply passage; and
    a protection cover mounted on said polishing table and fitted into said hole for positioning a new polishing pad when said new polishing pad is attached to said polishing table, wherein
    said supply passage has an outlet portion, and
    a portion of said emitter and a portion of said receiver are located within said outlet portion.

9. A polishing apparatus according to claim 8, wherein said outlet portion is detachably mounted on said polishing table and comprises a pipe unit which has a pipe piece.

10. A polishing apparatus according to claim 9, wherein said emitter comprises a light-emitting optical fiber.

11. A polishing apparatus according to claim 9, wherein said receiver comprises a light-receiving optical fiber.

12. A polishing apparatus according to claim 8, wherein the fluid comprises pure water.

13. A polishing apparatus according to claim 8, further comprising a pump connected to said discharge passage for compulsorily discharging the fluid in the path of the measurement light.

14. A polishing apparatus according to claim 8, wherein said outlet portion is detachably mounted on said polishing table, and the polishing apparatus further comprises an outlet portion moving means for vertically moving said outlet portion.

* * * * *